(12) United States Patent
Park et al.

(10) Patent No.: US 10,627,679 B2
(45) Date of Patent: Apr. 21, 2020

(54) DISPLAY DEVICE AND METHOD FOR FABRICATING THE SAME

(71) Applicant: SAMSUNG DISPLAY CO., LTD., Yongin-si, Gyeonggi-do (KR)

(72) Inventors: Saeron Park, Gimhae-si (KR); Sanghun Lee, Suwon-si (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 221 days.

(21) Appl. No.: 15/798,968

(22) Filed: Oct. 31, 2017

(65) Prior Publication Data

US 2018/0143471 A1 May 24, 2018

(30) Foreign Application Priority Data

Nov. 21, 2016 (KR) .................. 10-2016-0155046

(51) Int. Cl.
| | |
|---|---|
| G02F 1/1335 | (2006.01) |
| G02F 1/1339 | (2006.01) |
| G02F 1/1343 | (2006.01) |
| G02F 1/1362 | (2006.01) |
| H01L 27/12 | (2006.01) |
| G02F 1/1368 | (2006.01) |

(52) U.S. Cl.
CPC ...... *G02F 1/13394* (2013.01); *G02F 1/13624* (2013.01); *G02F 1/134309* (2013.01); *G02F 1/136227* (2013.01); *G02F 1/136286* (2013.01); *H01L 27/124* (2013.01); *G02F 1/1368* (2013.01); *G02F 1/136209* (2013.01); *G02F 2001/13396* (2013.01); *G02F 2001/13398* (2013.01); *G02F 2001/134345* (2013.01); *G02F 2001/136222* (2013.01); *H01L 27/1248* (2013.01); *H01L 27/1288* (2013.01)

(58) Field of Classification Search
None
See application file for complete search history.

(56) References Cited

U.S. PATENT DOCUMENTS

| | | | |
|---|---|---|---|
| 4,775,225 A | 10/1988 | Tsuboyama et al. |
| 5,585,951 A | 12/1996 | Noda et al. |
| 5,818,550 A | 10/1998 | Kadota et al. |

(Continued)

FOREIGN PATENT DOCUMENTS

| | | |
|---|---|---|
| KR | 1020070059555 A | 6/2007 |
| KR | 1020130097879 A | 9/2013 |

*Primary Examiner* — Richard H Kim
(74) *Attorney, Agent, or Firm* — Cantor Colburn LLP

(57) ABSTRACT

A display device includes: first and second substrates; adjacent first and second color filter layers between the first and second substrates and having a first color; adjacent third and fourth color filter layers between the first and second substrates and having a second color; first and second dummy color filter layers between the first color filter layer and the second color filter layer and having the first and second colors, respectively; a first column spacer between the first dummy color filter layer and the second substrate; and a second column spacer between the second dummy color filter layer and the second substrate. The first dummy color filter has a greater height than the second dummy color filter layer. A surface of the first dummy color filter layer facing the second substrate is larger than that of the second dummy color filter layer.

17 Claims, 41 Drawing Sheets

(56) References Cited

U.S. PATENT DOCUMENTS

| | | |
|---|---|---|
| 7,394,510 B2 | 7/2008 | Oh et al. |
| 7,633,595 B2 * | 12/2009 | Kim .................. G02F 1/133707 |
| | | 349/106 |
| 8,377,614 B2 | 2/2013 | Lee et al. |
| 8,976,328 B2 | 3/2015 | Kim et al. |
| 2016/0033814 A1 * | 2/2016 | Na .................... G02F 1/133514 |
| | | 349/106 |
| 2016/0320662 A1 * | 11/2016 | Hwahg ............. G02F 1/133345 |

* cited by examiner

DISPLAY DEVICE AND METHOD FOR FABRICATING THE SAME

This application claims priority to Korean Patent Application No. 10-2016-0155046, filed on Nov. 21, 2016, and all the benefits accruing therefrom under 35 U.S.C. § 119, the content of which in its entirety is herein incorporated by reference.

BACKGROUND

1. Field

Exemplary embodiments of the invention relate to a display device capable of improving the yield and reducing the manufacturing costs, and to a method of manufacturing the display device.

2. Description of the Related Art

A liquid crystal display ("LCD") device is one of the most widely used types of flat panel display ("FPD") device. An LCD device typically includes two substrates including two electrodes formed thereon and a liquid crystal layer interposed therebetween.

Upon applying a voltage to the two electrodes, liquid crystal molecules of the liquid crystal layer are rearranged such that an amount of transmitted light is controlled in the LCD device.

SUMMARY

Exemplary embodiments of the invention are directed to a display device having a structure to be manufactured with improved yield and reduced cost, and to a method of manufacturing the display device.

According to an exemplary embodiment of the invention, a display device includes: a first substrate and a second substrate spaced apart from each other; a first color filter layer and a second color filter layer located adjacent to each other between the first substrate and the second substrate and having a substantially same color as each other; a third color filter layer and a fourth color filter layer located adjacent to each other between the first substrate and the second substrate and having a substantially same color as each other; a first dummy color filter layer located between an edge of the first substrate and the first color filter layer or between the first color filter layer and the second color filter layer, where the first dummy color filter has a substantially same color as the first color filter layer; a second dummy color filter layer located between an edge of the first substrate and the third color filter layer or between the third color filter layer and the fourth color filter layer, where the second nummy color filter has a substantially same color as the third color filter layer; a first column spacer between the first dummy color filter layer and the second substrate; and a second column spacer between the second dummy color filter layer and the second substrate. In such an embodiment, a height of the first dummy color filter from a reference surface of the first substrate is greater than a height of the second dummy color filter layer from the reference surface, and a surface of the first dummy color filter layer facing the second substrate is larger than a surface of the second dummy color filter layer facing the second substrate.

In an exemplary embodiment, a thickness of the first column spacer may be less than or substantially equal to a thickness of the second column spacer.

In an exemplary embodiment, a height of the first column spacer from the reference surface may be greater than a height of the second column spacer from the reference surface.

In an exemplary embodiment, the first dummy color filter layer may be connected to at least one of the first color filter layer and the second color filter layer.

In an exemplary embodiment, the first color filter layer, the second color filter layer and the first dummy color filter layer may be integrally formed as a single unitary and indivisible unit.

In an exemplary embodiment, the second dummy color filter layer may be connected to at least one of the third color filter layer and the fourth color filter layer.

In an exemplary embodiment, the third color filter layer, the fourth color filter layer and the second dummy color filter layer may be integrally formed as a single unitary and indivisible unit.

In an exemplary embodiment, at least one of the first column spacer and the second column spacer may include a transparent material or an opaque material.

In an exemplary embodiment, the display device may further include a light blocking layer on the first substrate or the second substrate.

In an exemplary embodiment, the light blocking layer, the first column spacer and the second column spacer may be located on a substantially same layer on the first substrate; and the light blocking layer, the first column spacer and the second column spacer may be integrally formed as a single unitary and indivisible unit.

In an exemplary embodiment, the first column spacer and the second column spacer may be located on the first substrate, and the light blocking layer may be on the second substrate to overlap the first column spacer and the second column spacer.

In an exemplary embodiment, the display device may further include a first pixel electrode disposed to overlap the first color filter layer; a second pixel electrode located corresponding to the second color filter layer; a third pixel electrode disposed to overlap the third color filter layer; a fourth pixel electrode disposed to overlap the fourth color filter layer; a first switching element connected to the first pixel electrode; a second switching element connected to the second pixel electrode; a third switching element connected to the third pixel electrode; and a fourth switching element connected to the fourth pixel electrode.

In an exemplary embodiment, the first column spacer may overlap one of the first switching element and the second switching element.

In an exemplary embodiment, the second column spacer may overlap one of the third switching element and the fourth switching element.

In an exemplary embodiment, the display device may further include a first gate line connected to the first and second switching elements; a second gate line connected to the third and fourth switching elements; a first data line connected to the first and third switching elements; and a second data line connected to the second and fourth switching elements.

In an exemplary embodiment, the display device may further include a first gate line connected to the first and third switching elements; a second gate line connected to the second and fourth switching elements; a first data line connected to the first and second switching elements; and a second data line connected to the third and fourth switching elements.

In an exemplary embodiment, the display device may further include a first sub-pixel electrode disposed to overlap the first color filter layer; a second sub-pixel electrode disposed to overlap the second color filter layer; a third sub-pixel electrode disposed to overlap the third color filter layer; a fourth sub-pixel electrode disposed to overlap the fourth color filter layer; a first switching element connected to the first sub-pixel electrode; a second switching element connected to the first switching element and the second sub-pixel electrode; a third switching element connected to the third sub-pixel electrode; a fourth switching element connected to the third switching element and the fourth sub-pixel electrode; a gate line connected to the first, second, third and fourth switching elements; a first data line connected to the first switching element; and a second data line connected to the third switching element.

According to an exemplary embodiment of the invention, a method of manufacturing a display device includes: providing a first photosensitive organic material on a first substrate; patterning the first photosensitive organic material to form a first color filter layer, a second color filter layer, and a first dummy color filter layer between an edge of the first substrate and the first color filter layer or between the first color filter layer and the second color filter layer; providing a second photosensitive organic material on a second substrate; patterning the second photosensitive organic material to form a third color filter layer, a fourth color filter layer, and a second dummy color filter layer between an edge of the first substrate and the third color filter layer or between the third color filter layer and the fourth color filter layer; providing a first column spacer on the first dummy color filter layer and providing a second column spacer on the second dummy color filter layer; and attaching the first substrate and the second substrate to each other. In such an embodiment, a height of the first dummy color filter layer from a reference surface of the first substrate is greater than a height of the second dummy color filter layer from the reference surface, and a surface of the first dummy color filter layer facing the second substrate is larger than a surface of the second dummy color filter layer facing the second substrate.

In an exemplary embodiment, a thickness of the first column spacer may be less than or substantially equal to a thickness of the second column spacer.

In an exemplary embodiment, the patterning the first photosensitive organic material may include disposing a first mask on the first photosensitive organic material, where transmissive areas are defined in the first mask to correspond to the first color filter layer, the second color filter layer and the first dummy color filter layer, respectively; and exposing the first photosensitive organic material through the first mask.

In an exemplary embodiment, the patterning the second photosensitive organic material may include disposing a second mask on the second photosensitive organic material, where transmissive areas are defined in the second mask to correspond to the third color filter layer, the fourth color filter layer and the second dummy color filter layer, respectively; and exposing the second photosensitive organic material through the second mask.

In an exemplary embodiment, a transmissive area of the first mask corresponding to the first dummy color filter layer may have a larger size than a size of a transmissive area of the second mask corresponding to the second dummy color filter layer.

In an exemplary embodiment, a transmissive area of the first mask corresponding to the first dummy color filter layer may have a substantially equal size as a size of a transmissive area of the second mask corresponding to the second dummy color filter layer, and during exposing of the first and second photosensitive organic materials, a greater amount of light may be irradiated to the transmissive area of the first mask corresponding to the first dummy color filter layer than an amount of light irradiated to the transmissive area of the second mask corresponding to the second dummy color filter layer.

BRIEF DESCRIPTION OF THE DRAWINGS

The above and other features of the disclosure of invention will be more clearly understood from the following detailed description taken in conjunction with the accompanying drawings, in which.

DETAILED DESCRIPTION

Figure 1:
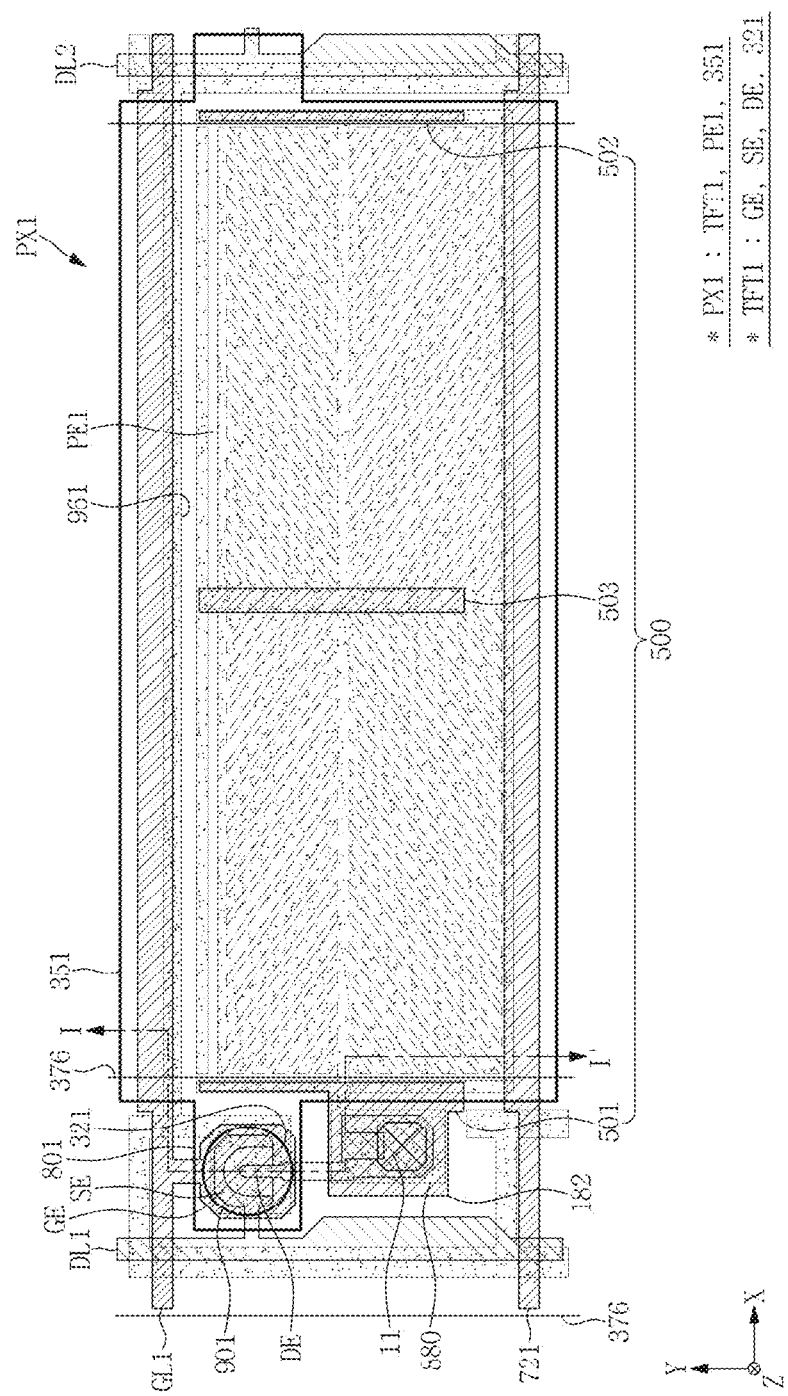
FIG. 1 is a view illustrating a pixel included in a display device according to an exemplary embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

In the drawings, thicknesses of a plurality of layers and areas are illustrated in an enlarged manner for clarity and ease of description thereof. When a layer, area, or plate is referred to as being "on" another layer, area, or plate, it may be directly on the other layer, area, or plate, or intervening layers, areas, or plates may be present therebetween. Conversely, when a layer, area, or plate is referred to as being "directly on" another layer, area, or plate, intervening layers, areas, or plates may be absent therebetween. Further when a layer, area, or plate is referred to as being "below" another layer, area, or plate, it may be directly below the other layer, area, or plate, or intervening layers, areas, or plates may be present therebetween. Conversely, when a layer, area, or plate is referred to as being "directly below" another layer, area, or plate, intervening layers, areas, or plates may be absent therebetween.

The spatially relative terms "below", "beneath", "less", "above", "upper", and the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device located "below" or "beneath" another device may be placed "above" another device. Accordingly, the illustrative term "below" may include both the lower and upper positions. The device may also be oriented in the other direction, and thus the spatially relative terms may be interpreted differently depending on the orientations.

Throughout the specification, when an element is referred to as being "connected" to another element, the element is "directly connected" to the other element, or "electrically connected" to the other element with one or more intervening elements interposed therebetween. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" may be termed similarly without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, exemplary embodiments of a display device and a method of manufacturing the display device will be described in detail with reference to FIGS. 1 to 35.

Figure 2:
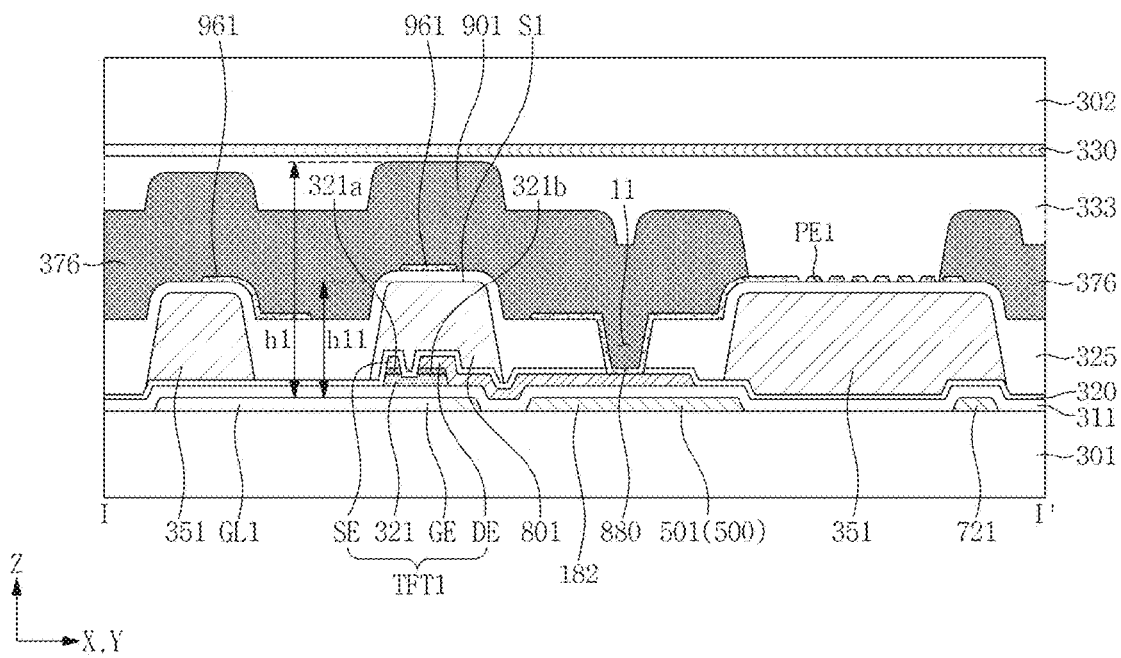
FIG. 2 is a cross-sectional view taken along line I-I' of FIG. 1.

FIG. 1 is a view illustrating a pixel included in a display device according to an exemplary embodiment, and FIG. 2 is a cross-sectional view taken along line I-I' of FIG. 1.

In an exemplary embodiment, as illustrated in FIGS. 1 and 2, a pixel PX1 of a display device includes a switching element TFT1, a pixel electrode PE1 and a color filter layer 351.

The switching element TFT1 includes a semiconductor layer 321, a gate electrode GE, a source electrode SE and a drain electrode DE. The gate electrode GE is connected to a gate line GL1, the source electrode SE is connected to a data line DL1, and the drain electrode DE is connected to a pixel electrode PE1.

In an exemplary embodiment, the pixel PX1 is positioned between a first substrate 301 and a second substrate 302. In such an embodiment, as illustrated in FIG. 2, the display device includes the first substrate 301 and the second substrate 302 spaced apart from each other at a predetermined distance, and the switching element TFT1, the pixel electrode PE1 and a color filter layer 351 are located (or disposed) between the first substrate 301 and the second substrate 302.

In such an embodiment, the gate line GL1, a sustain line 721, a pre-tilt control layer 500, a light blocking film 182, a gate insulating layer 311, the data line DL1, a protective layer 320, a dummy color filter layer 801, a shielding electrode 961, an insulating interlayer 325, a light blocking layer 376, a column spacer 901, a liquid crystal layer 333 and a common electrode 330 are located between the first substrate 301 and the second substrate 302.

At least one of the first substrate 301 and the second substrate 302 may be an insulating substrate including a glass or a plastic, for example.

In an exemplary embodiment, when a surface of the first substrate 310 and a surface of the second substrate 302 that face each other are defined as inner surfaces of the corresponding substrates, respectively, and surfaces opposite to the inner surfaces are defined as outer surfaces of the corresponding substrates, respectively, a first polarizing plate (not illustrated) may be further disposed on the outer surface of the first substrate 310, and a second polarizing plate (not illustrated) may be further disposed on the outer surface of the second substrate 302. A transmission axis of the first polarizing plate may be substantially orthogonal to a transmission axis of the second polarizing plate.

In an exemplary embodiment, a polarizing layer may be used in place of the first polarizing plate and the second polarizing plate, and in such an embodiment, the polarizing layer may be located between the first substrate 301 and the second substrate 302.

In an exemplary embodiment, as illustrated in FIG. 1, the gate line GL1 extends in a direction parallel to an X-axis (hereinafter, an X-axis direction). In such an embodiment, as illustrated in FIG. 2, the gate line GL1 is located on the first substrate 301.

In an exemplary embodiment, as illustrated in FIG. 1, the gate line GL1 is connected to the gate electrode GE. The gate line GL1 and the gate electrode GE may be integrally formed as a single unitary and indivisible unit.

Although not illustrated, an end portion of the gate line GL1 may have a larger area than an area of another portion of the gate line GL1 for connection to another layer or an external driving circuit. The gate line GL1 may receive a gate signal from the external driving circuit.

In an exemplary embodiment, the gate line GL1 may include or be formed of aluminum (Al) or alloys thereof, silver (Ag) or alloys thereof, copper (Cu) or alloys thereof and/or molybdenum (Mo) or alloys thereof. In an alternative exemplary embodiment, the gate line GL1 may include or be formed of one of chromium (Cr), tantalum (Ta) and titanium (Ti). In an exemplary embodiment, the gate line GL1 may have a multilayer structure including at least two conductive layers that have different physical properties from one another.

In an exemplary embodiment, as illustrated in FIG. 1, the gate electrode GE may have a shape protruding from the gate line GL1 toward the sustain line 721. The gate electrode GE may be a part of the gate line GL1. The gate electrode GE and the gate line GL1 may be integrally formed as a single unitary and indivisible unit.

In an exemplary embodiment, as illustrated in FIG. 2, the gate electrode GE is located on the first substrate 301. The gate electrode GE may include a substantially same material as the gate line GL1, and may have a substantially same structure (a multilayer structure) as the gate line GL1. The gate electrode GE and the gate line GL1 may be simultaneously formed with each other in a substantially same process.

In an exemplary embodiment, as illustrated in FIG. 1, the sustain line 721 extends in the X-axis direction. In such an embodiment, the sustain line 721 may extend in a direction parallel to a Y axis (hereinafter, a Y-axis direction). The sustain line 721 is substantially parallel to the gate line GL1. In such an embodiment, as illustrated in FIG. 2, the sustain line 721 is located on the first substrate 301.

In an exemplary embodiment, although not illustrated, an end portion of the sustain line 721 may have a larger area than an area of another portion of the sustain line 721 for connection to another layer or an external drive circuit. The sustain line 721 may receive a sustain voltage from the external driving circuit. The sustain voltage is a direct current ("DC") voltage and may have a substantially same voltage level as a voltage level of a common voltage applied to the common electrode 330.

The pre-tilt control layer 500 controls a pre-tilt angle of liquid crystal molecules of the liquid crystal layer 333. In such an embodiment, the pre-tilt control layer 500 controls the liquid crystal molecules on the pixel electrode PE1 to be tilted in a predetermined direction with respect to the pre-tilt control layer 500.

In an exemplary embodiment, as illustrated in FIG. 1, the pre-tilt control layer 500 is located corresponding to opposite edges of the pixel electrode PE1 and a central portion of the pixel electrode PE1. In such an embodiment, the pre-tilt control layer 500 may include a first control layer 501, a second control layer 502 and a third control layer 503, which are separated from each other. The first and second control layers 501 and 502 are located at the opposite edges of the pixel electrode PE1 facing each other, respectively, and the third control layer 503 is located at the central portion of the pixel electrode PE1. The third control layer 503 is located between the first control layer 501 and the second control layer 502.

In an exemplary embodiment, as illustrated in FIG. 1, each of the first, second and third control layers 501, 502 and 503 may have a bar shape extending in the Y-axis direction.

In an exemplary embodiment, as illustrated in FIG. 2, the pre-tilt control layer 500 is located on the first substrate 301.

The pre-tilt control layer 500 may include a substantially same material as the gate line GL1 and may have a substantially same structure (e.g., a multilayer structure) as the gate line GL1. The pre-tilt control layer 500 and the gate line GL1 may be simultaneously formed with each other in a substantially same process.

The pre-tilt control layer 500 has an isolated shape that is not connected to any conductive line including the gate line GL1 and the data line DL1. In such an embodiment, each of the first, second and third control layers 501, 502 and 503 is not physically directly connected to any signal line of the display device. As used herein, the signal line includes a line that directly receives a signal from a signal source, a line that indirectly receives a signal from the signal source through at least one other line, a line that indirectly receives a signal from the signal source through at least one capacitor or a line that indirectly receives a signal from the signal source through at least one switch.

In an exemplary embodiment, as illustrated in FIGS. 1 and 2, the light blocking film 182 is located on the first substrate 301 corresponding to a drain contact hole 11. In a case where the drain contact hole 11 is defined to be largely deviated from the drain electrode DE due to misalignment of a mask, light leakage may occur through the drain contact hole 11. In an exemplary embodiment, the light blocking film 182 is located below the drain contact hole 11 to block such a light leakage. The light blocking film 182 has an isolated shape that is not connected to any conductive line including the gate line GL1 and the data line DL1. The light blocking film 182 may be integrally formed as a single unitary and indivisible unit with the first control layer 501.

The light blocking film 182 may include a substantially same material as the gate line GL1 and may have a substantially same structure (a multilayer structure) as the gate line GL1. The light blocking film 182 and the gate line GL1 may be simultaneously formed with each other in a substantially same process.

In an exemplary embodiment, as illustrated in FIG. 2, the gate insulating layer 311 is located on the gate line GL1, the gate electrode GE, the sustain line 721, the pre-tilt control layer 500 and the light blocking film 182. In such an embodiment, the gate insulating layer 311 may be provided or formed over an entire surface of the first substrate 301 including the gate line GL1, the gate electrode GE, the sustain line 721, the pre-tilt control layer 500 and the light blocking film 182.

The gate insulating layer 311 may include a silicon nitride (SiNx), a silicon oxide (SiOx), or the like, for example. The gate insulating layer 311 may have a multilayer structure including at least two insulating layers having different physical properties from one another.

In an exemplary embodiment, as illustrated in FIG. 1, the semiconductor layer 321 overlaps the gate electrode GE, the source electrode SE and the drain electrode DE. In such an embodiment, as illustrated in FIG. 2, the semiconductor layer 321 is located on the gate insulating layer 311. The semiconductor layer 321 may include an amorphous silicon, a polycrystalline silicon, or the like, for example.

In an exemplary embodiment, as illustrated in FIG. 1, the data line DL1 extends in the Y-axis direction. In an exemplary embodiment, as illustrated in FIG. 1, the data line DL1 intersects the gate line GL1.

In an exemplary embodiment, although not illustrated, the data line DL1 may have a smaller line width than a line width of another portion thereof at an intersection of the data line DL1 and the gate line GL1. Herein, the line width of the data line DL1 means a width of the data line DL1 measured in the X-axis direction. In such an embodiment, the gate line GL1 may have a smaller line width than a line width of another portion thereof at an intersection of the data line DL1 and the gate line GL1. Herein, the line width of the gate line GL1 means a width of the gate line GL1 measured in the Y-axis direction. In such an embodiment, as the line widths of the data line DL1 and the gate line GL1 are relatively small at the intersection of the data line DL1 and the gate line GL1, a parasitic capacitance between the data line DL1 and the gate line GL1 may be reduced.

In an exemplary embodiment, although not illustrated, an end portion of the data line DL1 may have a larger area than an area of another portion thereof for connection to another layer or an external driving circuit. The data line DL1 may receive a data voltage (i.e., an image data voltage) from the external driving circuit.

In an exemplary embodiment, although not illustrated in FIG. 2, the data line DL1 is located on the gate insulating layer 311. In such an embodiment, the data line DL1 may be located on the gate insulating layer 311 as the source electrode SE illustrated in FIG. 2.

The data line DL1 may include a refractory metal such as molybdenum, chromium, tantalum and titanium, or an alloy thereof. The data line DL1 may have a multilayer structure including a refractory metal layer and a low resistance conductive layer. In one exemplary embodiment, for example, such a multilayer structure may include: a double-layer structure including a chromium or molybdenum (alloy) lower layer and an aluminum (alloy) upper layer; and a triple-layer structure including a molybdenum (alloy) lower layer, an aluminum (alloy) intermediate layer, and a molybdenum (alloy) upper layer. In an exemplary embodiment, the data line DL1 may include or be formed of any suitable metal or conductor other than the aforementioned materials.

In an exemplary embodiment, as illustrated in FIGS. 1 and 2, the source electrode SE overlaps the gate electrode GE and the semiconductor layer 321. In such an embodiment, as illustrated in FIG. 2, the source electrode SE is located on the gate insulating layer 311 and the semiconductor layer 321.

The source electrode SE may have a shape protruding from the data line DL1 toward the pixel electrode PE1. The source electrode SE may be a part of the data line DL1. The source electrode SE and the data line DL1 may be formed integrally as a single unitary and indivisible unit.

The source electrode SE may have one of an I-like shape, a C-like shape and a U-like shape. In an exemplary embodiment, as shown in FIG. 1, the source electrode SE has a U-like shape, and a convex portion of the source electrode SE is directed toward the gate line GL1.

The source electrode SE may include a substantially same material as the data line DL1 and may have a substantially same structure (a multilayer structure) as the data line DL1. The source electrode SE and the data line DL1 may be simultaneously formed with each other in a substantially same process.

In an exemplary embodiment, as illustrated in FIGS. 1 and 2, the drain electrode DE is located on the gate insulating layer 311 and the semiconductor layer 321, spaced apart from the source electrode SE at a predetermined distance. The drain electrode DE overlaps the semiconductor layer 321 and the gate electrode GE. A channel area of the switching element TFT1 is located at a portion of the semiconductor layer 321 between the drain electrode DE and the source electrode SE.

The drain electrode DE may include a substantially same material as the data line DL1 and may have a substantially same structure (a multilayer structure) as the data line DL1. The drain electrode DE and the data line DL1 may be simultaneously formed with each other in a substantially same process.

A first ohmic contact layer 321a is located between the semiconductor layer 321 and the source electrode SE. An interfacial resistance between the semiconductor layer 321 and the source electrode SE may be reduced due to the first ohmic contact layer 321a.

The first ohmic contact layer 321a may include a silicide or an n+ hydrogenated amorphous silicon doped with n-type impurity ions, e.g., phosphorus (P) or phosphine ($PH_3$), at high concentration.

A second ohmic contact layer 321b is located between the semiconductor layer 321 and the drain electrode DE. An interfacial resistance between the semiconductor layer 321 and the drain electrode DE may be reduced due to the second ohmic contact layer 321b. The second ohmic contact layer 321b may include a substantially same material as the first ohmic contact layer 321a and may have a substantially same structure (e.g., a multilayer structure) as the first ohmic contact layer 321a. The second ohmic contact layer 321b and the first ohmic contact layer 321a may be simultaneously formed with each other in a substantially same process.

In an exemplary embodiment, the first ohmic contact layer 321a and the second ohmic contact layer 321b may be omitted.

In an exemplary embodiment, although not illustrated, a semiconductor layer (hereinafter, "a first additional semiconductor layer") may be further disposed between the gate insulating layer 311 and the source electrode SE. In an exemplary embodiment, a semiconductor layer (hereinafter, "a second additional semiconductor layer") may be further disposed between the gate insulating layer 311 and the drain electrode DE. In an exemplary embodiment, a semiconductor layer (hereinafter, "a third additional semiconductor layer") may be further disposed between the gate insulating layer 311 and the data line DL1.

In an exemplary embodiment, although not illustrated, an ohmic contact layer may be further disposed between the first additional semiconductor layer and the source electrode SE. In an exemplary embodiment, an ohmic contact layer may be further disposed between the second additional semiconductor layer and the drain electrode DE. In an exemplary embodiment, an ohmic contact layer may be further disposed between the third additional semiconductor layer and the data line DL1.

In an exemplary embodiment, as illustrated in FIG. 2, the protective layer 320 is located on the gate insulating layer 311, the data line DL1, the source electrode SE and the drain electrode DE. In such an embodiment, the protective layer 320 may be located over an entire surface of the first substrate 301 including the gate insulating layer 311, the data line DL1, the source electrode SE and the drain electrode DE.

In an exemplary embodiment, an opening is defined in the protective layer 320 at a location corresponding to the drain electrode DE to thereby expose a part of the drain electrode DE. The opening of the protective layer 320 may be a part of the drain contact hole 11.

The protective layer 320 may include an inorganic insulating material such as silicon nitride ($SiN_x$), silicon oxide ($SiO_x$), or the like. In such an embodiment, an inorganic insulating material may have photosensitivity and a dielectric constant of about 4.0. In an alternative exemplary embodiment, the protective layer 320 may have a double-layer structure including a lower inorganic layer and an upper organic layer. The protective layer 320 may have a thickness greater than or equal to about 5000 angstroms (Å), e.g., in a range of about 6000 Å to about 8000 Å.

In an exemplary embodiment, as illustrated in FIGS. 1 and 2, the color filter layer 351 is located on the protective layer 320 corresponding to the pixel electrode PE1, the gate line GL1 and the sustain line 721. The color filter layer 351 may have a predetermined color. In such an embodiment, the color filter layer 351 may include a pigment corresponding to the predetermined color.

In an exemplary embodiment, as illustrated in FIG. 1, the dummy color filter layer 801 may be located between the color filter layer 351 and an edge of the first substrate 301. In an exemplary embodiment, the dummy color filter layer 801 may be located between two adjacent color filter layers having a substantially same color as each other. The dummy color filter layer 801 will be described later in greater detail.

In an exemplary embodiment, as illustrated in FIG. 2, the insulating interlayer 325 is located on the color filter layer 351 and the protective layer 320. The insulating interlayer 325 may be located over an entire surface of the first substrate 301 including the color filter layer 351 and the protective layer 320.

An opening is defined through the insulating interlayer 325 at a location corresponding to the drain electrode DE to thereby expose the drain electrode DE. The opening of the insulating interlayer 325 is a part of the drain contact hole 11. In such an embodiment, the drain contact hole 11 includes the opening of the protective layer 320 described above and the opening of the insulating interlayer 325.

The insulating interlayer 325 may include a substantially same material as the protective layer 320 described above. In one exemplary embodiment, for example, each of the insulating interlayer 325 and the protective layer 320 may include a photosensitive organic material. A height difference or a step coverage of the insulating interlayer 325 may vary depending on the characteristics of the photosensitive organic material.

In an exemplary embodiment, as illustrated in FIG. 1, the pixel electrode PE1 may be located at an area (hereinafter, a pixel area) that is not covered by a light blocking layer in an area surrounded by the gate line GL1, the sustain line 721 and the data lines DL1 and DL2 adjacent to each other. In such an embodiment, at least one of edges of the pixel electrode PE1 adjacent to the sustain line 721 may overlap the sustain line 721.

The pixel electrode PE1 may include a transparent conductive material such as ITO or IZO. In such an embodiment, ITO may be a polycrystalline or monocrystalline material, and IZO may be a polycrystalline or monocrystalline material as well. Alternatively, IZO may be an amorphous material.

Figure 3:
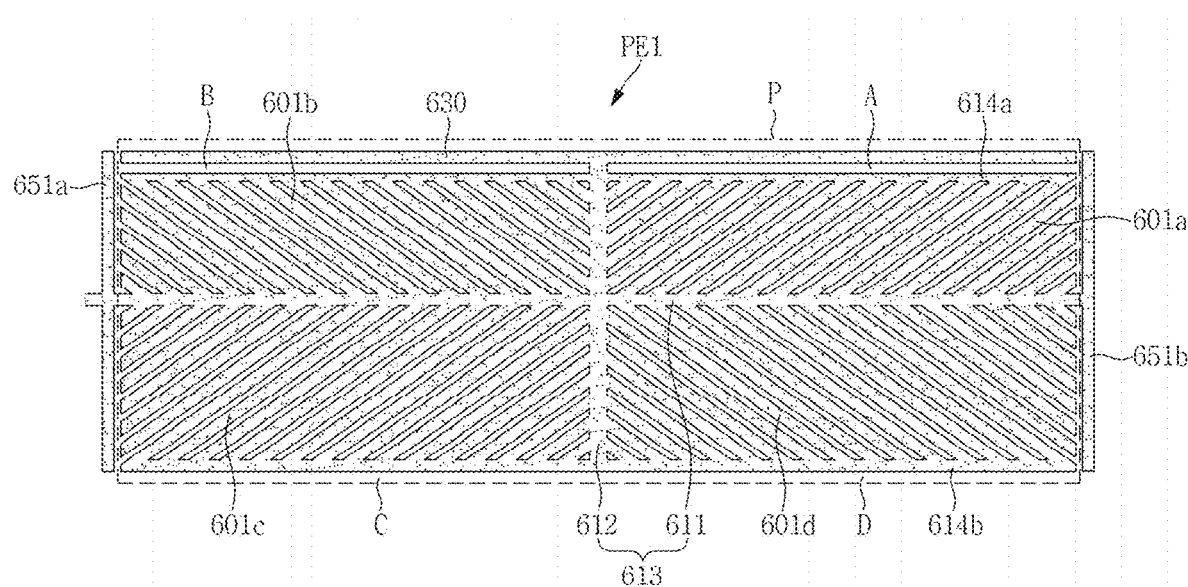
FIG. 3 is an enlarged view illustrating a pixel electrode of FIG. 1.

FIG. 3 is an enlarged view illustrating a pixel electrode of FIG. 1.

In an exemplary embodiment, as illustrated in FIG. 3, the pixel electrode PE1 includes a stem electrode 613 and a plurality of branch electrodes 601a, 601b, 601c and 601d extending from the stem electrode 613. The stem electrode 613 and the branch electrodes 601a, 601b, 601c and 601d may be integrally formed as a single unitary and indivisible unit.

The stem electrode 613 divides the pixel area P into a plurality of domains. In one exemplary embodiment, for example, the stem electrode 613 includes a horizontal portion 611 and a vertical portion 612 that intersect each other. The horizontal portion 611 divides the pixel area P into two domains, and the vertical portion 612 divides each of the two divided domains into two smaller domains. Accordingly, in such an embodiment, the pixel area P is divided into four domains A, B, C and D by the stem electrode 613 including the horizontal portion 611 and the vertical portion 612.

The branch electrodes include first, second, third and fourth branch electrodes 601a, 601b, 601c and 601d respectively extending in different directions from the stem electrode 613. In such an embodiment, the first, second, third and fourth branch electrodes 601a, 601b, 601c and 601d extend into the respective domains A, B, C and D from the stem electrode 613. In one exemplary embodiment, for example, the first branch electrode 601a is disposed at the first domain A, the second branch electrode 601b is disposed at the second domain B, the third branch electrode 601c is disposed at the third domain C, and the fourth branch electrode 601d is disposed at the fourth domain D.

In an exemplary embodiment, the first branch electrode 601a and the second branch electrode 601b form a symmetric shape with respect to the vertical portion 612, and the third branch electrode 601c and the fourth branch electrode 601d form a symmetric shape with respect to the vertical portion 612. In such an embodiment, the first branch electrode 601a and the fourth branch electrode 601d form a symmetric shape with respect to the horizontal portion 611 and the second branch electrode 601b and the third branch electrode 601c form a symmetric shape with respect to the horizontal portion 611.

A plurality of first branch electrodes 601a may be disposed in the first domain A. In such an embodiment, the plurality of first branch electrodes 601a is arranged in parallel to one another. In such an embodiment, some of the first branch electrodes 601a extend from one side of the horizontal portion 611 adjacent to the first domain A in a diagonal direction with respect to the one side thereof. In such an embodiment, some of the first branch electrodes 601a extend from one side of the vertical portion 612 adjacent to the first domain A in a diagonal direction with respect to the one side thereof.

A plurality of second branch electrodes 601b may be disposed in the second domain B. In such an embodiment, the plurality of second branch electrodes 601b is arranged in parallel to one another. In such an embodiment, some of the second branch electrodes 601b extend from one side of the horizontal portion 611 adjacent to the second domain B in a diagonal direction with respect to the one side thereof. In such an embodiment, some of the second branch electrodes 601b extend from one side of the vertical portion 612 adjacent to the second domain B in a diagonal direction with respect to the one side thereof.

A plurality of third branch electrodes 601c may be disposed in the third domain C. In such an embodiment, the plurality of third branch electrodes 601c is arranged in parallel to one another. In such an embodiment, some of the third branch electrodes 601c extend from one side of the horizontal portion 611 adjacent to the third domain C in a diagonal direction with respect to the one side thereof. In addition, some of the third branch electrodes 601c extend from one side of the vertical portion 612 adjacent to the third domain C in a diagonal direction with respect to the one side thereof.

A plurality of fourth branch electrodes 601d may be provided at the fourth domain D. In such an embodiment, the plurality of fourth branch electrodes 601d is arranged in parallel to one another. In such an embodiment, some of the fourth branch electrodes 601d extend from one side of the horizontal portion 611 adjacent to the fourth domain D in a diagonal direction with respect to the one side thereof. In such an embodiment, some of the fourth branch electrodes 601d extend from one side of the vertical portion 612 adjacent to the fourth domain D in a diagonal direction with respect to the one side thereof.

In an exemplary embodiment, the aforementioned stem electrode 613 may further include a first connection portion 614a and a second connection portion 614b. The first connection portion 614a is connected to one end portion of the vertical portion 612 and the second connection portion 614b is connected to another end portion of the vertical portion 612. The first connection portion 614a and the second connection portion 614b may be arranged in parallel to the horizontal portion 611. The first connection portion 614a and the second connection portion 614b may be integrally formed as a single unitary and indivisible unit with the stem electrode 613.

End portions of at least two first branch electrodes 601a disposed in the first domain A and end portions of at least two fourth branch electrodes 601d disposed in the fourth domain D may be connected to one another by the second connection portion 614b. Similarly, end portions of at least two second branch electrodes 601b disposed in the second domain B and end portions of at least two third branch electrodes 601c disposed in the third domain C may be connected to one another by the first connection portion 614a.

In an exemplary embodiment, although not illustrated, end portions of at least two first branch electrodes 601a disposed in the first domain A and end portions of at least two second branch electrodes 601b disposed in the second domain B may be connected to one another by a different connection portion. In such an embodiment, end portions of at least two third branch electrodes 601c disposed in the third domain C and end portions of at least two fourth branch electrodes 601d disposed in the fourth domain D may be connected to one another by another different connection portion.

In an exemplary embodiment, as illustrated in FIG. 3, the pixel electrode PE1 may further include an auxiliary horizontal portion 630, a first auxiliary vertical portion 651a and a second auxiliary vertical portion 651b.

Each of the auxiliary horizontal portion 630, the first auxiliary vertical portion 651a and the second auxiliary vertical portion 651b may have a bar shape.

The auxiliary horizontal portion 630 is parallel to the horizontal portion 611. The auxiliary horizontal portion 630 is connected to the vertical portion 612. The auxiliary horizontal portion 630 may be integrally formed as a single unitary and indivisible unit with the vertical portion 612.

The first auxiliary vertical portion 651a is parallel to the vertical portion 612. The first auxiliary vertical portion 651a is connected to one side of the horizontal portion 611. The first auxiliary vertical portion 651a may be formed integrally as a single unitary and indivisible unit with the horizontal portion 611. In such an embodiment, the first auxiliary vertical portion 651a may overlap the first control layer 501 included in the pre-tilt control layer 500 (shown in FIG. 2).

The second auxiliary vertical portion 651b is parallel to the vertical portion 612. The second auxiliary vertical portion 651b is connected to another side of the horizontal portion 611. The second auxiliary vertical portion 651b may be formed integrally as a single unitary and indivisible unit with the horizontal portion 611. The second auxiliary vertical portion 651b may overlap the second control layer 502 included in the pre-tilt control layer 500.

In such an embodiment, a capacitance deviation between pixels due to misalignment of the pixel electrode PE1 may be reduced by the auxiliary horizontal portion 630, the first auxiliary vertical portion 651a and the second auxiliary vertical portion 651b.

In an exemplary embodiment, as illustrated in FIGS. 1 and 2, the pixel electrode PE1 may be connected to the switching element TFT1 through a connection electrode 880. In one exemplary embodiment, for example, the pixel electrode PE1 may be connected to the drain electrode DE of the switching element TFT1 through the connection electrode 880 and the drain contact hole 11. The connection electrode 880 may be formed integrally as a single unitary and indivisible unit with the pixel electrode PE1.

The connection electrode 880 may include a substantially same material as the pixel electrode PE1 and may have a substantially same structure as that of the pixel electrode PE1. The connection electrode 880 and the pixel electrode PE1 may be simultaneously formed with each other in a substantially same process.

In an exemplary embodiment, as illustrated in FIG. 1, the shielding electrode 961 overlaps at least a part of each of the gate line GL1, the gate electrode GE, the sustain line 721, the pre-tilt control layer 500, the data line DL1, the source electrode SE and the drain electrode DE.

In such an embodiment, as illustrated in FIG. 1, a portion of the shielding electrode 961 (hereinafter, "a first electrode") overlaps a part of the gate line GL1 and has a shape of a line located along the gate line GL1, and another portion of the shielding electrode 961 (hereinafter, "a second electrode") overlaps a part of the data line DL1 and has a shape of a line located along the data line DL1. In such an embodiment, the first electrode of the shielding electrode 961 intersects the data line DL1, and the second electrode thereof intersects the gate line GL1 and the sustain line 721. In such an embodiment, yet another portion of the shielding electrode 961 has a planar shape protruding from the first electrode toward the sustain line 721 to overlap at least a part of each of the source electrode SE, the drain electrode DE and the gate electrode GE, and still another portion of the shielding electrode 961 has a shape protruding from the second electrode toward the pixel electrode PE1.

The shielding electrode 961 may receive a substantially same voltage as a voltage of the common electrode 330. In one exemplary embodiment, for example, the shielding electrode 961 may receive the common voltage from an external driving circuit.

In such an embodiment, the shielding electrode 961 effectively prevents an electric field from being generated between the gate line GL1 and the pixel electrode PE1. In such an embodiment, since the shielding electrode 961 and the common electrode 330 receive a substantially same voltage, e.g., the common voltage, the shielding electrode 961 and the common electrode 330 may become equipotential. Accordingly, a light passing through the liquid crystal layer 333 between the shielding electrode 961 and the common electrode 330 is blocked, such that light leakage at a portion corresponding to the data line DL1 may be effectively prevented. In such an embodiment, since the shielding electrode 961 may replace a portion of the light blocking layer 376 on the gate line GL1, the portion of the light blocking layer 376 on the data line DL1 may be removed, such that an aperture ratio of the pixel PX1 may be further increased.

The shielding electrode 961 may include a substantially same material as the pixel electrode PE1 and may have a substantially same structure (a multilayer structure) as the pixel electrode PE1. The shielding electrode 961 and the pixel electrode PE1 may be simultaneously formed with each other in a substantially same process.

In an exemplary embodiment, as illustrated in FIG. 1, the light blocking layer 376 intersects the gate line GL1 and the sustain line 721. In such an embodiment, as illustrated in FIG. 1, the light blocking layer 376 overlaps the switching element TFT1, the data line DL1 and the drain contact hole 11. In such an embodiment, the light blocking layer 376 may further overlap a part of the pixel electrode PE1, a part of the shielding electrode 961 and the connection electrode 880. In one exemplary embodiment, for example, as illustrated in FIG. 1, the light blocking layer 376 may overlap at least one of edges of the pixel electrode PE1 adjacent to the data line DL1. Herein, the data line DL1 means a data line DL1 which is integrally formed as a single unitary and indivisible unit with the source electrode SE of the switching element TFT1 connected to the pixel electrode PE1. In such an embodiment, as illustrated in FIG. 2, the light blocking layer 376 is located on the protective layer 320, the pixel electrode PE1 and the shielding electrode 961.

The light blocking layer 376 may include a photosensitive organic material. In such an embodiment, the photosensitive organic material may be a photosensitive organic material of a positive type or a negative type. A height difference or a step coverage of the light blocking layer 376 may vary depending on the characteristics of the photosensitive organic material.

In an exemplary embodiment, as illustrated in FIGS. 1 and 2, the column spacer 901 is located on the light blocking layer 376 to overlap the dummy color filter layer 801. In an exemplary embodiment, as illustrated in FIG. 2, the column spacer 901 may be formed integrally as a single unitary and indivisible unit with the light blocking layer 376. In such an embodiment, where the column spacer 901 and the light blocking layer 376 are integrally formed as a single unitary and indivisible unit, a portion of the integrated structure overlapping the dummy color filter layer 801 corresponds to the aforementioned column spacer 901.

The column spacer 901 may include a substantially same material as the light blocking layer 376 and may have a substantially same structure as the light blocking layer 376. The column spacer 901 and the light blocking layer 376 may be simultaneously formed with each other in a substantially same process.

A height h1 of the column spacer 901 depends on or is determined based a height h11 of the dummy color filter layer 801 located below the column spacer 901. The height h11 of the dummy color filter layer 801 depends on or is determined based an area of the dummy color filter layer 801. Accordingly, the height h1 of the column spacer 901 depends on or is determined based the area of the dummy color filter layer 801. As the area of the dummy color filter layer 801 increases, the height h11 of the dummy color filter layer 801 increases, and accordingly, the height h1 of the column spacer 901 located on the dummy color filter layer 801 also increases.

Herein, as illustrated in FIG. 2, the height h1 of the column spacer 901 is defined as a vertical distance from a flat reference surface of the first substrate 301 (i.e., an inner surface of the first substrate 301) to an uppermost layer surface of the column spacer 901, and the vertical distance means a distance measured in a direction parallel to a Z axis (hereinafter, "a Z-axis direction"). The reference surface of the first substrate 301 perpendicularly intersects the Z-axis direction. The uppermost layer surface of the column spacer 901 refers to one of surfaces of the column spacer 901 that is farthest in the Z-axis direction from the aforementioned reference surface. Alternatively, the aforementioned height of the column spacer 901 may be also defined as a vertical distance between a flat reference surface of the second substrate 302 (i.e., an inner surface of the second substrate 302) and the column spacer 901. Herein, the vertical distance between the reference surface of the second substrate 302 and the column spacer 901 means a distance measured in the Z-axis direction.

Alternatively, the height h11 of the dummy color filter layer 801 may also be defined as a vertical distance from the reference surface of the first substrate 301 to an uppermost layer surface of the dummy color filter layer 801. The vertical distance means a distance measured in the Z-axis direction.

The area of the dummy color filter layer 801 means a size or area of a surface S1 (hereinafter, "an opposing surface") most adjacent to the reference surface of the second substrate 302 of surfaces of the dummy color filter layer 801. In one exemplary embodiment, for example, as illustrated in FIG. 2, the opposing surface S1 faces the reference surface of the second substrate 302, and is parallel to the reference surface.

Figure 4:
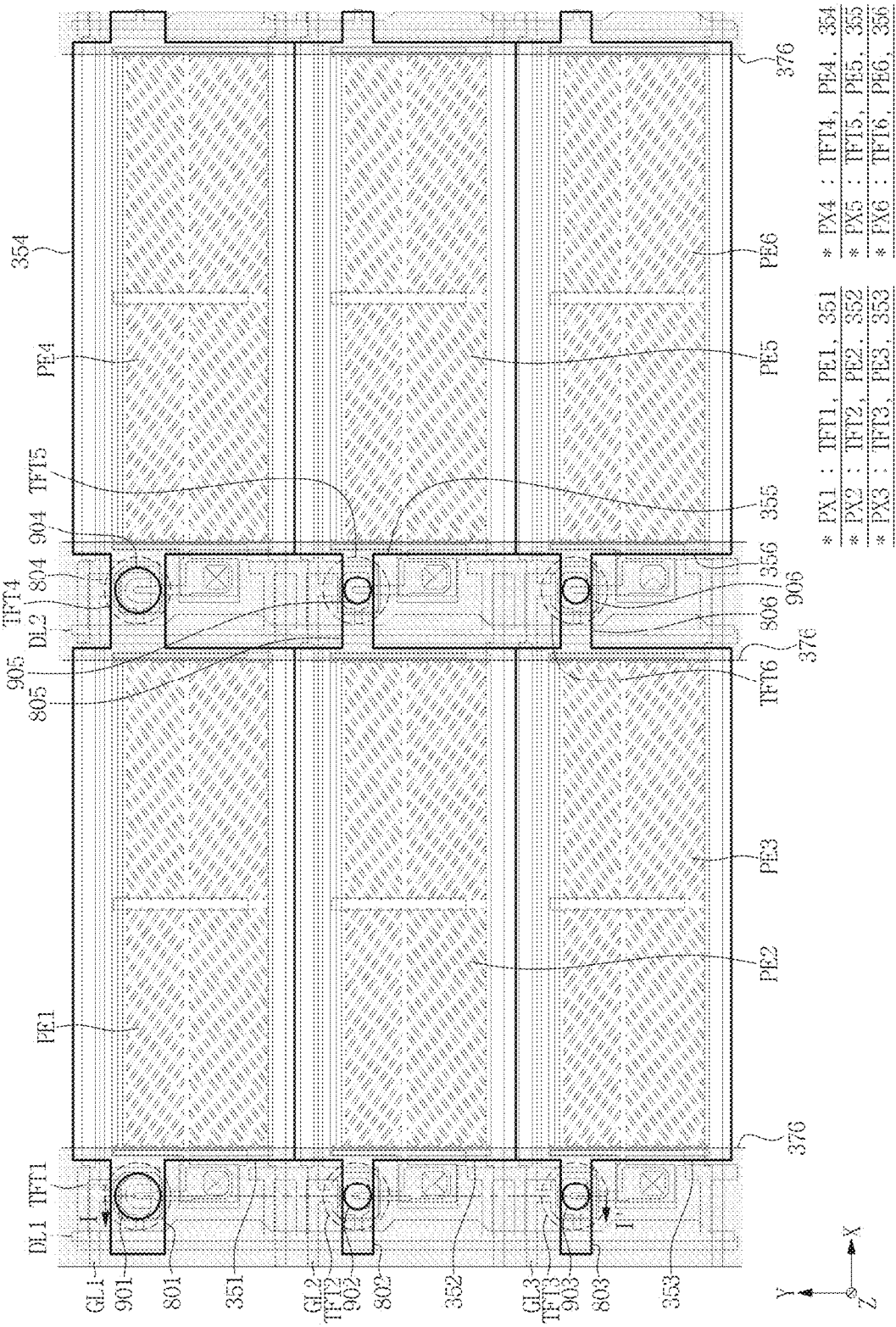
FIG. 4 is a plan view illustrating a display device including a plurality of pixels having a structure illustrated in FIG. 1.
Figure 5:
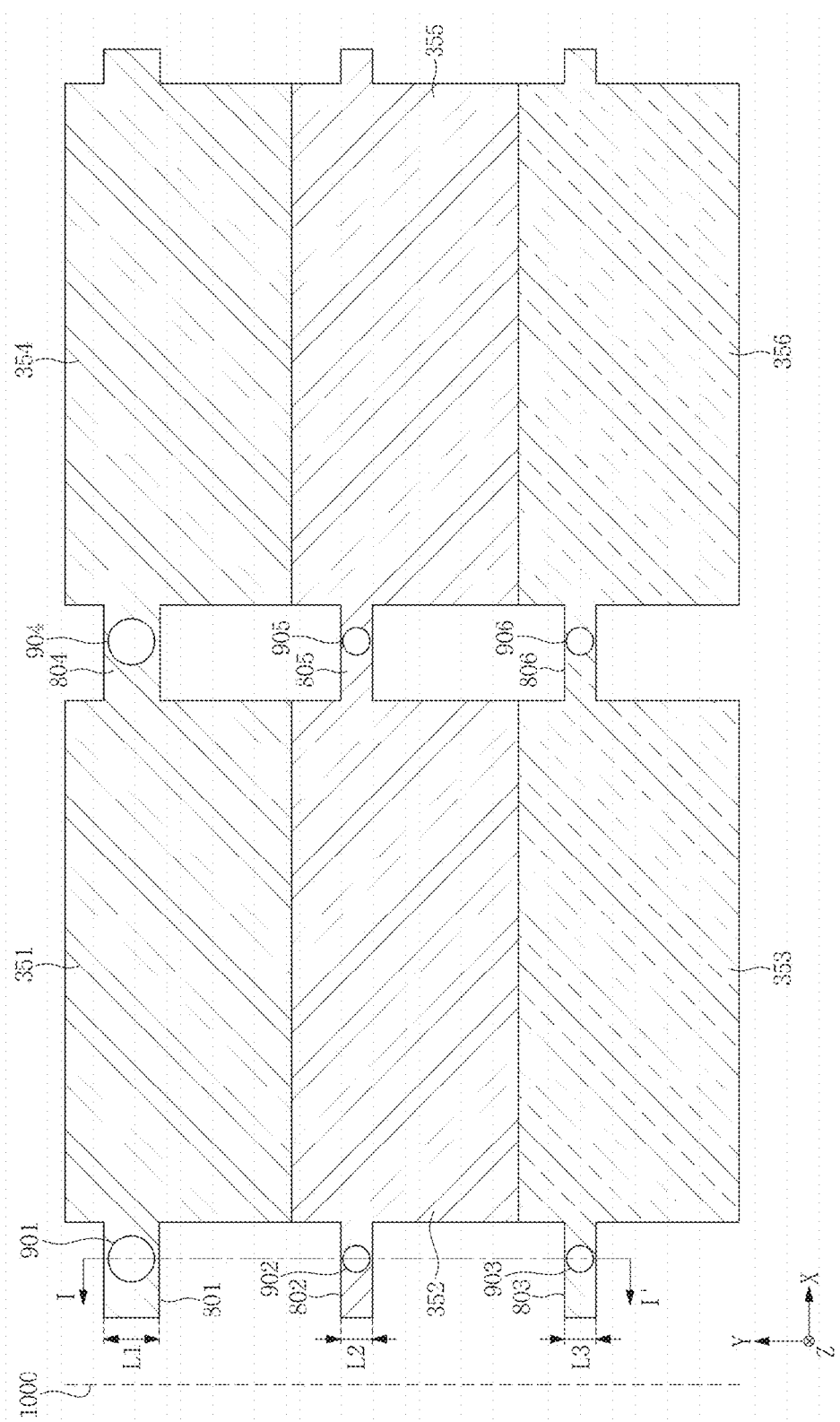
FIG. 5 is a view illustrating first, second, third, fourth, fifth and sixth color filter layers and first, second, third, fourth, fifth and sixth dummy color filter layers of FIG. 4.
Figure 6:
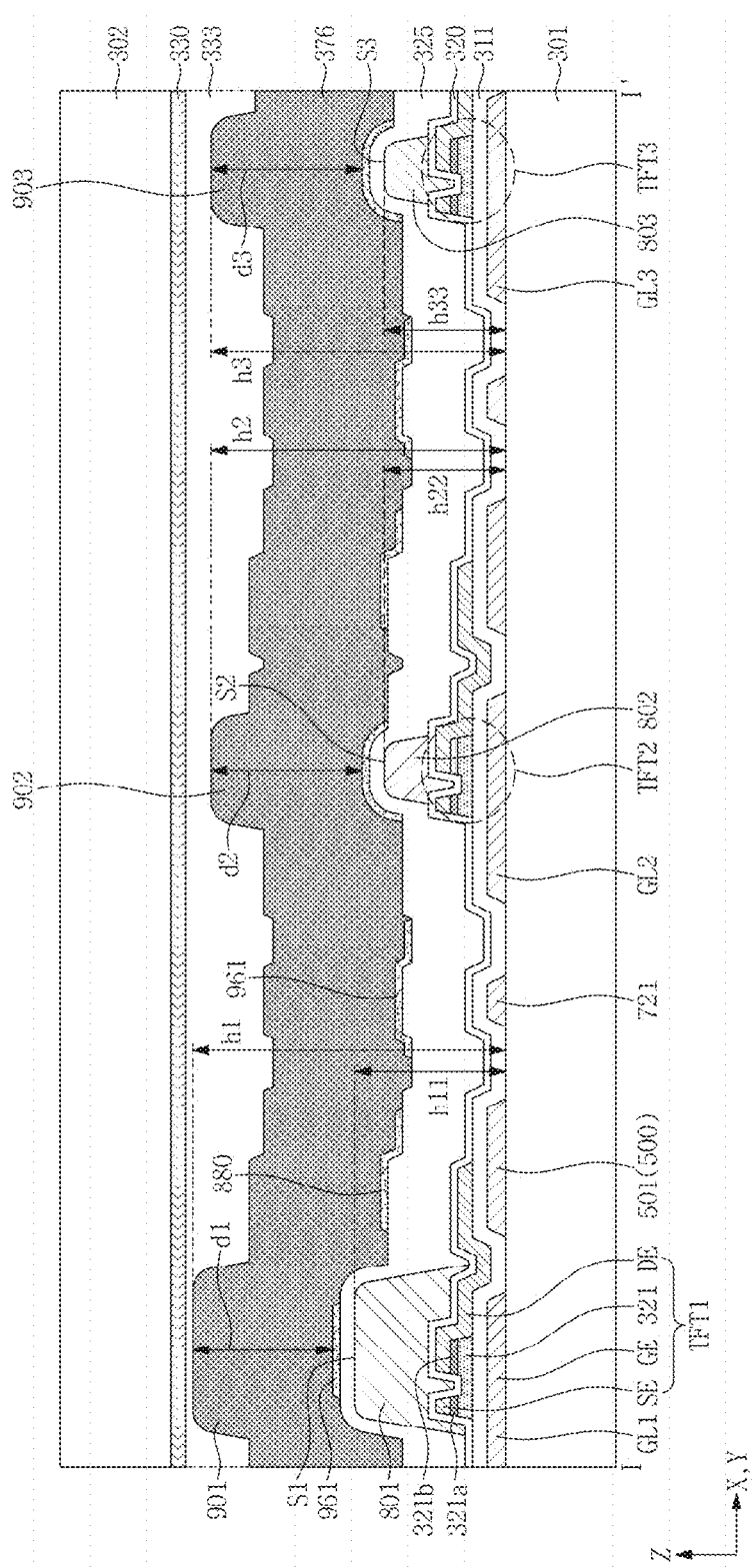
FIG. 6 is a cross-sectional view taken along line I-I' of FIG. 4.

FIG. 4 is a plan view illustrating a display device including a plurality of pixels having a structure illustrated in FIG. 1, FIG. 5 is a view illustrating first, second, third, fourth, fifth and sixth color filter layers and first, second, third, fourth, fifth and sixth dummy color filter layers of FIG. 4, and FIG. 6 is a cross-sectional view taken along line I-I' of FIG. 4.

In an exemplary embodiment, as illustrated in FIG. 4, the display device includes a plurality of pixels PX1, PX2, PX3, PX4, PX5 and PX6. In FIG. 4, an exemplary embodiment of a display device including six pixels PX1, PX2, PX3, PX4, PX5 and PX6 is illustrated. A first pixel PX1 of FIG. 4 is substantially the same as the pixel PX1 of FIG. 1. In such an embodiment, each of the pixels PX1, PX2, PX3, PX4, PX5 and PX6 in FIG. 4 has a substantially same structure as the pixel PX1 in FIG. 1 described above.

The six pixels PX1, PX2, PX3, PX4, PX5 and PX6 are connected to three gate lines GL1, GL and GL3 and two data lines DL1 and DL2. In one exemplary embodiment, for example, the first pixel PX1 and a fourth pixel PX4 adjacent to each other in the X-axis direction are commonly connected to a first gate line GL1, a second pixel PX2 and a fifth pixel PX5 adjacent to each other in the X-axis direction are commonly connected to a second gate line GL2, and a third pixel PX3 and a sixth pixel PX6 adjacent to each other in the X-axis direction are commonly connected to a third gate line GL3. In an exemplary embodiment, the first pixel PX1, the second pixel PX2 and the third pixel PX3 adjacent to each other in the Y-axis direction are commonly connected to a first data line DL1, and the fourth pixel PX4, the fifth pixel PX5 and the sixth pixel PX6 adjacent to each other in the Y-axis direction are commonly connected to a second data line DL2.

In such an embodiment, the first pixel PX1 is connected to the first gate line GL1 and the first data line DL1, the second pixel PX2 is connected to the second gate line GL2 and the first data line DL1, the third pixel PX3 is connected to the third gate line GL3 and the first data line DL1, the fourth pixel PX4 is connected to the first gate line GL1 and the second data line DL2, the fifth pixel PX5 is connected to the second gate line GL2 and the second data line DL2, and the sixth pixel PX6 is connected to the third gate line GL3 and the second data line DL2.

In an exemplary embodiment, the first pixel PX1 includes a first switching element TFT1, a first pixel electrode PE1 and a first color filter layer 351, the second pixel PX2 includes a second switching element TFT2, a second pixel electrode PE2 and a second color filter layer 352, and the third pixel PX3 includes a third switching element TFT3, a third pixel electrode PE3 and a third color filter layer 353. In such an embodiment, the fourth pixel PX4 includes a fourth switching element TFT4, a fourth pixel electrode PE4 and a fourth color filter layer 354, the fifth pixel PX5 includes a fifth switching element TFT5, a fifth pixel electrode PE5 and a fifth color filter layer 355, and the sixth pixel PX6 includes a sixth switching element TFT6, a sixth pixel electrode PE6 and a sixth color filter layer 356.

Color filter layers adjacent to one another in the X-axis direction have a substantially same color as each other. In one exemplary embodiment, for example, as illustrated in FIG. 5, the first color filter layer 351 may have a substantially same color as the fourth color filter layer 354, the second color filter layer 352 may have a substantially same color as the fifth color filter layer 355, and the third color filter layer 353 may have a substantially same color as the sixth color filter layer 356.

Color filter layers adjacent to one another in the Y-axis direction have different colors from one another. In one exemplary embodiment, for example, as illustrated in FIG. 5, the first color filter layer 351, the second color filter layer 352 and the third color filter layer 353 have different colors from one another, and the fourth color filter layer 354, the fifth color filter layer 355 and the sixth color filter layer 356 have different colors from one another.

In one exemplary embodiment, for example, each of the first color filter layer 351 and the fourth color filter layer 354 may have a red color, each of the second color filter layer 352 and the fifth color filter layer 355 may have a green color, and each of the third color filter layer 353 and the sixth color filter layer 356 may have a blue color.

In an exemplary embodiment, as illustrated in FIG. 4, a first dummy color filter layer 801 overlaps the first switching element TFT1, a second dummy color filter layer 802 overlaps the second switching element TFT2, and a third dummy color filter layer 803 overlaps the third switching element TFT3. In such an embodiment, a fourth dummy color filter layer 804 overlaps the fourth switching element TFT4, a fifth dummy color filter layer 805 overlaps the fifth switching element TFT5, and a sixth dummy color filter layer 806 overlaps the sixth switching element TFT6.

In an exemplary embodiment, as illustrated in FIG. 5, the first dummy color filter layer 801 is located between an edge 1000 of a first substrate 301 and the first color filter layer 351, the second dummy color filter layer 802 is located between the edge 1000 of the first substrate 301 and the second color filter layer 352, and the third dummy color filter layer 803 is located between the edge 1000 of the first substrate 301 and the third color filter layer 353. In such an embodiment, the fourth dummy color filter layer 804 is located between the first color filter layer 351 and the fourth color filter layer 354 that are adjacent to each other in the X-axis direction and have a substantially same color, the fifth dummy color filter layer 805 is located between the second color filter layer 352 and the fifth color filter layer 355 that are adjacent to each other in the X-axis direction and have a substantially same color, and the sixth dummy color filter layer 806 is located between the third color filter layer 353 and the sixth color filter layer 356 that are adjacent to each other in the X-axis direction and have a substantially same color.

In an exemplary embodiment, the first dummy color filter layer 801 may have a substantially same color as the first color filter layer 351 adjacent thereto, the second dummy color filter layer 802 may have a substantially same color as the second color filter layer 352 adjacent thereto, and the third dummy color filter layer 803 may have a substantially same color as the third color filter layer 353 adjacent thereto. In such an embodiment, the fourth dummy color filter layer 804 may have a substantially same color as the fourth color filter layer 354 adjacent thereto, the fifth dummy color filter layer 805 may have a substantially same color as the fifth color filter layer 355 adjacent thereto, and the sixth dummy color filter layer 806 may have a substantially same color as the sixth color filter layer 356 adjacent thereto.

A color filter and a dummy color filter having a substantially same color as each other may be formed integrally as a single unitary and indivisible unit. In one exemplary embodiment, for example, as illustrated in FIG. 5, the first dummy color filter layer 801 having a red color, the first color filter layer 351 having a red color, the fourth dummy color filter layer 804 having a red color and the fourth color filter layer 354 having a red color may all be formed integrally as a single unitary and indivisible unit.

Each of the first, second, third, fourth, fifth and sixth switching elements TFT1, TFT2, TFT3, TFT4, TFT5 and TFT6 in FIG. 4 is substantially the same as the aforementioned switching element TFT1 described above with reference to FIG. 1, and any repetitive detailed description thereof will hereinafter be omitted. Each of the first, second, third, fourth, fifth and sixth pixel electrodes PE1, PE2, PE3, PE4, PE5 and PE6 in FIG. 4 is substantially the same as the aforementioned pixel electrode PE1 described above with reference to FIG. 1, and any repetitive detailed description thereof will hereinafter be omitted. Each of the first, second, third, fourth, fifth and sixth color filter layers 351, 352, 353, 354, 355 and 356 in FIG. 4 is substantially the same as the aforementioned color filter layer 351 described above with reference to FIG. 1, and any repetitive detailed description thereof will hereinafter be omitted. Each of the first, second, third, fourth, fifth and sixth dummy color filter layers 801, 802, 803, 804, 805 and 806 in FIG. 4 is substantially the same as the aforementioned dummy color filter layer 801 described above with reference to FIG. 1, and any repetitive detailed description thereof will hereinafter be omitted.

In an exemplary embodiment, as illustrated in FIGS. 5 and 6, at least two dummy color filter layers may have different sizes from each other. In an exemplary embodiment, a size of the first dummy color filter layer 801 may be different from a size of the second dummy color filter layer 802. In an exemplary embodiment, as illustrated in FIGS. 5 and 6, an area of an opposing surface S1 of the first dummy color filter layer 801 may be larger than an area of an opposing surface S2 of the second dummy color filter layer 802. An area of an opposing surface S3 of the third dummy color filter layer 803 may be substantially equal to the area of the opposing surface S2 of the second dummy color filter layer 802.

In an exemplary embodiment, the fourth dummy color filter layer 804 may have an area substantially equal to an area of the first dummy color filter layer 801. In such an embodiment, each of the fifth dummy color filter layer 805 and the sixth dummy color filter layer 806 may have an area substantially equal to an area of the second dummy color filter layer 802.

A first column spacer 901 is located on the first dummy color filter layer 801, a second column spacer 902 is located on the second dummy color filter layer 802, a third column spacer 903 is located on the third dummy color filter layer 803, a fourth column spacer 904 is located on the fourth dummy color filter layer 804, a fifth column spacer 905 is located on the fifth dummy color filter layer 805, and a sixth column spacer 906 is located on the sixth dummy color filter layer 806.

In an exemplary embodiment, as illustrated in FIGS. 4 and 5, the sizes of the at least two column spacers may be different from each other. In one exemplary embodiment, for example, a size of the first column spacer 901 may be larger than a size of the second column spacer 902.

In an exemplary embodiment, the fourth column spacer 904 may have a substantially equal size as the size of the first column spacer 901. In such an embodiment, each of the third column spacer 903, the fifth column spacer 905 and the sixth column spacer 906 may have a substantially equal size as the second column spacer 902.

Due to the area difference among the dummy color filter layers described above, a height difference may occur among the column spacers, which will be described with reference to FIG. 6.

In an exemplary embodiment, as described above, the first dummy color filter layer 801 has a larger area than the area of the second dummy color filter layer 802, and in such an embodiment, a length L1 of one side of the first dummy color filter layer 801 may be greater than a length L2 of one side of the second dummy color filter layer 802 corresponding thereto. In an exemplary embodiment, the length L2 of one side of the second dummy color filter layer 802 may be substantially equal to a length L3 of one side of the third dummy color filter layer 803.

As the first dummy color filter layer 801 has a larger area than the area of the second dummy color filter layer 802, the first dummy color filter layer 801 has a greater height than a height of the second dummy color filter layer 802. In such an embodiment, a height h11 of the first dummy color filter layer 801 is greater than a height h22 of the second dummy color filter layer 802.

As the first dummy color filter layer 801 has a greater height than the height of the second dummy color filter layer 802, the first column spacer 901 on the first dummy color filter layer 801 has a greater height than a height of the second column spacer 902. In such an embodiment, a height h1 of the first column spacer 901 is greater than a height h2 of the second column spacer 902. Accordingly, a distance between a reference surface of the second substrate 302 (i.e., an inner surface of the second substrate 302) and the first column spacer 901 is less than a distance between the reference surface of the second substrate 302 and the second column spacer 902.

In an exemplary embodiment, the third dummy color filter layer 803 has an area substantially equal to the area of the second dummy color filter layer 802, and thus the third column spacer 903 on the third dummy color filter layer 803 has a substantially same height as the height of the second column spacer 902 on the second dummy color filter layer 802 (i.e., h3=h2). Accordingly, a distance between the reference surface of the second substrate 302 and the third column spacer 903 is substantially equal to the distance between the reference surface of the second substrate 302 and the second column spacer 902.

In such an embodiment, the first column spacer 901 has a greater height than the height of the second column spacer 902, and the third column spacer 903 has a substantially same height as the height of the second column spacer 902 because the area of the first dummy color filter layer 801 below the first column spacer 901 is larger than the area of the second dummy color filter layer 802 below the second column spacer 902, and the area of the third dummy color filter layer 803 below the third column spacer 903 is substantially equal to the area of the second dummy color filter layer 802 described above.

The first column spacer 901 having a relatively great height h1 is defined as a main column spacer and each of the second column spacer 902 and the third column spacer 903 having relatively less heights h2 and h3 is defined as a sub-column spacer.

In an exemplary embodiment, as illustrated in FIG. 6, since the first dummy color filter layer 801 has a larger area than the area of the second dummy color filter layer 802 and a column spacer on a dummy color filter layer that has a relatively large area has a relatively high flatness, a thickness d1 of the first column spacer 901 on the first dummy color filter layer 801 is less than a thickness d2 of the second column spacer 902 on the second dummy color filter layer 802. In such an embodiment, the first column spacer 901 and the second column spacer 902 may be exposed by a substantially same amount of light during a manufacturing process thereof, and in such an embodiment, the first column spacer 901 on the first dummy color filter layer 801 having a larger area may have a relatively less thickness. In an exemplary embodiment, the thickness d1 of the first column spacer 901 may be substantially the same as the thickness d2 of the second column spacer 902 on the second dummy color filter layer 802.

The thickness d3 of the third column spacer 903 is substantially the same as the thickness d2 of the second column spacer 902. The first, second and third column spacers 901, 902 and 903 may all be exposed by a substantially same amount of light during a manufacturing process thereof.

As illustrated in FIG. 2, the common electrode 330 is located on the second substrate 302. The common electrode 330 may be located over an entire surface of the second substrate 302. The common electrode 330 receives a common voltage from an external driving circuit. The common voltage is a DC voltage.

The common electrode 330 may include a substantially same material as the pixel electrode PE1 described above. Alternatively, when the pixel electrode PE1 includes IZO, the common electrode 330 may include ITO.

A liquid crystal layer 333 is located between the first substrate 301 and the second substrate 302. The liquid crystal layer 333 may include liquid crystal molecules having negative dielectric anisotropy and vertically aligned. Alternatively, the liquid crystal layer 333 may include a photopolymerizable material, and in such an embodiment, the photopolymerizable material may be a reactive monomer or a reactive mesogen.

FIGS. 7A to 15B are cross-sectional views illustrating a manufacturing method of a display device according to an exemplary embodiment. More particularly, FIGS. 7A, 8A, 9A, 10A, 13A, 14A and 15A are corresponding to cross-sectional views taken along line I-I' of FIG. 1, and FIGS. 7B, 8B, 9B, 10B, 11, 12, 13B, 14B and 15B are corresponding to cross-sectional views taken along line I-I' of FIG. 4.

In an exemplary embodiment of a manufacturing method of a display device, although not illustrated, a gate metal layer is deposited over an entire surface of the first substrate 301. The gate metal layer may be deposited by a physical vapor deposition ("PVD") method such as sputtering, for example.

Figure 7A:
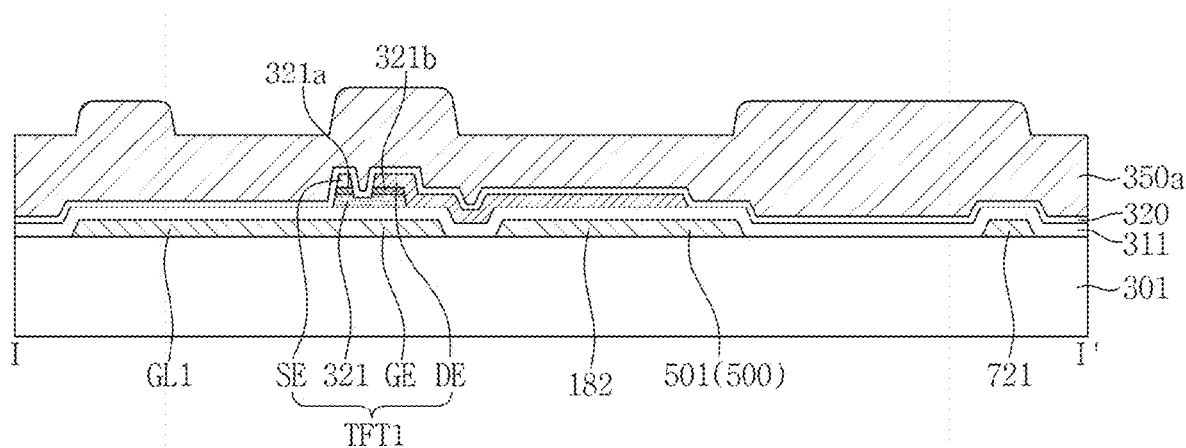
FIGS. 7A to 15B are cross-sectional views illustrating a manufacturing method of a display device according to an exemplary embodiment.
Figure 7B:
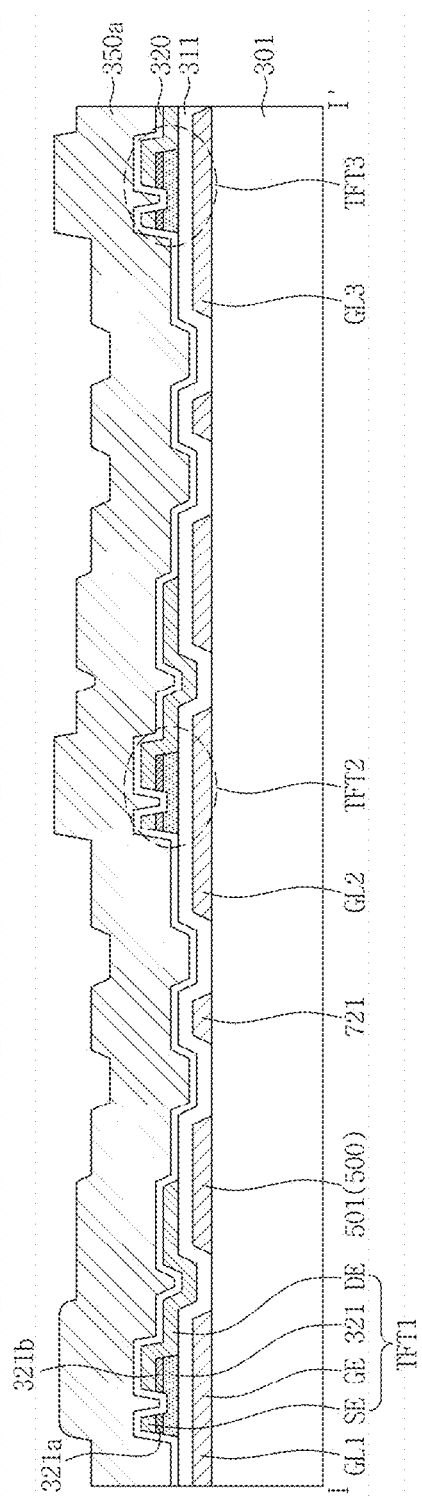

The aforementioned gate metal layer is then patterned through a photolithography process such that the gate line GL1, the gate electrode GE, the pre-tilt control layer 500 and the sustain line 721 are formed as illustrated in FIGS. 7A and 7B.

The gate metal layer may be removed by a wet-etching method using an etchant.

The gate metal layer may include a material that is used for the manufacturing of the aforementioned gate line GL1.

Subsequently, the gate insulating layer 311 is deposited over an entire surface of the first substrate 301 including the gate line GL1, the gate electrode GE, the pre-tilt control layer 500 and the sustain line 721. The gate insulating layer 311 may be deposited by a chemical vapor deposition ("CVD") method.

The gate insulating layer 311 may include a substantially same material used for the manufacturing of the aforementioned gate insulating layer 311.

Subsequently, although not illustrated, a semiconductor material and an impurity semiconductor material are sequentially deposited over an entire surface of the first substrate 301 including the gate insulating layer 311. The semiconductor material and the impurity semiconductor material may be deposited by a CVD method.

The semiconductor material may include a material used for the manufacturing of the aforementioned semiconductor layer 321. The impurity semiconductor material may include a material used for the manufacturing of the first and second ohmic contact layers 321a and 321b described above.

Subsequently, the semiconductor material and the impurity semiconductor material are patterned through a photolithography process such that the semiconductor layer 321 overlapping the gate electrode GE is formed on the gate insulating layer 311 and an impurity semiconductor pattern having a substantially same shape as the semiconductor layer 321 is formed on the semiconductor layer 321.

The semiconductor material and the impurity semiconductor material may be removed in a dry etching method using an etching gas.

Subsequently, although not illustrated, a source metal layer is deposited over an entire surface of the first substrate 301 including the semiconductor layer 321 and the impurity semiconductor pattern.

The source metal layer may include a material used for the manufacturing of the aforementioned data line DL1.

Subsequently, the source metal layer is patterned through a photolithography process such that the data line DL1 intersecting the gate line GL1 is formed on the gate insulating layer 311 and the source electrode SE and the drain electrode DE overlapping opposite sides of the semiconductor layer 321 are formed on the impurity semiconductor pattern.

Subsequently, the impurity semiconductor pattern is patterned through an etching process using the source electrode SE and the drain electrode DE as a mask, such that the first ohmic contact layer 321a and the second ohmic contact layer 321b are formed as illustrated in FIGS. 7A and 7B. The first ohmic contact layer 321a is formed between the source electrode SE and the semiconductor layer 321 and the second ohmic contact layer 321b is formed between the drain electrode DE and the semiconductor layer 321.

In an exemplary embodiment, in the etching process for the aforementioned impurity semiconductor pattern, a part of the semiconductor layer 321 below the impurity semiconductor pattern is removed. Accordingly, a thickness of a portion corresponding to a channel area of the semiconductor layer 321 is reduced.

Subsequently, as illustrated in FIGS. 7A and 7B, the protective layer 320 is deposited over an entire surface of the first substrate 301 including the data line DL1, the source electrode SE and the drain electrode DE.

The protective layer 320 may include a material used for the manufacturing of the aforementioned protective layer 320. In one exemplary embodiment, for example, the protective layer 320 may include an inorganic material.

Subsequently, as illustrated in FIGS. 7A and 7B, a first photosensitive organic material 350a is formed over an entire surface of the first substrate 301 including the protective layer 320. In such an embodiment, the first photosensitive organic material 350a has a thickness less than a thickness enough to form a planarized surface. Accordingly, as illustrated in FIGS. 7A and 7B, an upper surface of the first photosensitive organic material 350a is not planarized. The first photosensitive organic material 350a is a photosensitive organic material of a negative type. The first photosensitive organic material 350a may include a red pigment.

Figure 8A:
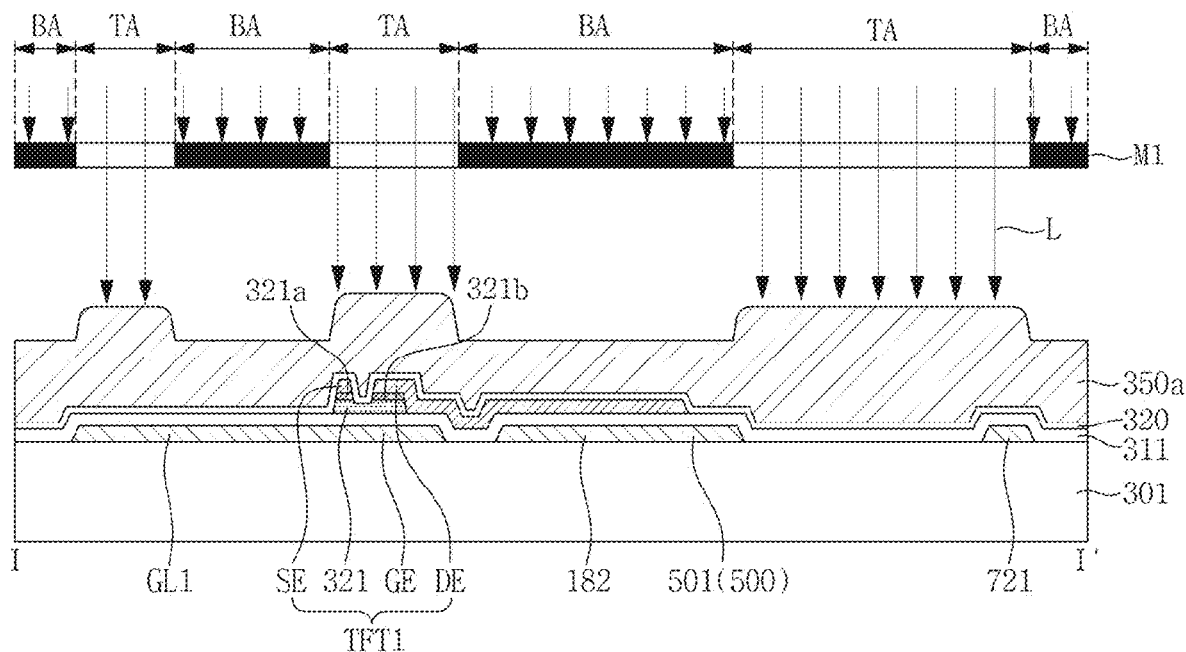
Figure 8B:
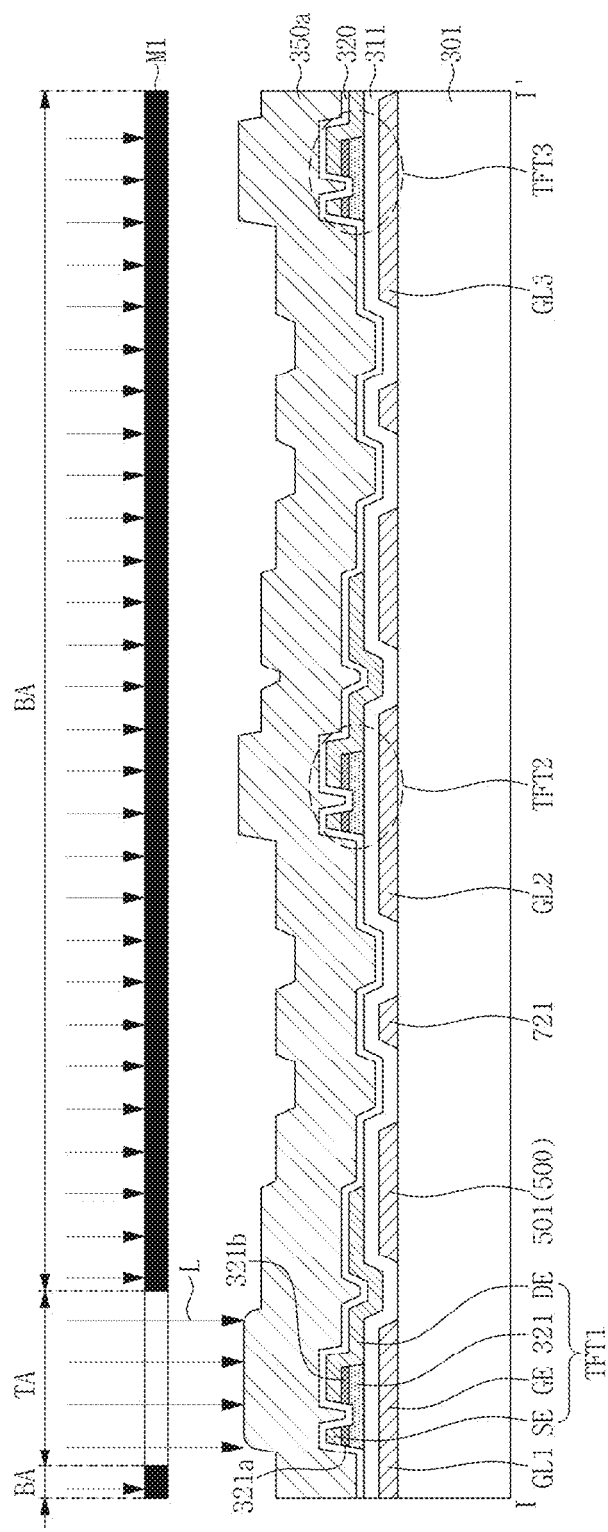

Subsequently, as illustrated in FIGS. 8A and 8B, a first mask M1 is disposed on the first photosensitive organic material 350a. The first mask M1 includes a transmissive area TA, through which light is transmitted, and a blocking area BA which blocks light.

Figure 9A:
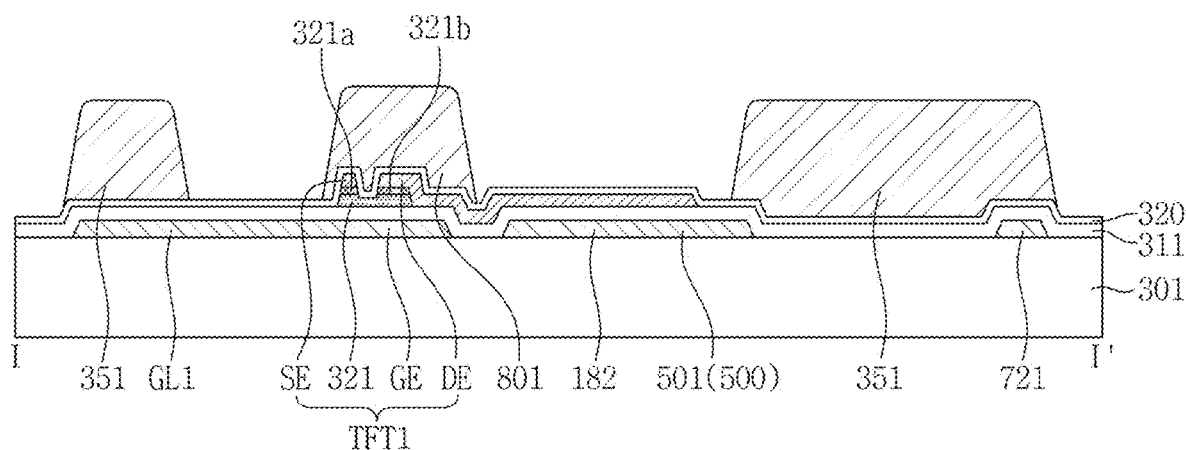
Figure 9B:
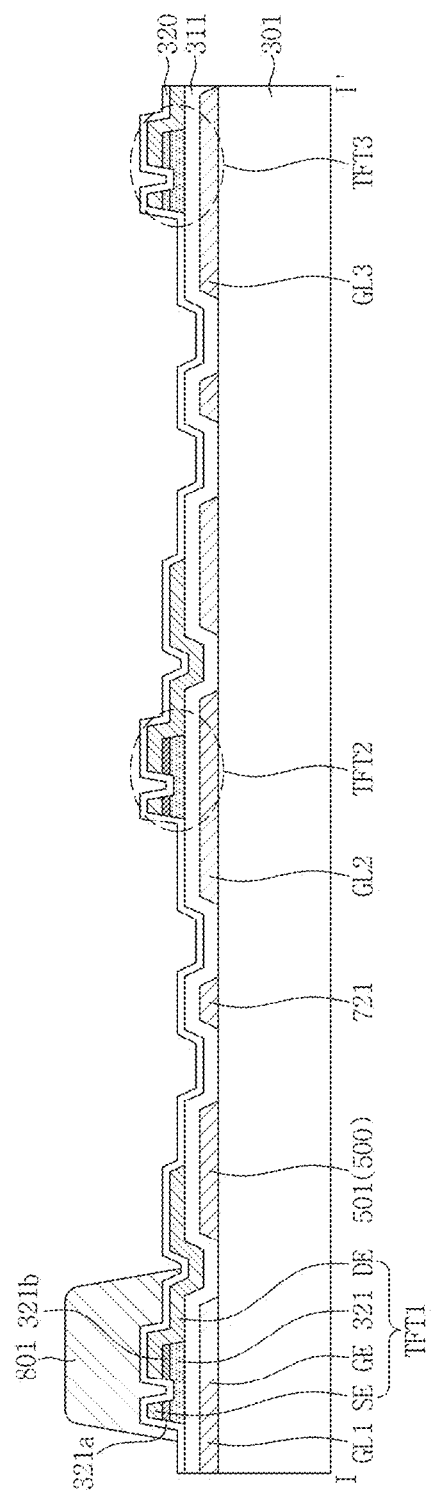

Subsequently, a light L, such as ultraviolet rays, is selectively irradiated to the first photosensitive organic material 350a through the first mask M1 such that the first photosensitive organic material 350a is exposed. When the exposed first photosensitive organic material 350a is developed, the first color filter layer 351 and the first dummy color filter layer 801 are formed as illustrated in FIGS. 9A and 9B. In such an embodiment, the first color filter layer 351 and the first dummy color filter layer 801 are formed integrally as a single unitary and indivisible unit.

Figure 10A:
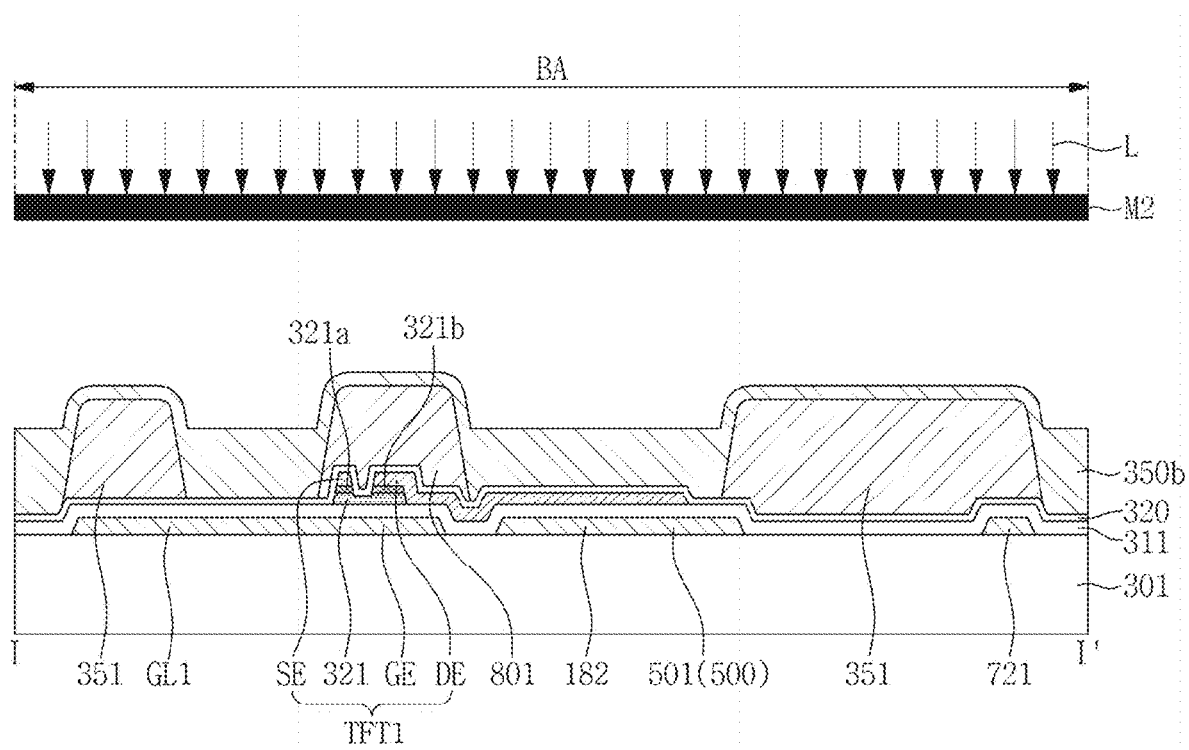
Figure 10B:
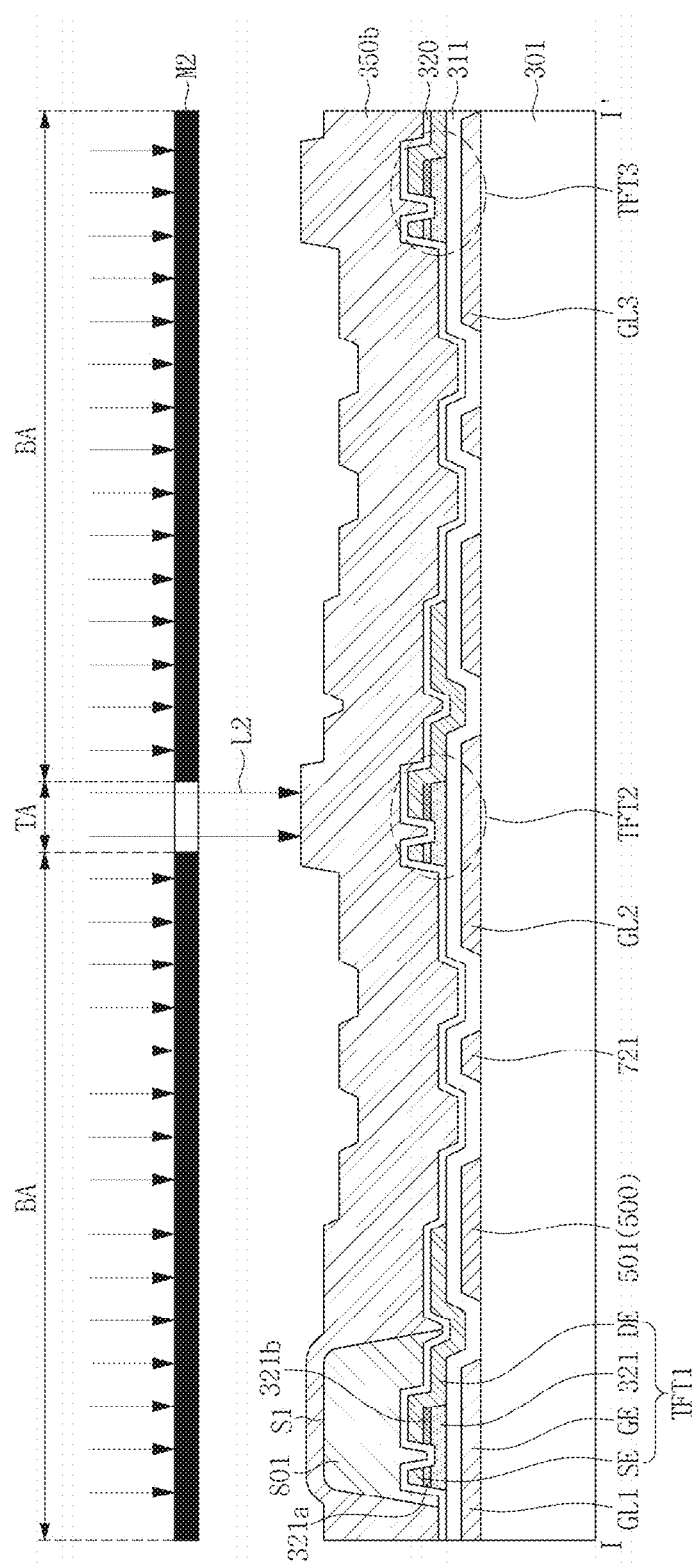

Subsequently, as illustrated in FIGS. 10A and 10B, the second photosensitive organic material 350b is formed over an entire surface of the first substrate 301 including the first color filter layer 351, the first dummy color filter layer 801 and the protective layer 320. In such an embodiment, the second photosensitive organic material 350b has a thickness less than a thickness enough to form a planarized surface. Accordingly, as illustrated in FIGS. 10A and 10B, an upper surface of the second photosensitive organic material 350b may not be planarized. The second photosensitive organic material 350b is a photosensitive organic material of a negative type. The second photosensitive organic material 350b may include a green pigment.

Subsequently, as illustrated in FIGS. 10A and 10B, a second mask M2 is disposed on the second photosensitive organic material 350b. The second mask M2 includes a transmissive area TA through which light is transmitted and a blocking area BA through which light is blocked. In such an embodiment, the transmissive area (hereinafter, "a second transmissive area") of the second mask M2 illustrated in FIG. 10B is less than the transmissive area (hereinafter, "a first transmissive area") of the first mask M1 illustrated in FIG. 8B. In such an embodiment, the second transmissive area is a transmissive area corresponding to the second dummy color filter layer and the first transmissive area is a transmissive area corresponding to the first dummy color filter layer.

Figure 11:
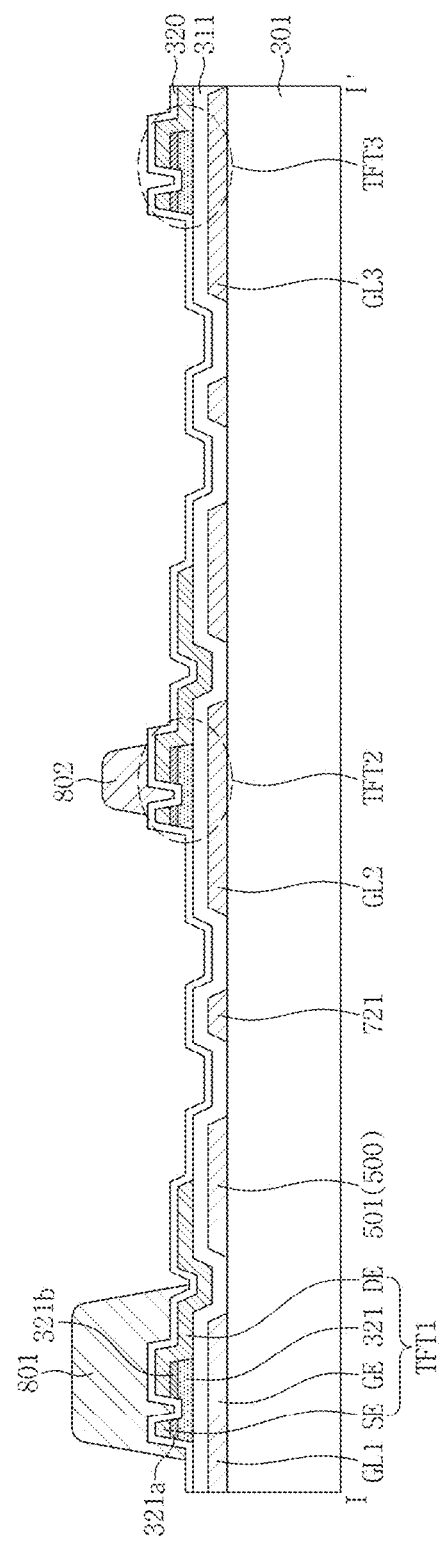

Subsequently, a light L, such as ultraviolet rays, is selectively irradiated to the second photosensitive organic material 350b through the second mask M2 such that the second photosensitive organic material 350b is exposed. When the exposed second photosensitive organic material 350b is developed, the second dummy color filter layer 802 is formed as illustrated in FIG. 11. In an exemplary embodiment, although not illustrated, when the second photosensitive organic material 350b is developed, the second color filter layer 352 is formed. In such an embodiment, the second color filter layer 351 and the second dummy color filter layer 802 are formed integrally as a single unitary and indivisible unit.

Subsequently, although not illustrated, a third photosensitive organic material is formed over an entire surface of the first substrate 301 including the first color filter layer 351, the first dummy color filter layer 801, the second color filter layer 352, the second dummy color filter layer 802 and the protective layer 320. In such an embodiment, the third photosensitive organic material has a thickness less than a thickness enough to form a planarized surface. Accordingly, an upper surface of the third photosensitive organic material may not be planarized. The third photosensitive organic material is a photosensitive organic material of a negative type. The third photosensitive organic material may include a blue pigment.

Subsequently, although not illustrated, a third mask is disposed on the third photosensitive organic material. The third mask includes a transmissive area through which light is transmitted and a blocking area through which light is blocked. In such an embodiment, the transmissive area (hereinafter, "a third transmissive area") of the third mask corresponding to the third dummy color filter layer has a substantially equal size as a size of the second transmissive area of the aforementioned second mask M2.

Figure 12:
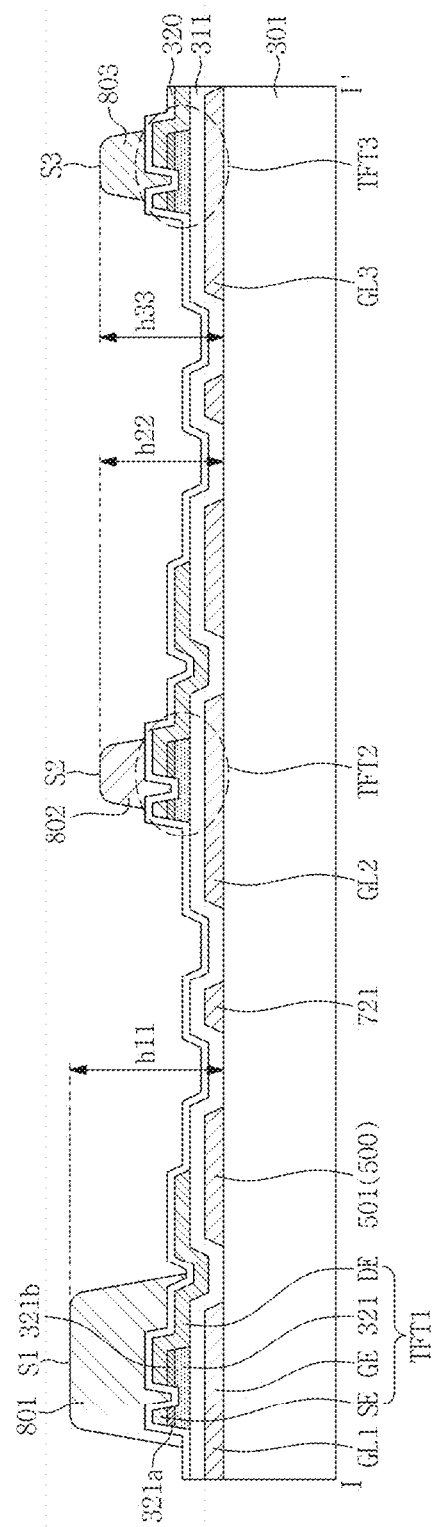

Subsequently, a light, such as ultraviolet rays, is selectively irradiated to the third photosensitive organic material through the third mask M3 such that the third photosensitive organic material is exposed. When the exposed third photosensitive organic material is developed, the third dummy color filter layer 803 is formed as illustrated in FIG. 12. In an exemplary embodiment, although not illustrated, when the third photosensitive organic material is developed, the third color filter layer 353 is formed. In such an embodiment, the third color filter layer 353 and the third dummy color filter layer 803 are formed integrally as a single unitary and indivisible unit.

The first transmissive area TA is larger than the second transmissive area TA and the third transmissive area. Accordingly, in the aforementioned exposure process, the first photosensitive organic material 350a of the first transmissive area TA is irradiated with an amount of light greater than an amount of light irradiated to the second photosensitive organic material 350b of the second transmissive area TA and an amount of light irradiated to the third photosensitive organic material of the third transmissive area. Accordingly, the opposing surface S1 of the first dummy color filter layer 801 has a larger area than the area of the opposing surface S2 of the second dummy color filter layer 802, and the opposing surface S3 of the third dummy color filter layer 803 has an area substantially equal to the area of the opposing surface S2 of the second dummy color filter layer 802. Accordingly, as illustrated in FIG. 12, the height h11 of the first dummy color filter layer 801 is greater than the height h22 of the second dummy color filter layer 802, and a height h33 of the third dummy color filter layer 803 is substantially equal to the height h22 of the second dummy color filter layer 802. In such an embodiment, as the area of a dummy color filter layer increases, the height of the dummy color filter layer increases.

In an alternative exemplary embodiment, the first transmissive area TA, the second transmissive area TA and the third transmissive area may all have a substantially equal size as one another. In such an embodiment, a relatively great amount of light may be irradiated to the first transmissive area through a local exposure method. In one exemplary embodiment, for example, a relatively great amount of light may be selectively irradiated only to a portion corresponding to the first dummy color filter layer 801 through the local exposure method. Accordingly, in such an embodiment, the first dummy color filter layer 801 may be irradiated with an amount of light greater than an amount of light irradiated to the second dummy color filter layer 802 and an amount of light irradiated to the third dummy color filter layer 803. In such an embodiment, the first dummy color filter layer 801 has a larger area than the area of the second dummy color filter layer 802 and the area of the third dummy color filter layer 803.

Figure 13A:
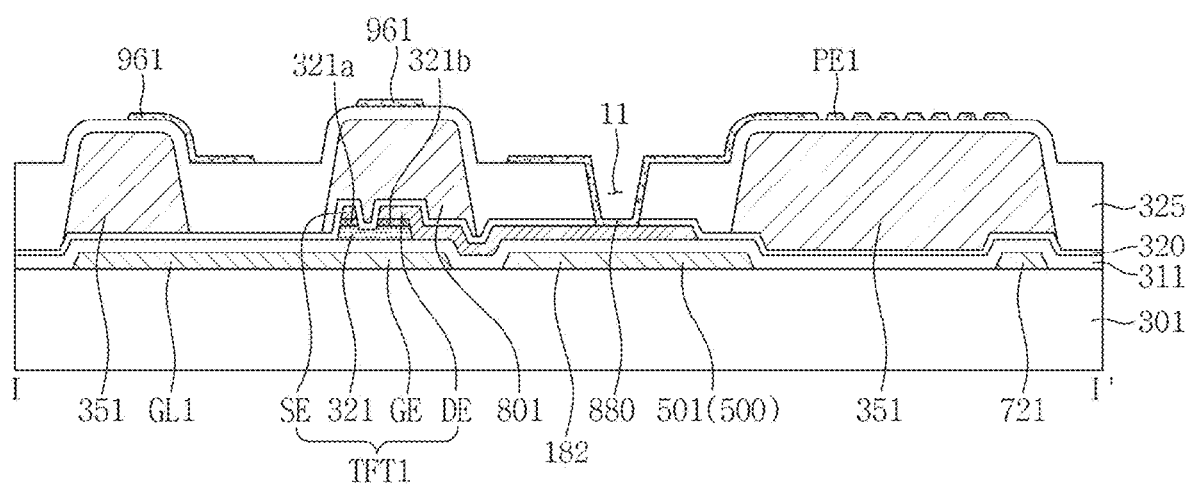
Figure 13B:
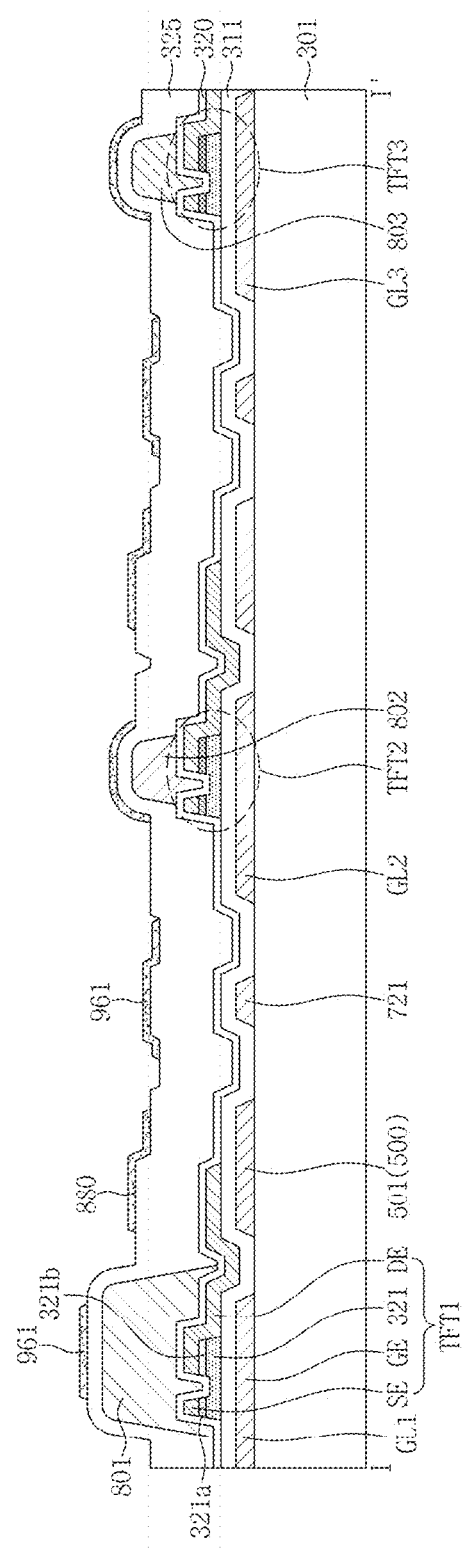

Subsequently, as illustrated in FIGS. 13A and 13B, the insulating interlayer 325 is deposited over an entire surface of the first substrate 301 including the protective layer 320, the first color filter layer 351, the second color filter layer 352, the third color filter layer 353, the first dummy color filter layer 801, the second dummy color filter layer 802 and the third dummy color filter layer 803.

The insulating interlayer 325 may include a material used for the manufacturing of the aforementioned protective layer 320. In one exemplary embodiment, for example, the insulating interlayer 325 may include a photosensitive organic material of a negative type. In such an embodiment, the photosensitive organic material has a thickness less than a thickness enough to form a planarized surface. Accordingly, as illustrated in FIGS. 13A and 13B, an upper surface of the insulating interlayer 325 is not planarized.

Subsequently, the drain contact hole 11 to expose the drain electrode DE is form through the insulating interlayer 325 and the protective layer 320 using a photolithography process.

Subsequently, although not illustrated, a transparent metal layer is deposited over an entire surface of the first substrate 301 including the insulating interlayer 325.

Subsequently, as the transparent metal layer is patterned through a photolithography process, the connection electrode 880, the pixel electrode PE1 and the shielding electrode 961 are formed on the insulating interlayer 325 as illustrated in FIGS. 13A and 13B. In such an embodiment, the connection electrode 880 is connected to the drain electrode DE through the drain contact hole 11.

The transparent metal layer may include a material used for the manufacturing of the aforementioned pixel electrode.

Figure 14A:
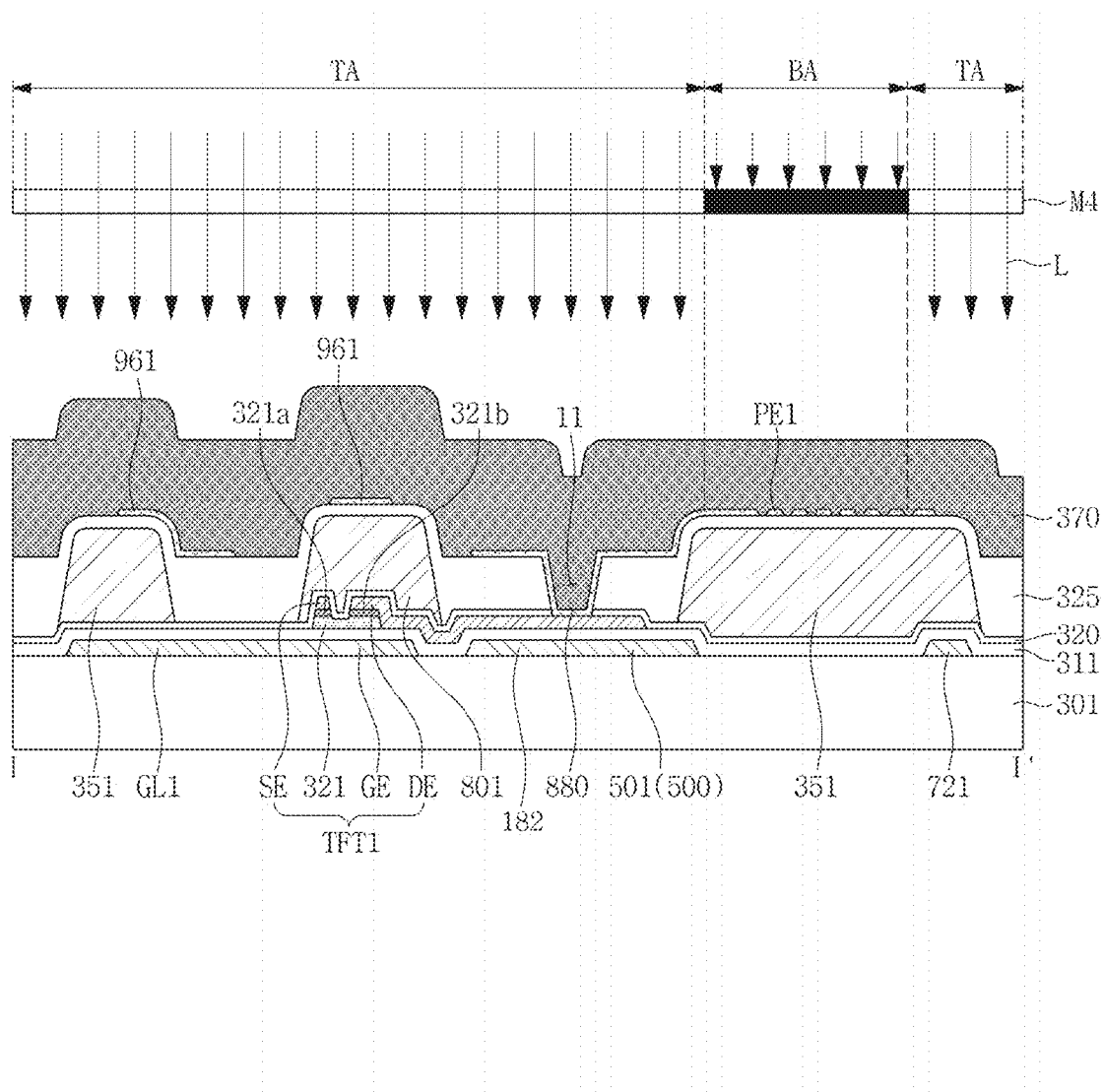
Figure 14B:
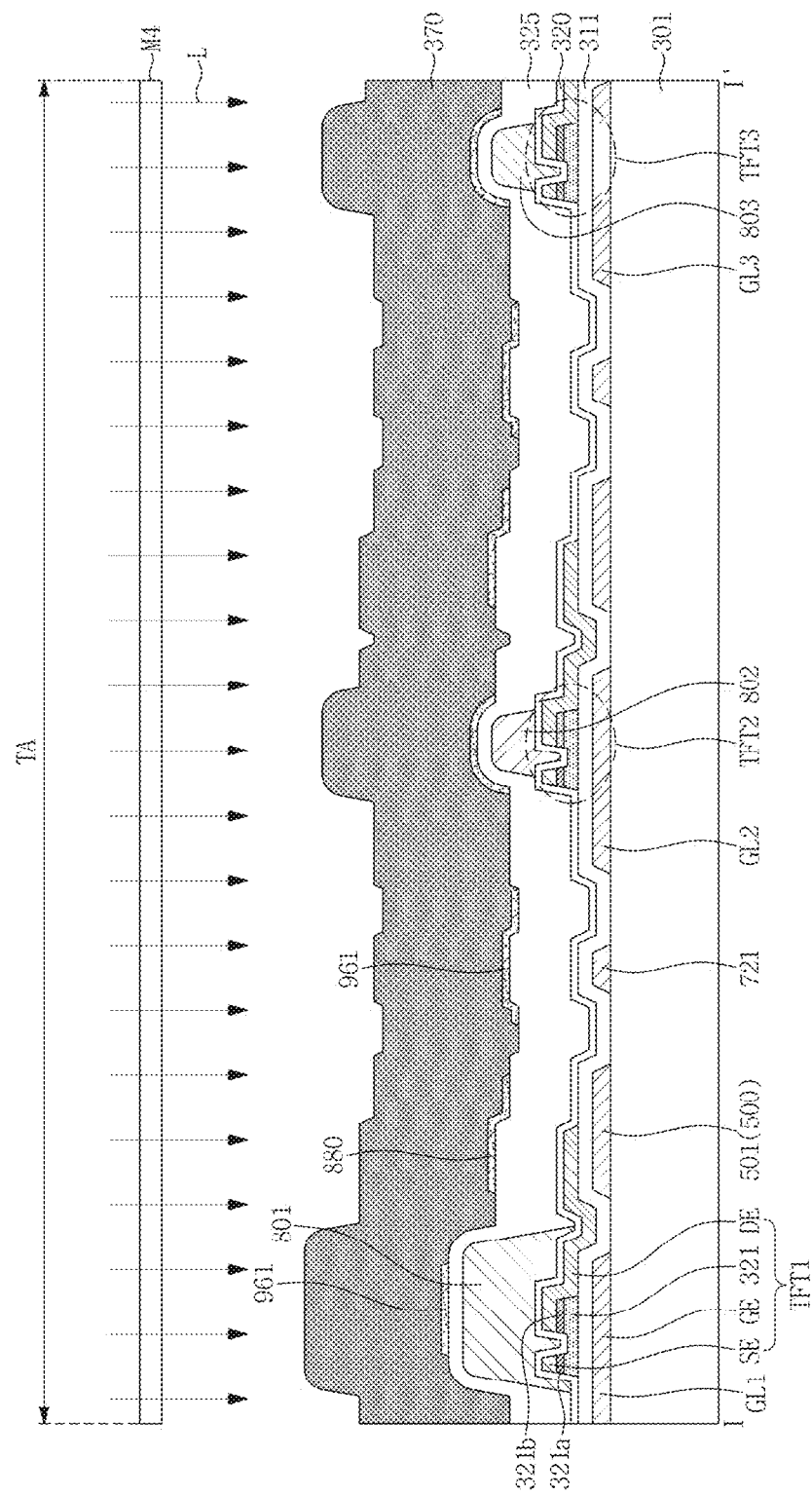

Subsequently, as illustrated in FIGS. 14A and 14B, a fourth photosensitive organic material 370 is formed over an entire surface of the first substrate 301 including the insulating interlayer 325, the connection electrode 880, the pixel electrode PE1 and the shielding electrode 961. In such an embodiment, the fourth photosensitive organic material 370 has a thickness than a less thickness enough to form a planarized surface. Accordingly, an upper surface of the fourth photosensitive organic material 370 may not be planarized as illustrated in FIGS. 14A and 14B. The fourth photosensitive organic material 370 is a photosensitive organic material of a negative type and may include a black pigment.

Figure 15A:
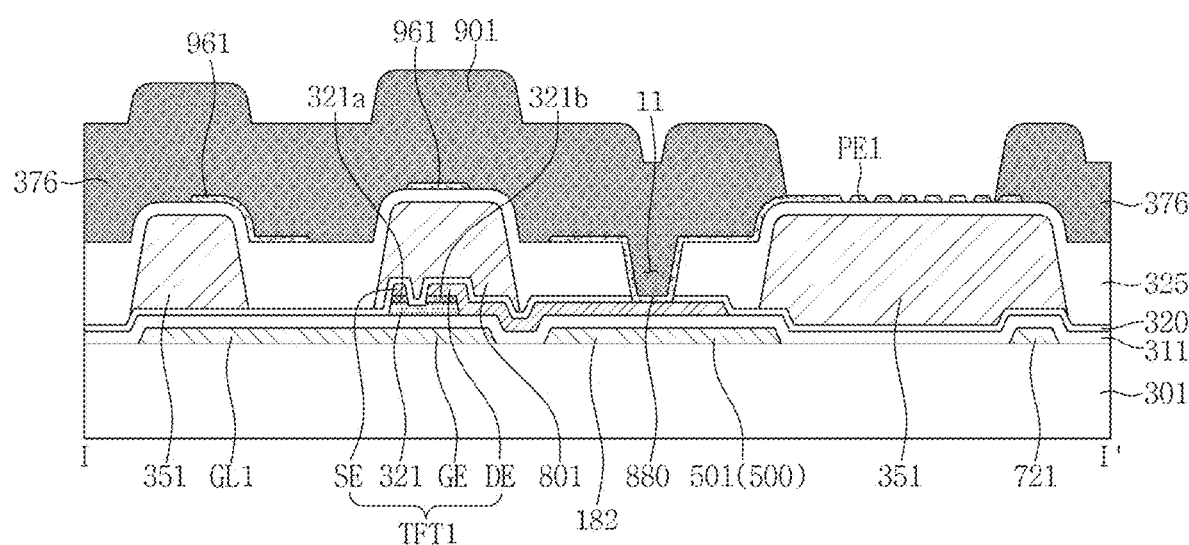
Figure 15B:
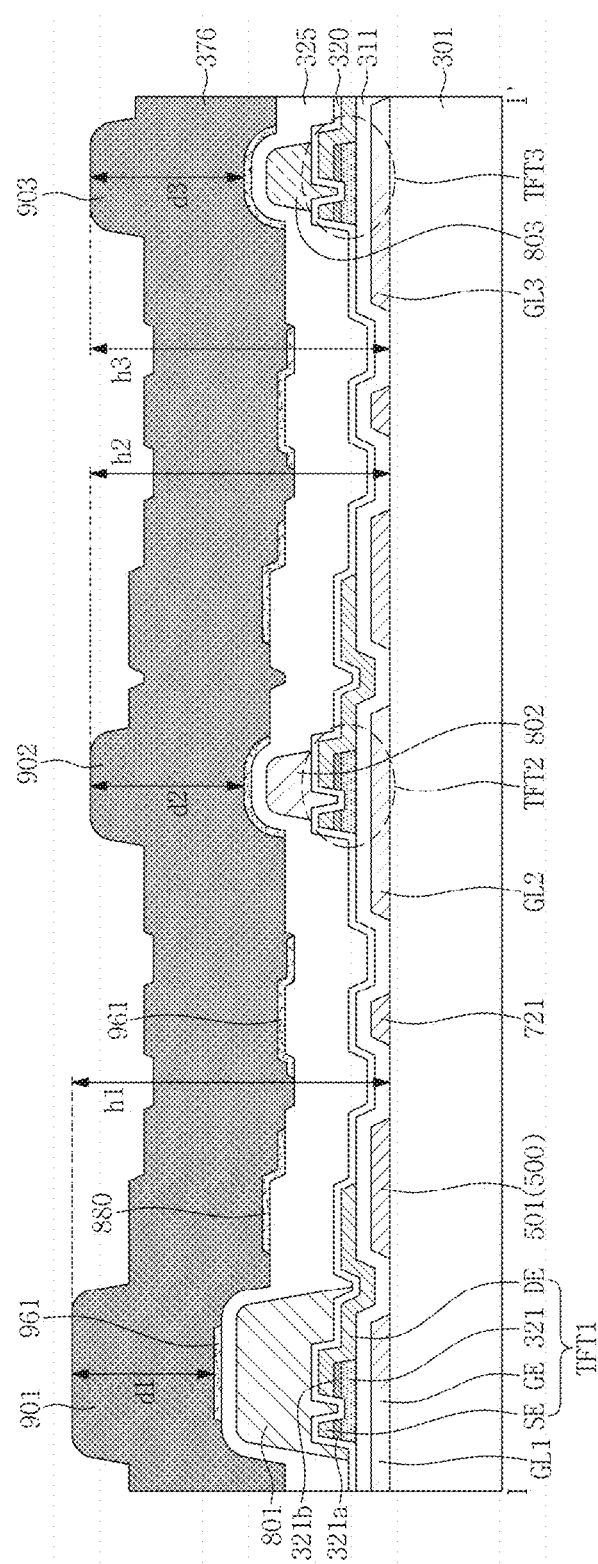

Subsequently, as illustrated in FIGS. 15A and 15B, a fourth mask M4 is disposed on the fourth photosensitive organic material 370. The fourth mask M4 includes a transmissive area TA through which light is transmitted and a blocking area BA through which light is blocked.

Subsequently, a light L, such as ultraviolet rays, is selectively irradiated to the fourth photosensitive organic material 370 through the fourth mask M4 such that the fourth photosensitive organic material 370 is exposed. When the exposed fourth photosensitive organic material 370 is developed, the light blocking layer 376, the first column spacer 901, the second column spacer 902 and the third column spacer 903 are formed as illustrated in FIGS. 15A and 15B.

The light blocking layer 376, the first column spacer 901, the second column spacer 902 and the third column spacer 903 are exposed by a substantially equal amount of light during a manufacturing process thereof.

The first column spacer 901 is located on the first dummy color filter layer 801, the second column spacer 902 is located on the second dummy color filter layer 802 and the third column spacer 903 is located on the third dummy color filter layer 803. In such an embodiment, the light blocking layer 376, the first column spacer 901, the second column spacer 902 and the third column spacer 903 are formed integrally as a single unitary and indivisible unit.

In an exemplary embodiment, as described above, as the height h11 of the first dummy color filter layer 801 is greater than the height h22 of the second dummy color filter layer 802, the height h1 of the first column spacer 901 on the first dummy color filter layer 801 is greater than the height h2 of the second column spacer 902 located on the second dummy color filter layer 802.

In an exemplary embodiment, as the third dummy color filter layer 803 has an area substantially equal to an area of the second dummy color filter layer 802, the height h3 of the third column spacer 903 located on the third dummy color filter layer 803 is substantially equal to the height h2 of the second column spacer 902.

Figure 16:
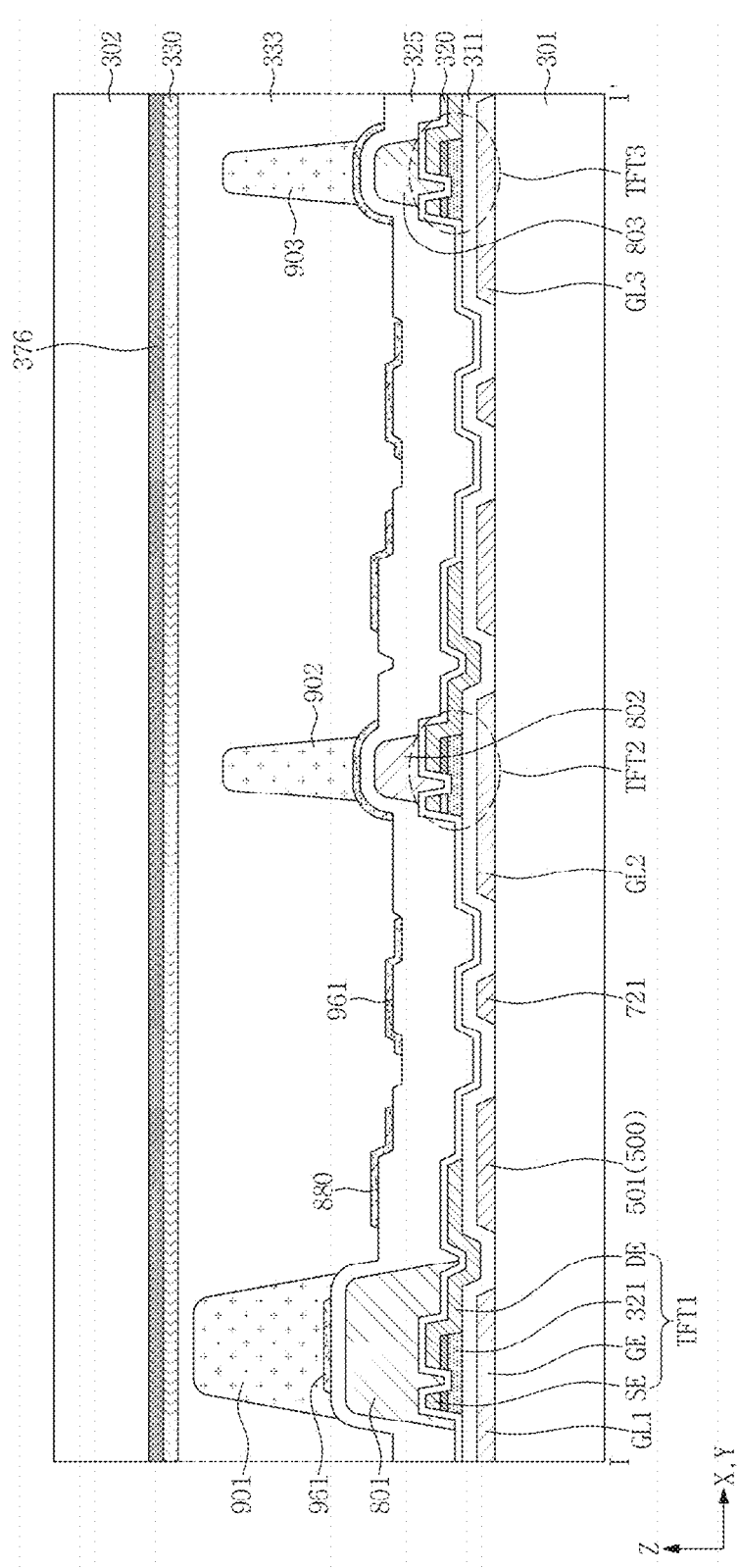
FIG. 16 is a cross-sectional view taken along line I-I' of FIG. 4 according to an alternative exemplary embodiment.

FIG. 16 is a cross-sectional view taken along line I-I' of FIG. 4 according to an alternative exemplary embodiment.

As illustrated in FIG. 16, a first column spacer 901, a second column spacer 902 and a third column spacer 903 may be located on an insulating interlayer 325. In one exemplary embodiment, for example, the first column spacer 901 may be located on the insulating interlayer 325 to overlap a first dummy color filter layer 801, the second column spacer 902 may be located on the insulating interlayer 325 to overlap a second dummy color filter layer 802, and the third column spacer 903 may be located on the insulating interlayer 325 to overlap a third dummy color filter layer 803.

In such an embodiment, the first dummy color filter layer 801, the second dummy color filter layer 802 and the third dummy color filter layer 803 of FIG. 16 are substantially the same as those described above with reference to FIGS. 1, 2, 3, 4, 5 and 6, and any repetitive detailed description thereof will be omitted.

At least one of the first column spacer 901, the second column spacer 902 and the third column spacer 903 in FIG. 16 may include a transparent material. In one exemplary embodiment, for example, each of the first column spacer 901, the second column spacer 902 and the third column spacer 903 may be a column spacer including a transparent material.

In an exemplary embodiment, as illustrated in FIG. 16, a light blocking layer 376 may be located on a second substrate 302. In one exemplary embodiment, for example, the light blocking layer 376 may be located between the second substrate 302 and a common electrode 330. In such an embodiment, the light blocking layer 376 of FIG. 16 may have a substantially same shape as the aforementioned light blocking layer 376 of FIG. 1 when viewed from a plan view, e.g., a top plan view.

The light blocking layer 376 of FIG. 16 may include a material different from a material included in each of the column spacer 901. In one exemplary embodiment, for example, the light blocking layer 376 may include an opaque photosensitive organic material, and each of the column spacer 901 may include a transparent photosensitive organic material.

Figure 17:
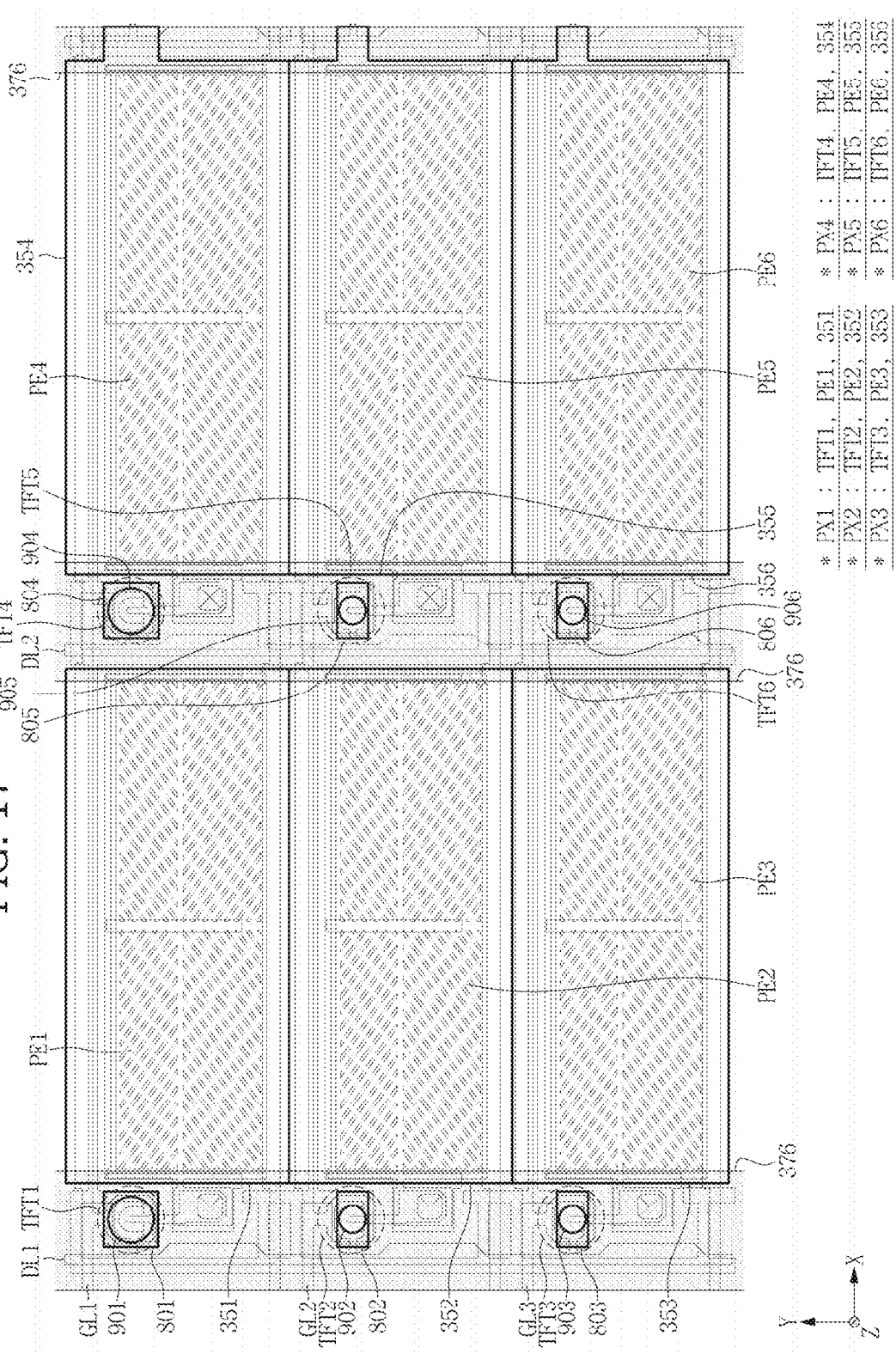
FIG. 17 is a plan view illustrating a display device including a plurality of pixels of FIG. 1 according to an alternative exemplary embodiment.
Figure 18:
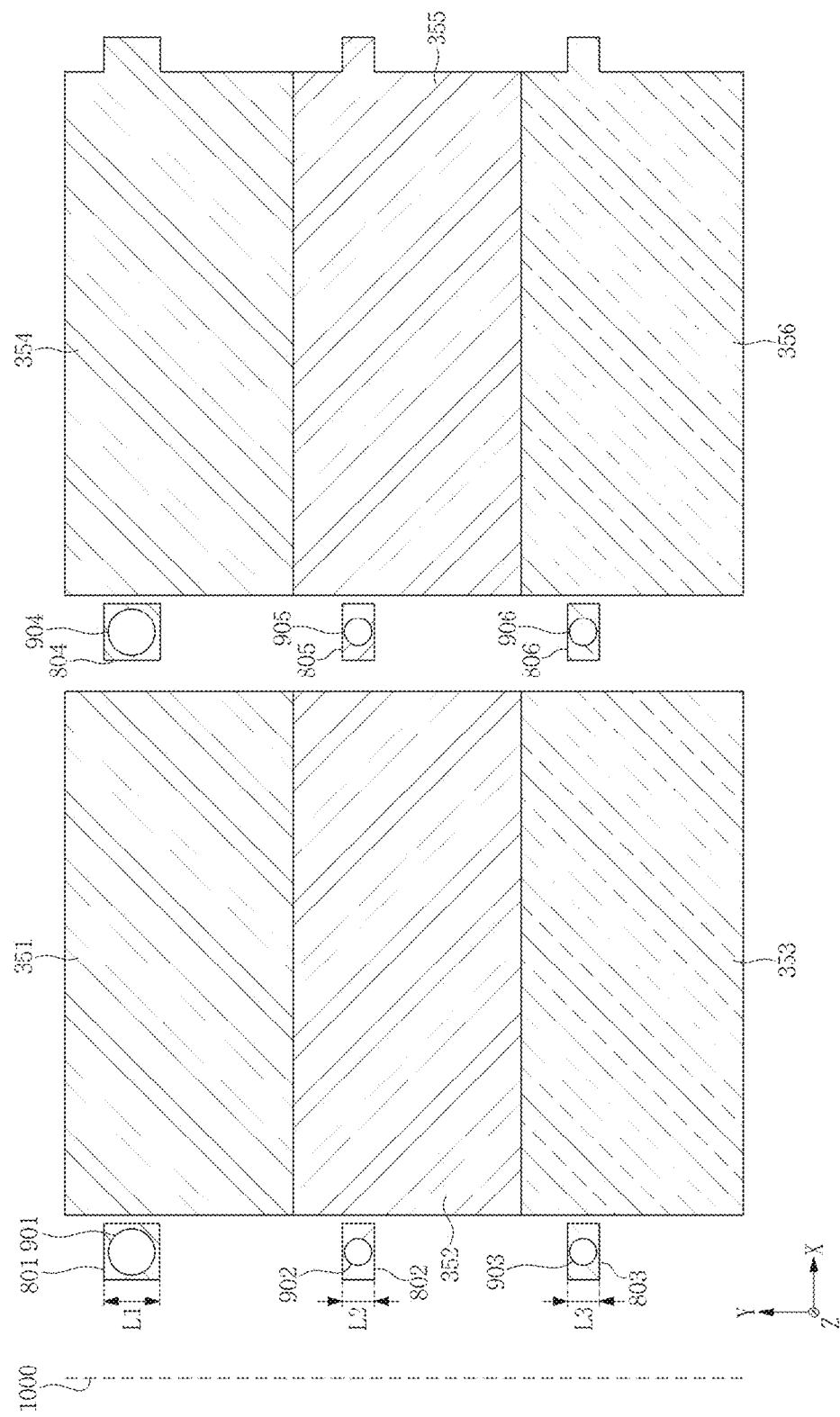
FIG. 18 is a view illustrating first, second, third, fourth, fifth and sixth color filter layers and first, second, third, fourth, fifth and sixth dummy color filter layers of FIG. 17.

FIG. 17 is a plan view illustrating a display device including a plurality of pixels of FIG. 1 according to an alternative exemplary embodiment, and FIG. 18 is a view illustrating first, second, third, fourth, fifth and sixth color filter layers and first, second, third, fourth, fifth and sixth dummy color filter layers of FIG. 17.

In an exemplary embodiment, as illustrated in FIGS. 17 and 18, a first dummy color filter layer 801 is located between an edge 1000 of a first substrate 301 and a first color filter layer 351, a second dummy color filter layer 802 is located between the edge 1000 of the first substrate 301 and a second color filter layer 352, and a third dummy color filter layer 803 is located between the edge 1000 of the first substrate 301 and a third color filter layer 353. In such an embodiment, a fourth dummy color filter layer 804 is located between the first color filter layer 351 and the fourth color filter layer 354 that are adjacent to each other in the X-axis direction and have a substantially same color, a fifth dummy color filter layer 805 is located between the second color filter layer 352 and a fifth color filter layer 355 that are adjacent to each other in the X-axis direction and have a substantially same color, and the sixth dummy color filter layer 806 is located between the third color filter layer 353 and a sixth color filter layer 356 that are adjacent to each other in the X-axis direction and have a substantially same color.

In such an embodiment, the first, second, third, fourth, fifth and sixth dummy color filter layers 801, 802, 803, 804, 805 and 806 are not connected to the color filter layer. In such an embodiment, the first, second, third, fourth, fifth and sixth dummy color filter layers 801, 802, 803, 804, 805 and 806 have a shape separated and spaced apart from the color filter layer.

In an alternative exemplary embodiment, at least one of the first, second, third, fourth, fifth and sixth dummy color filter layers 801, 802, 803, 804, 805 and 806 may be connected to one of color filter layers that is disposed adjacent thereto and has a substantially same color as the one of color filter layers. In such an embodiment, at least one of the first, second, third, fourth, fifth and sixth dummy color filter layers 801, 802, 803, 804, 805 and 806 may be formed integrally as a single unitary and indivisible unit with a color filter layer that is adjacent thereto and has a substantially same color as the color filter. In one exemplary embodiment, for example, the fourth dummy color filter layer 804 between the first color filter layer 351 and the fourth color filter layer 354 may be connected to either the first color filter layer 351 or the fourth color filter layer 354.

In FIGS. 17 and 18, an area of the first dummy color filter layer 801 is larger than an area of the second dummy color filter layer 802, and an area of the third dummy color filter layer 803 is substantially equal to the area of the second dummy color filter layer 802.

In an exemplary embodiment, where an area of the dummy color filter layer having a separated shape is considerably small, the adhesion between the dummy color filter layer and the protective layer 320 may be reduced, and the dummy color filter layer may be detached from the protective layer 320 during the manufacturing process. In such an embodiment, at least a part of the dummy color filter may be connected to the color filter layer when the area of the dummy color filter layer is considerably small to prevent the detachment of the dummy color filter layer from the protective layer 320.

Figure 19:
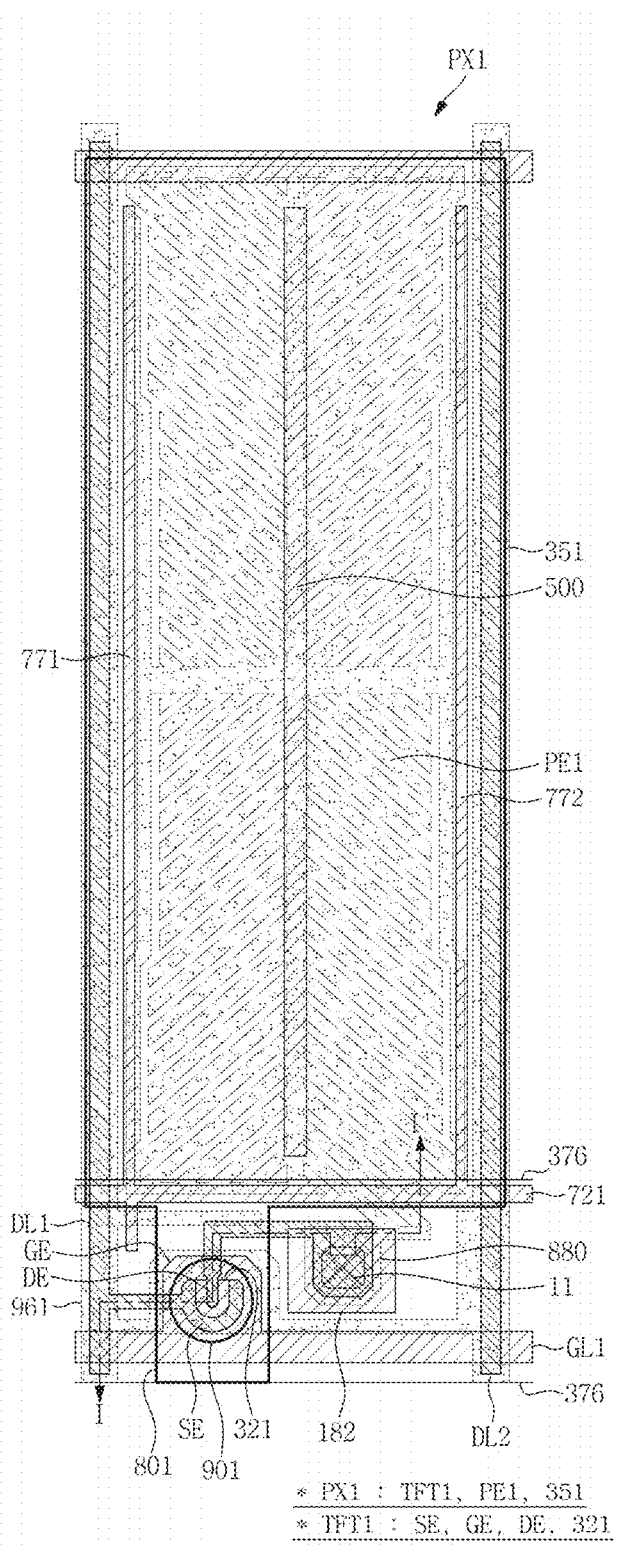
FIG. 19 is a view illustrating a pixel included in a display device according to an alternative exemplary embodiment.
Figure 20:
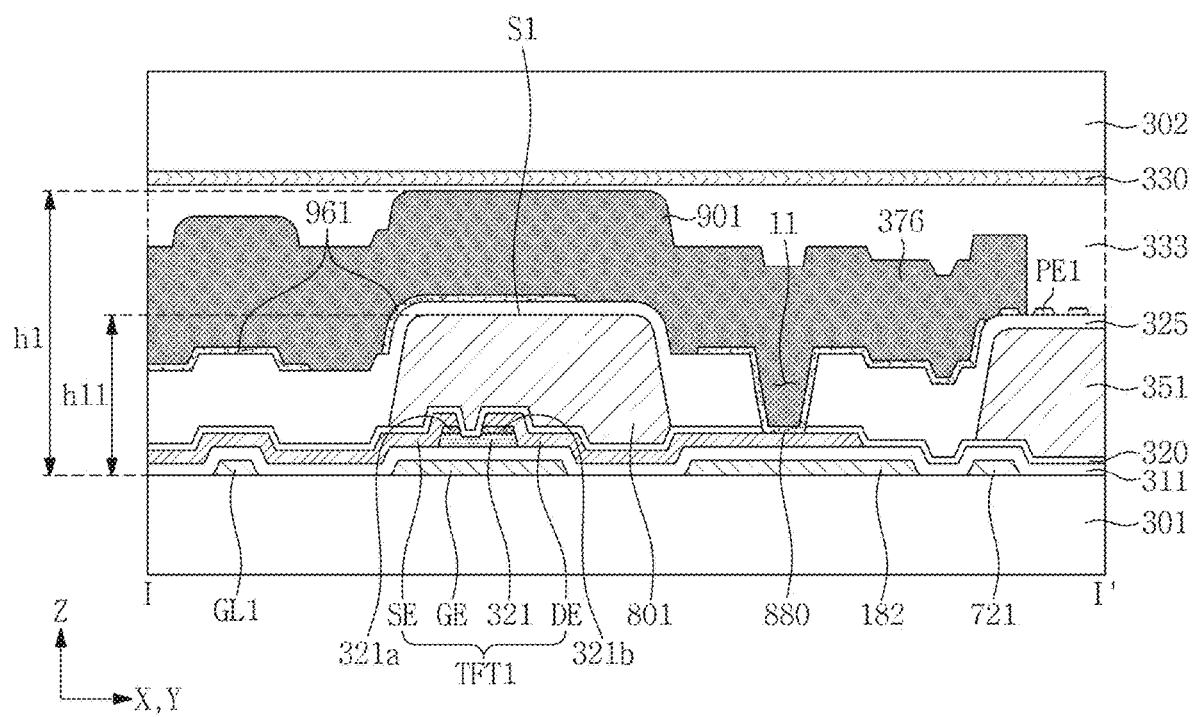
FIG. 20 is a cross-sectional view taken along line I-I' of FIG. 19.

FIG. 19 is a view illustrating a pixel included in a display device according to an alternative exemplary embodiment, and FIG. 20 is a cross-sectional view taken along line I-I' of FIG. 19.

In an exemplary embodiment, as illustrated in FIGS. 19 and 20, a pixel PX1 includes a switching element TFT1, a pixel electrode PE1 and a color filter layer 351.

The switching element TFT1 includes a semiconductor layer 321, a gate electrode GE, a source electrode SE and a drain electrode DE. The gate electrode GE is connected to a gate line GL1, the source electrode SE is connected to a data line DL1, and the drain electrode DE is connected to the pixel electrode PE1.

The pixel PX1 is located between a first substrate 301 and a second substrate 302. In such an embodiment, as illustrated in FIG. 20, the display device includes the first substrate 301 and the second substrate 302 spaced apart from each other by a predetermined distance, and the switching element TFT1, the pixel electrode PE1 and the color filter layer 351 are located between the first substrate 301 and the second substrate 302.

In such an embodiment, the gate line GL1, a sustain line 721, a first sustain electrode 771, a second sustain electrode 772, a pre-tilt control layer 500, a light blocking film 182, a gate insulating layer 311, the data line DL1, a protective layer 320, a dummy color filter layer 801, an insulating interlayer 325, a light blocking layer 376, a column spacer 901, a liquid crystal layer 333 and a common electrode 330 are located between the first substrate 301 and the second substrate 302.

In such an embodiment, as illustrated in FIG. 19, the first sustain electrode 771 and the second sustain electrode 772 have a shape protruding from the sustain line 721. The first sustain electrode 771 and the second sustain electrode 772 may have a bar shape protruding from the sustain line 721 in the Y-axis direction.

The second sustain electrode 772 may be parallel to the first sustain electrode 771. The first sustain electrode 771 and the second sustain electrode 772 may have a substantially same length as each other or may have different lengths from each other. Herein, respective lengths of the first sustain electrode 771 and the second sustain electrode 772 mean respective lengths of the first sustain electrode 771 and the second sustain electrode 772 measured in the Y-axis direction. The first sustain electrode 771, the second sustain electrode 772 and the sustain line 721 may be formed integrally as a single unitary and indivisible unit.

Each of the first sustain electrode 771 and the second sustain electrode 772 may overlap an edge of the pixel electrode PE1. In one exemplary embodiment, for example, the first sustain electrode 771 overlaps one edge of the pixel electrode PE1 adjacent to the data line DL1 connected to the pixel PX1, and the second sustain electrode 772 overlaps another edge of the pixel electrode PE1 facing the one edge of the pixel electrode PE1. The another edge of the pixel electrode PE1 is adjacent to a data line DL2 connected to another pixel.

In an alternative exemplary embodiment, the first sustain electrode 771 may be located between the data line DL1 connected to the pixel PX1 and the pixel electrode PE1 of the pixel PX1, while not overlapping the pixel electrode PE1 of the pixel PX1. In such an embodiment, the second sustain electrode 772 may be located between the data line DL2 connected to the another pixel and the pixel electrode PE1 of the pixel PX1, while not overlapping the pixel electrode PE1 of the pixel PX1.

The pre-tilt control layer 500 of FIG. 19 is located between the first sustain electrode 771 and the second sustain electrode 772. The pre-tilt control layer 500 may have a bar shape extending in the Y-axis direction in parallel with the first sustain electrode 771.

In an exemplary embodiment, as illustrated in FIGS. 19 and 20, the light blocking layer 376 intersects the data line DL1. In such an embodiment, as illustrated in FIG. 19, the light blocking layer 376 overlaps the switching element TFT1, the gate line GL1, the sustain line 721 and a drain contact hole 11. In such an embodiment, the light blocking layer 376 may further overlap a part of the pixel electrode PE1, a part of a shielding electrode 961 and a connection electrode 880. In one exemplary embodiment, for example, as illustrated in FIG. 19, the light blocking layer 376 may overlap at least one of edges of the pixel electrode PE1 adjacent to the sustain line 721 and the gate line GL1. As illustrated in FIG. 20, the light blocking layer 376 is located on the protective layer 320, the pixel electrode PE1 and the shielding electrode 961.

The light blocking layer 376 may include a photosensitive organic material. In such an embodiment, the photosensitive organic material may be a photosensitive organic material of a positive type or a negative type.

In such an embodiment, the switching element TFT1, the semiconductor layer 321, the gate electrode GE, the source electrode SE, the drain electrode DE, the gate line GL1, the data line DL1, the sustain line 721, the gate insulating layer 311, the protective layer 320, the color filter layer 351, the dummy color filter layer 801, the insulating interlayer 325, the column spacer 901, the liquid crystal layer 333 and the common electrode 330 are substantially the same as those described above with reference to FIGS. 1 and 2, and any repetitive detailed description thereof will be omitted.

Figure 21:
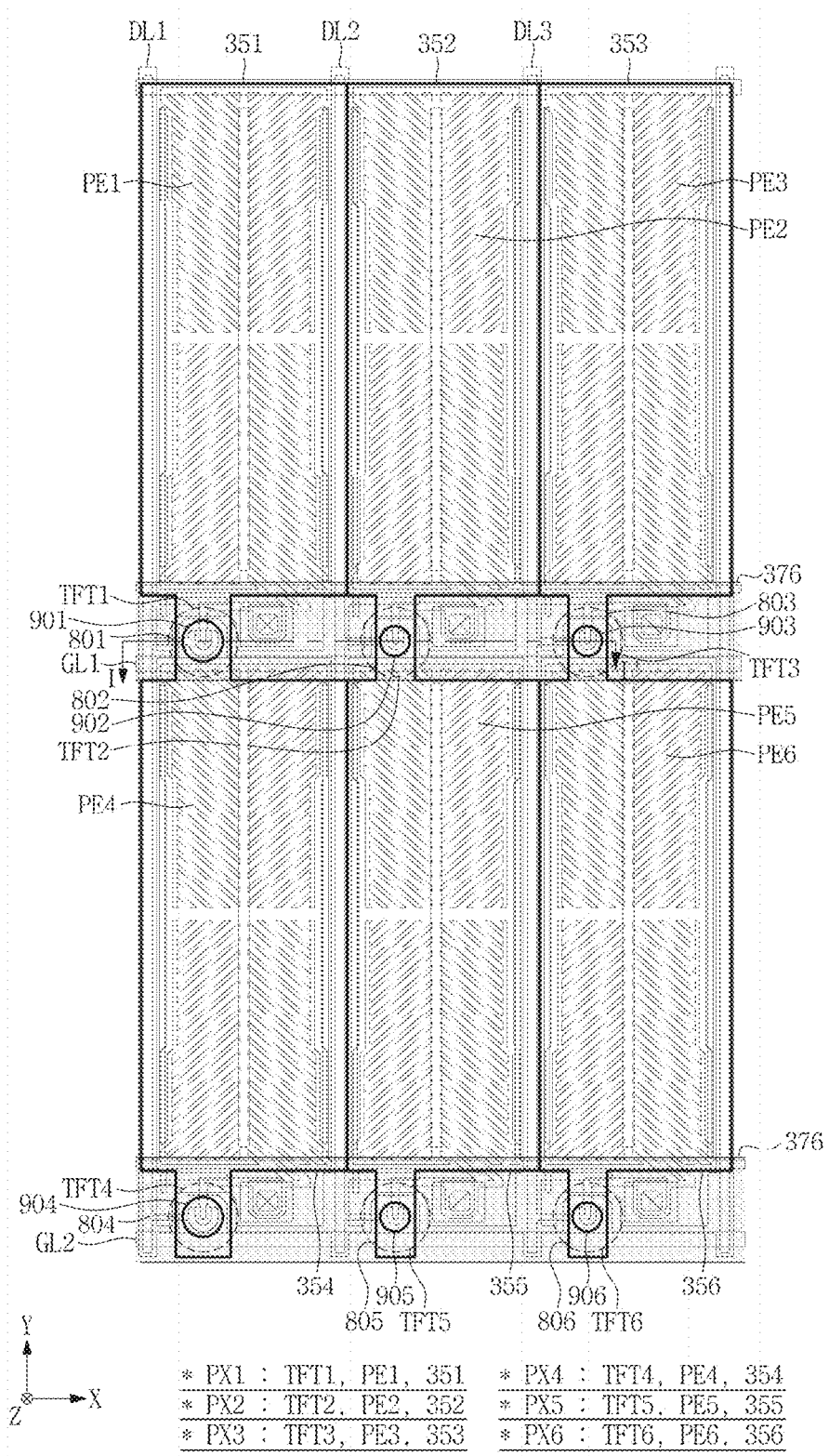
FIG. 21 is a plan view illustrating a display device according to an exemplary embodiment including a plurality of pixels having a structure illustrated in FIG. 19.
Figure 22:
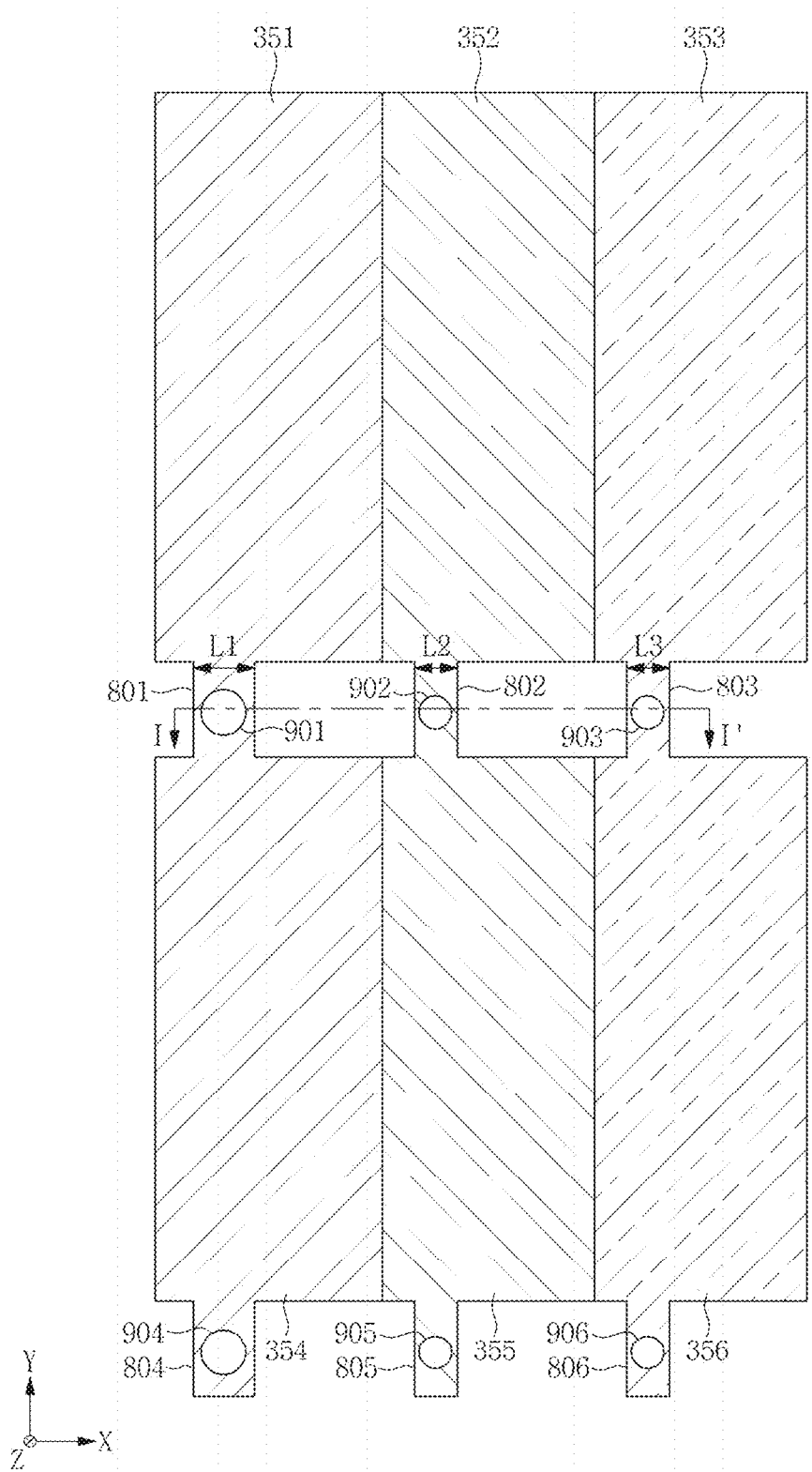
FIG. 22 is a view illustrating first, second, third, fourth, fifth and sixth color filter layers and first, second, third, fourth, fifth and sixth dummy color filter layers of FIG. 21.
Figure 23:
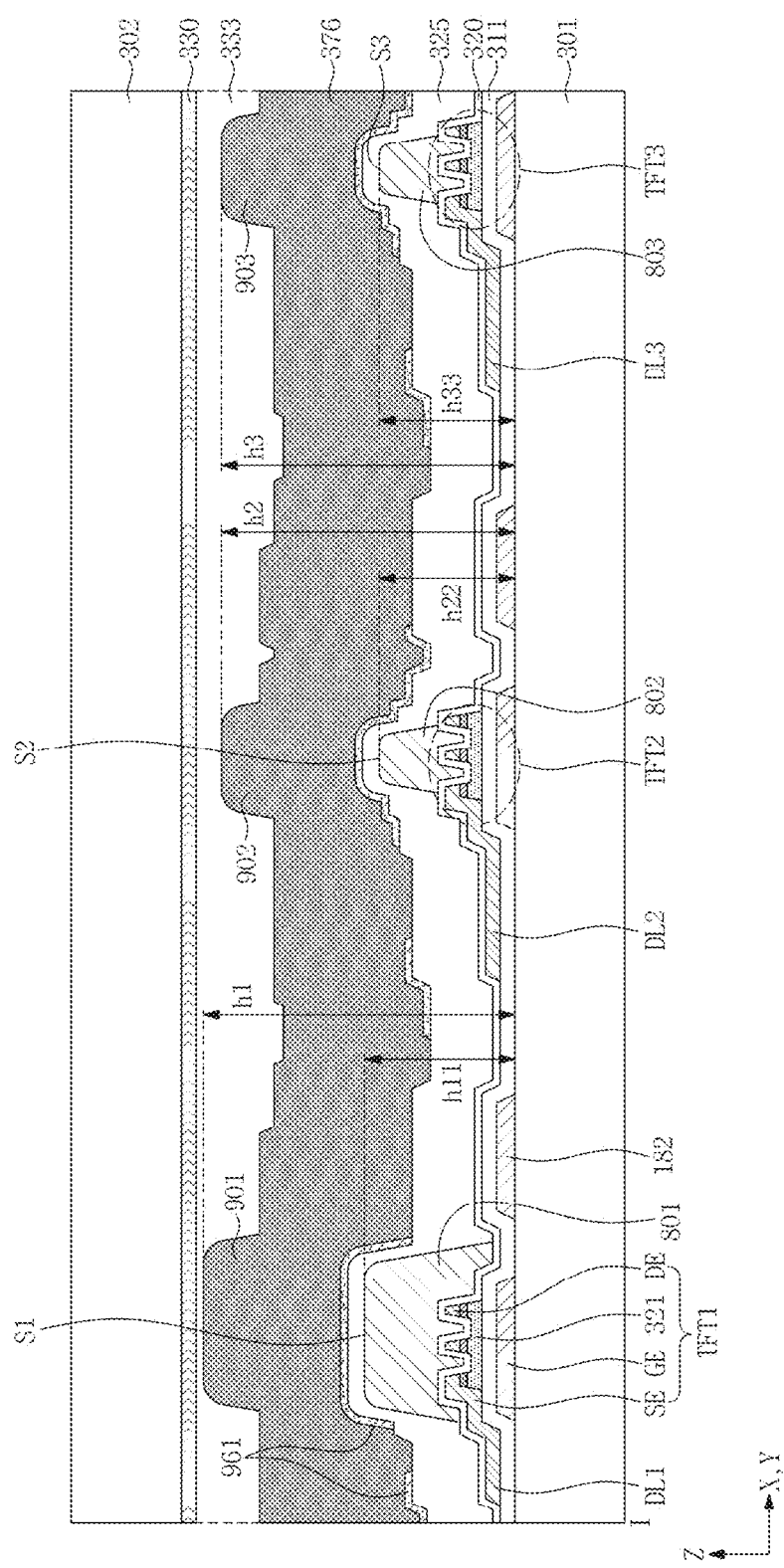
FIG. 23 is a cross-sectional view according to an exemplary embodiment taken along line I-I' of FIG. 21.

FIG. 21 is a plan view illustrating a display device according to an exemplary embodiment including a plurality of pixels having a structure illustrated in FIG. 19, FIG. 22 is a view illustrating first, second, third, fourth, fifth and sixth color filter layers and first, second, third, fourth, fifth and sixth dummy color filter layers of FIG. 21, and FIG. 23 is a cross-sectional view according to an exemplary embodiment taken along line I-I' of FIG. 21.

In an exemplary embodiment, as illustrated in FIG. 21, the display device includes a plurality of pixels. In one exemplary embodiment, for example, a display device includes six pixels PX1, PX2, PX3, PX4, PX5 and PX6, as shown in FIG. 21. Each of the pixels PX1, PX2, PX3, PX4, PX5 and PX6 in FIG. 21 has a substantially same structure as the pixel PX1 described above with reference to FIG. 19.

The six pixels PX1, PX2, PX3, PX4, PX5 and PX6 are connected to three gate lines GL1, GL and GL3 and three data lines DL1, DL2 and DL3. In one exemplary embodiment, for example, a first pixel PX1, a second pixel PX2 and a third pixel PX3 adjacent to each other in the X-axis direction are commonly connected to a first gate line GL1, and a fourth pixel PX4, a fifth pixel PX5 and a sixth pixel PX6 adjacent to each other in the X-axis direction are commonly connected to a second gate line GL2. In an exemplary embodiment, the first pixel PX1 and the fourth pixel PX4 adjacent to each other in the Y-axis direction are commonly connected to a first data line DL1, the second pixel PX2 and the fifth pixel PX5 adjacent to each other in the Y-axis direction are commonly connected to a second data line DL2, and the third pixel PX3 and the sixth pixel PX6 adjacent to each other in the Y-axis direction are commonly connected to a third data line DL3.

In such an embodiment, the first pixel PX1 is connected to the first gate line GL1 and the first data line DL1, the second pixel PX2 is connected to the first gate line GL1 and the second data line DL2, the third pixel PX3 is connected to the first gate line GL1 and the third data line DL3, the fourth pixel PX4 is connected to the second gate line GL2 and the first data line DL1, the fifth pixel PX5 is connected to the second gate line GL2 and the second data line DL2, and the sixth pixel PX6 is connected to the second gate line GL2 and the third data line DL3.

In such an embodiment, the first pixel PX1 includes a first switching element TFT1, a first pixel electrode PE1 and a first color filter layer 351, the second pixel PX2 includes a second switching element TFT2, a second pixel electrode PE2 and a second color filter layer 352, and the third pixel PX3 includes a third switching element TFT3, a third pixel electrode PE3 and a third color filter layer 353. In such an embodiment, the fourth pixel PX4 includes a fourth switching element TFT4, a fourth pixel electrode PE4 and a fourth color filter layer 354, the fifth pixel PX5 includes a fifth switching element TFT5, a fifth pixel electrode PE5 and a fifth color filter layer 355, and the sixth pixel PX6 includes a sixth switching element TFT6, a sixth pixel electrode PE6 and a sixth color filter layer 356.

In an exemplary embodiment, color filter layers adjacent to one another in the Y-axis direction have a substantially same color as one another. In one exemplary embodiment, for example, as illustrated in FIG. 22, the first color filter layer 351 may have a substantially same color as the fourth color filter layer 354, the second color filter layer 352 may have a substantially same color as the fifth color filter layer 355, and the third color filter layer 353 may have a substantially same color as the sixth color filter layer 356.

In an alternative exemplary embodiment, color filter layers adjacent to one another in the X-axis direction have different colors from one another. In one exemplary embodiment, for example, as illustrated in FIG. 22, the first color filter layer 351, the second color filter layer 352 and the third color filter layer 353 have different colors from one another, and the fourth color filter layer 354, the fifth color filter layer 355 and the sixth color filter layer 356 have different colors from one another.

In one exemplary embodiment, for example, each of the first color filter layer 351 and the fourth color filter layer 354 may have a red color, each of the second color filter layer 352 and the fifth color filter layer 355 may have a green color, and each of the third color filter layer 353 and the sixth color filter layer 356 may have a blue color.

In an exemplary embodiment, as illustrated in FIG. 21, a first dummy color filter layer 801 overlaps the first switching element TFT1, a second dummy color filter layer 802 overlaps the second switching element TFT2, a third dummy color filter layer 803 overlaps the third switching element TFT3, a fourth dummy color filter layer 804 overlaps the fourth switching element TFT4, a fifth dummy color filter layer 805 overlaps the fifth switching element TFT5, and a sixth dummy color filter layer 806 overlaps the sixth switching element TFT6.

In an exemplary embodiment, as illustrated in FIG. 22, the first dummy color filter layer 801 is located between the first color filter layer 351 and the fourth color filter layer 354 which are adjacent to each other in the Y-axis direction and have a substantially same color as each other, the second dummy color filter layer 802 is located between the second color filter layer 352 and the fifth color filter layer 355 which are adjacent to each other in the Y-axis direction and have a substantially same color as each other, and the third dummy color filter layer 803 is located between the third color filter layer 353 and the sixth color filter layer 356 which are adjacent to each other in the Y-axis direction and have a substantially same color as each other. In such an embodiment, the fourth dummy color filter layer 804 is located between the fourth color filter layer 354 and a seventh color filter layer (not illustrated) which are adjacent to each other in the Y-axis direction and have a substantially same color as each other, the fifth dummy color filter layer 805 is located between the fifth color filter layer 355 and an eighth color filter layer (not illustrated) which are adjacent to each other in the Y-axis direction and have a substantially same color as each other, and the sixth dummy color filter layer 806 is located between the sixth color filter layer 356 and a ninth color filter layer (not illustrated) which are adjacent to each other in the Y-axis direction and have a substantially same color as each other.

The first dummy color filter layer 801 may have a substantially same color as the first color filter layer 351 adjacent thereto, the second dummy color filter layer 802 may have a substantially same color as the second color filter layer 352 adjacent thereto, the third dummy color filter layer 803 may have a substantially same color as the third color filter layer 353 adjacent thereto, the fourth dummy color filter layer 804 may have a substantially same color as the fourth color filter layer 354 adjacent thereto, the fifth dummy color filter layer 805 may have a substantially same color as the fifth color filter layer 355 adjacent thereto, and the sixth dummy color filter layer 806 may have a substantially same color as the sixth color filter layer 356 adjacent thereto.

In an exemplary embodiment, as shown in FIG. 22, a color filter and a dummy color filter that have a substantially same color may be formed integrally as a single unitary and indivisible unit. In one exemplary embodiment, for example, as illustrated in FIG. 22, the first color filter layer 351 having a red color, the first dummy color filter layer 801 having a red color, the fourth color filter layer 354 having a red color and the fourth dummy color filter layer 804 having a red color may all be formed integrally as a single unitary and indivisible unit.

In an exemplary embodiment, although not illustrated, the dummy color filter layer 801 overlapping a switching element of a pixel (hereinafter, a last pixel) connected to a gate line at a lowermost portion may be located between a color filter layer of the last pixel and an edge of the first substrate 301. In such an embodiment, a gate line at a lowermost portion may be a gate line that is driven the last during one frame period.

In such an embodiment, where the first gate line GL1 is a first gate line that is driven first during the one frame period, the gate line at a lowermost portion may be a last gate line that is driven the last during the one frame period.

In such an embodiment, each of the first, second, third, fourth, fifth and sixth switching elements TFT1, TFT2, TFT3, TFT4, TFT5 and TFT6 in FIG. 21 is substantially the same as the switching element TFT1 described above with reference to FIGS. 1 and 2, and any repetitive detailed description thereof will be omitted. In such an embodiment, each of the first, second, third, fourth, fifth and sixth pixel electrodes PE1, PE2, PE3, PE4, PE5 and PE6 in FIG. 21 is substantially the same as the pixel electrode PE1 described above with reference to FIGS. 1, 2 and 3, and any repetitive detailed description thereof will be omitted. In such an embodiment, each of the first, second, third, fourth, fifth and sixth color filter layers 351, 352, 353, 354, 355 and 356 in FIG. 21 is substantially the same as the color filter layer 351 described above with reference to FIGS. 1 and 2, and any repetitive detailed description thereof will be omitted. In such an embodiment, each of the first, second, third, fourth, fifth and sixth dummy color filter layers 801, 802, 803, 804, 805 and 806 in FIG. 21 is substantially the same as the dummy color filter layer 801 described above with reference to FIGS. 1 and 2, and any repetitive detailed description thereof will be omitted.

In an exemplary embodiment, as illustrated in FIGS. 22 and 23, an opposing surface of the first dummy color filter layer 801 has an expanded portion having a larger area than an area of an opposing surface of the second dummy color filter layer 802. Accordingly, in such an embodiment, a length L1 of one side of the first dummy color filter layer 801 may be greater than a length L2 of one side of the second dummy color filter layer 802 corresponding thereto. In an exemplary embodiment, the length L2 of one side of the second dummy color filter layer 802 may be substantially equal to a length L3 of one side of the third dummy color filter layer 803 corresponding thereto.

As the first dummy color filter layer 801 has a larger area than the area of the second dummy color filter layer 802, the first dummy color filter layer 801 has a greater height than a height of the second dummy color filter layer 802. In such an embodiment, a height h11 of the first dummy color filter layer 801 is greater than a height h22 of the second dummy color filter layer 802.

As the first dummy color filter layer 801 has a greater height than a height of the second dummy color filter layer 802, the first column spacer 901 on the first dummy color filter layer 801 has a greater height than that a height of the second column spacer 902 on the second dummy color filter layer 802. In such an embodiment, as shown in FIG. 23, a height h1 of the first column spacer 901 is greater than a height h2 of the second column spacer 902. Accordingly, a distance between a reference surface of the second substrate 302 and the first column spacer 901 is less than a distance between the reference surface of the second substrate 302 and the second column spacer 902.

In an exemplary embodiment, an opposing surface S3 of the third dummy color filter layer 803 has an area substantially equal to an area of the opposed surface S2 of the second dummy color filter layer 802, such that the third column spacer 903 on the third dummy color filter layer 803 has a substantially same height as the height of the second column spacers 902 on the second dummy color filter layer 802 (i.e., h3=h2). Accordingly, a distance between the reference surface of the second substrate 302 and the third column spacer 903 is substantially equal to a distance between the reference surface of the second substrate 302 and the second column spacer 902.

In such an embodiment, as described above, the first column spacer 901 has a greater height than a height of the second column spacer 902, and the third column spacer 903 has a substantially same height as the height of the second column spacer 902 because the area of the first dummy color filter layer 801 below the first column spacer 901 is larger than the area of the second dummy color filter layer 802 below the second column spacer 902, and the area of the third dummy color filter layer 803 below the third column spacer 903 is substantially equal to the area of the second dummy color filter layer 802 described above.

The first column spacer 901 having a relatively great height h1 is defined as a main column spacer and each of the second column spacer 902 and the third column spacer 903 having relatively smaller heights h2 and h3 is defined as a sub-column spacer.

In an exemplary embodiment, as illustrated in FIG. 23, as the first dummy color filter layer 801 has a larger area than the area of the second dummy color filter layer 802 and a column spacer on a dummy color filter layer having a relatively large area has a relatively high flatness, a thickness d1 of the first column spacer 901 on the first dummy color filter layer 801 is less than a thickness d2 of the second column spacer 902 on the second dummy color filter layer

802. In such an embodiment, the first column spacer 901 and the second column spacer 902 may be exposed by a substantially same amount of light during a manufacturing process thereof, and in such an embodiment, the first column spacer 901 on the first dummy color filter layer 801 having a larger area may have a relatively smaller thickness. In an exemplary embodiment, the thickness d1 of the first column spacer 901 may be substantially the same as the thickness d2 of the second column spacer 902 on the second dummy color filter layer 802.

Figure 24:
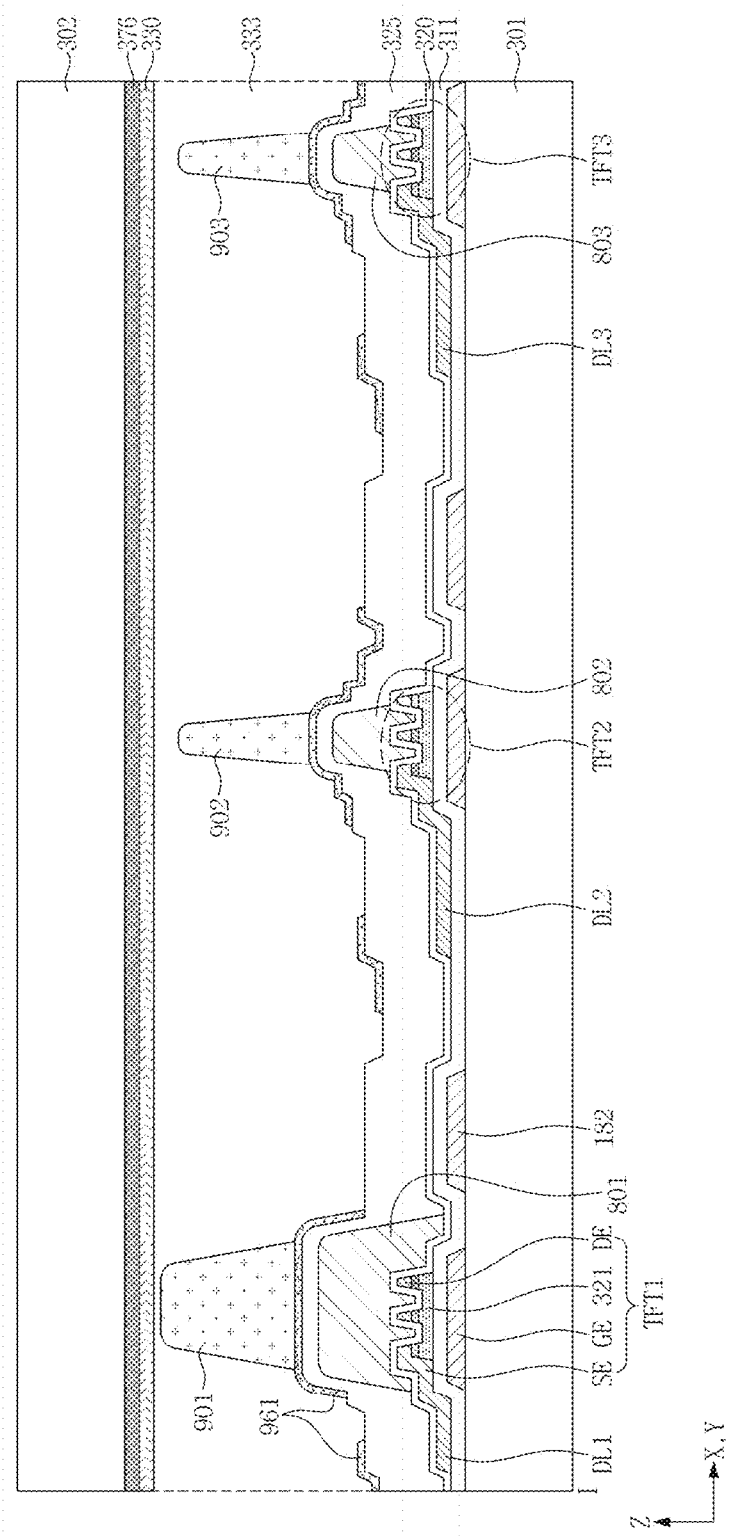
FIG. 24 is a cross-sectional view according to an alternative exemplary embodiment taken along line I-I' of FIG. 21.

FIG. 24 is a cross-sectional view according to an alternative exemplary embodiment taken along line I-I' of FIG. 21.

In an exemplary embodiment, as illustrated in FIG. 24, a first column spacer 901, a second column spacer 902 and a third column spacer 903 may be located on an insulating interlayer 325. In one exemplary embodiment, for example, the first column spacer 901 may be located on the insulating interlayer 325 to overlap a first dummy color filter layer 801, the second column spacer 902 may be located on the insulating interlayer 325 to overlap a second dummy color filter layer 802, and the third column spacer 903 may be located on the insulating interlayer 325 to overlap a third dummy color filter layer 803.

In such an embodiment, the first dummy color filter layer 801, the second dummy color filter layer 802 and the third dummy color filter layer 803 of FIG. 24 are substantially the same as those described above with reference to FIGS. 1, 2, 3, 4, 5 and 6, and any repetitive detailed description thereof will be omitted.

At least one of the first column spacer 901, the second column spacer 902 and the third column spacer 903 in FIG. 24 may include a transparent material. In one exemplary embodiment, for example, each of the first column spacer 901, the second column spacer 902 and the third column spacer 903 may be a column spacer including a transparent material.

In an exemplary embodiment, as illustrated in FIG. 24, a light blocking layer 376 may be located on a second substrate 302. In one exemplary embodiment, for example, the light blocking layer 376 may be located between the second substrate 302 and a common electrode 330. In such an embodiment, the light blocking layer 376 of FIG. 24 may have a substantially same shape as the aforementioned light blocking layer 376 of FIG. 19 when viewed from a plan view.

The light blocking layer 376 of FIG. 24 may include a material different from a material included in each of the column spacer 901. In one exemplary embodiment, for example, the light blocking layer 376 may include an opaque photosensitive organic material, and each of the column spacer 901 may include a transparent photosensitive organic material.

Figure 25:
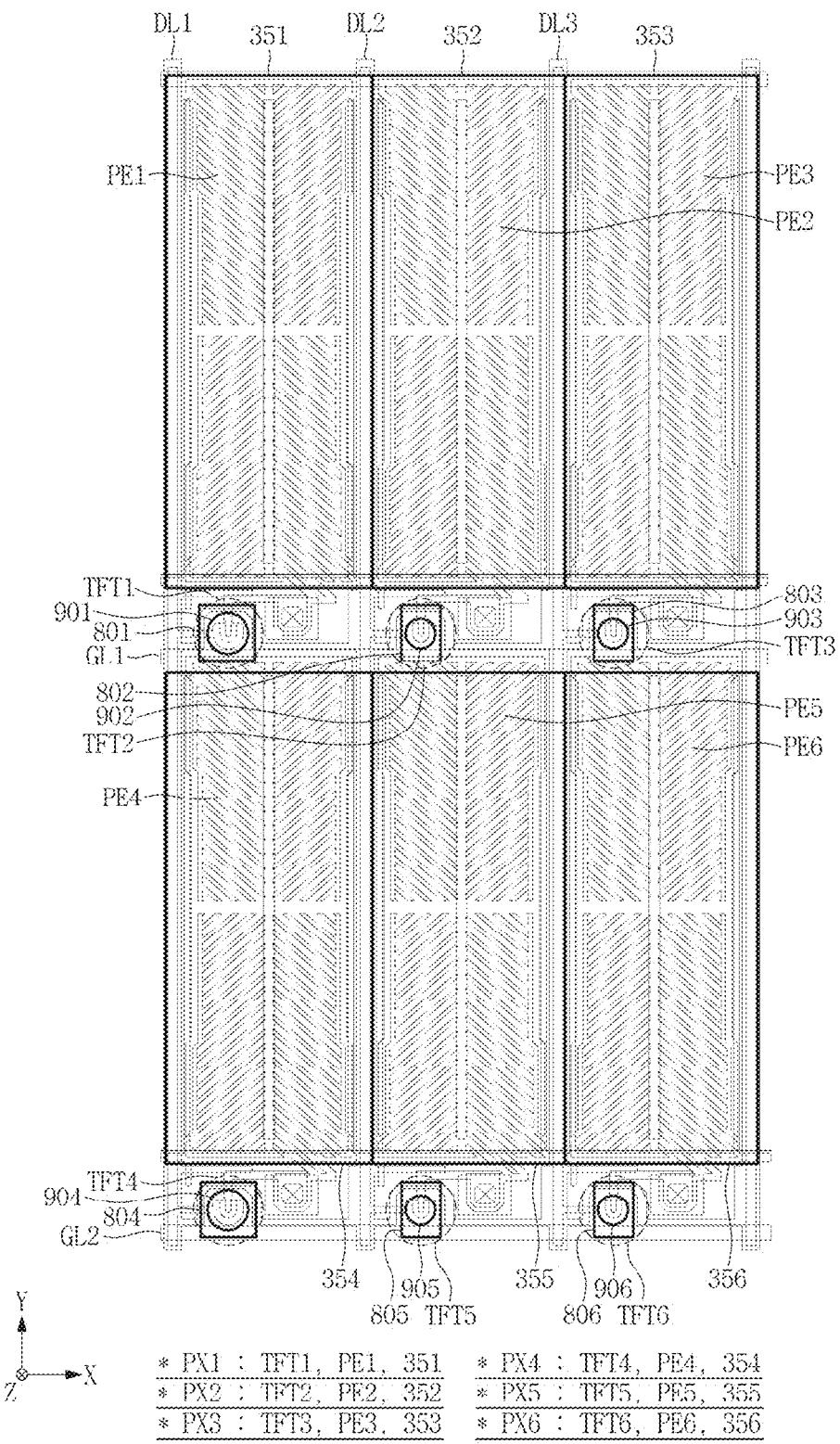
FIG. 25 is a plan view illustrating a display device including a plurality of pixels having the structure illustrated in FIG. 19 according to an alternative exemplary embodiment.
Figure 26:
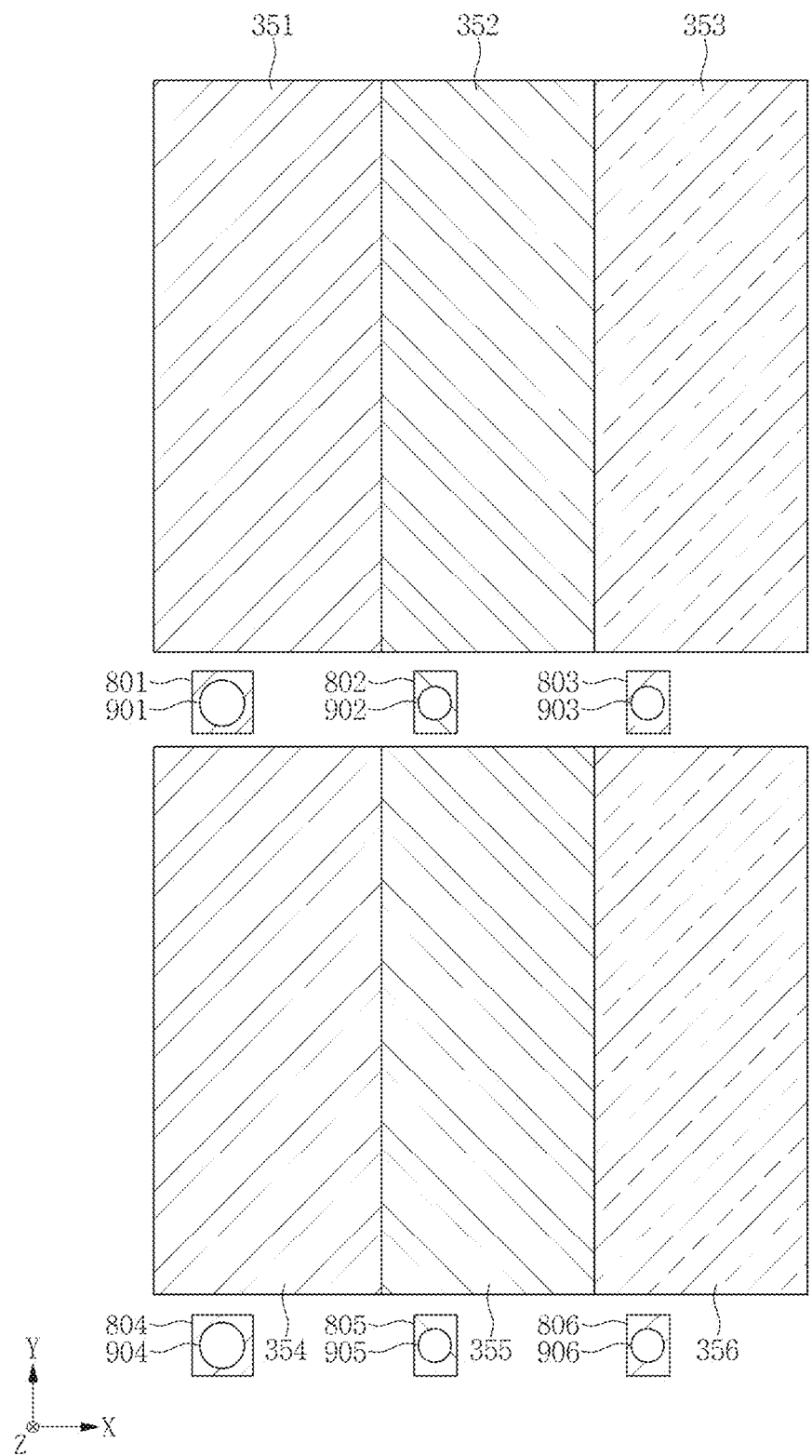
FIG. 26 is a view illustrating first, second, third, fourth, fifth and sixth color filter layers and first, second, third, fourth, fifth and sixth dummy color filter layers of FIG. 25.

FIG. 25 is a plan view illustrating a display device including a plurality of pixels having the structure illustrated in FIG. 19 according to an alternative exemplary embodiment, and FIG. 26 is a view illustrating first, second, third, fourth, fifth and sixth color filter layers and first, second, third, fourth, fifth and sixth dummy color filter layers of FIG. 25.

In an exemplary embodiment, as illustrated in FIGS. 25 and 26, the first dummy color filter layer 801 is located between the first color filter layer 351 and the fourth color filter layer 354 which are adjacent to each other in the Y-axis direction and have a substantially same color, the second dummy color filter layer 802 is located between the second color filter layer 352 and the fifth color filter layer 355 which are adjacent to each other in the Y-axis direction and have a substantially same color, and the third dummy color filter layer 803 is located between the third color filter layer 353 and the sixth color filter layer 356 which are adjacent to each other in the Y-axis direction and have a substantially same color. In such an embodiment, the fourth dummy color filter layer 804 is located between the fourth color filter layer 354 and a seventh color filter layer (not illustrated) which are adjacent to each other in the Y-axis direction and have a substantially same color, the fifth dummy color filter layer 805 is located between the fifth color filter layer 355 and an eighth color filter layer (not illustrated) which are adjacent to each other in the Y-axis direction and have a substantially same color, and the sixth dummy color filter layer 806 is located between the sixth color filter layer 356 and a ninth color filter layer (not illustrated) which are adjacent to each other in the Y-axis direction and have a substantially same color.

In such an embodiment, the first, second, third, fourth, fifth and sixth dummy color filter layers 801, 802, 803, 804, 805 and 806 are not connected to the color filter layer. In such an embodiment, the first, second, third, fourth, fifth and sixth dummy color filter layers 801, 802, 803, 804, 805 and 806 have a shape separated or spaced apart from the color filter layer.

In an alternative exemplary embodiment, at least one of the first, second, third, fourth, fifth and sixth dummy color filter layers 801, 802, 803, 804, 805 and 806 may be connected to one of color filter layers that is disposed adjacent thereto and has a substantially same color as the one of color filter layers. In such an embodiment, at least one of the first, second, third, fourth, fifth and sixth dummy color filter layers 801, 802, 803, 804, 805 and 806 may be formed integrally as a single unitary and indivisible unit with a color filter layer that is adjacent thereto and has a substantially same color as the color filter. In one exemplary embodiment, for example, the first dummy color filter layer 801 located between the first color filter layer 351 and the fourth color filter layer 354 may be connected to either the first color filter layer 351 or the fourth color filter layer 354.

In an exemplary embodiment, as shown in FIGS. 25 and 26, the area of the first dummy color filter layer 801 is larger than the area of the second dummy color filter layer 802, and the area of the third dummy color filter layer 803 is substantially equal to the area of the second dummy color filter layer 802.

Figure 27:
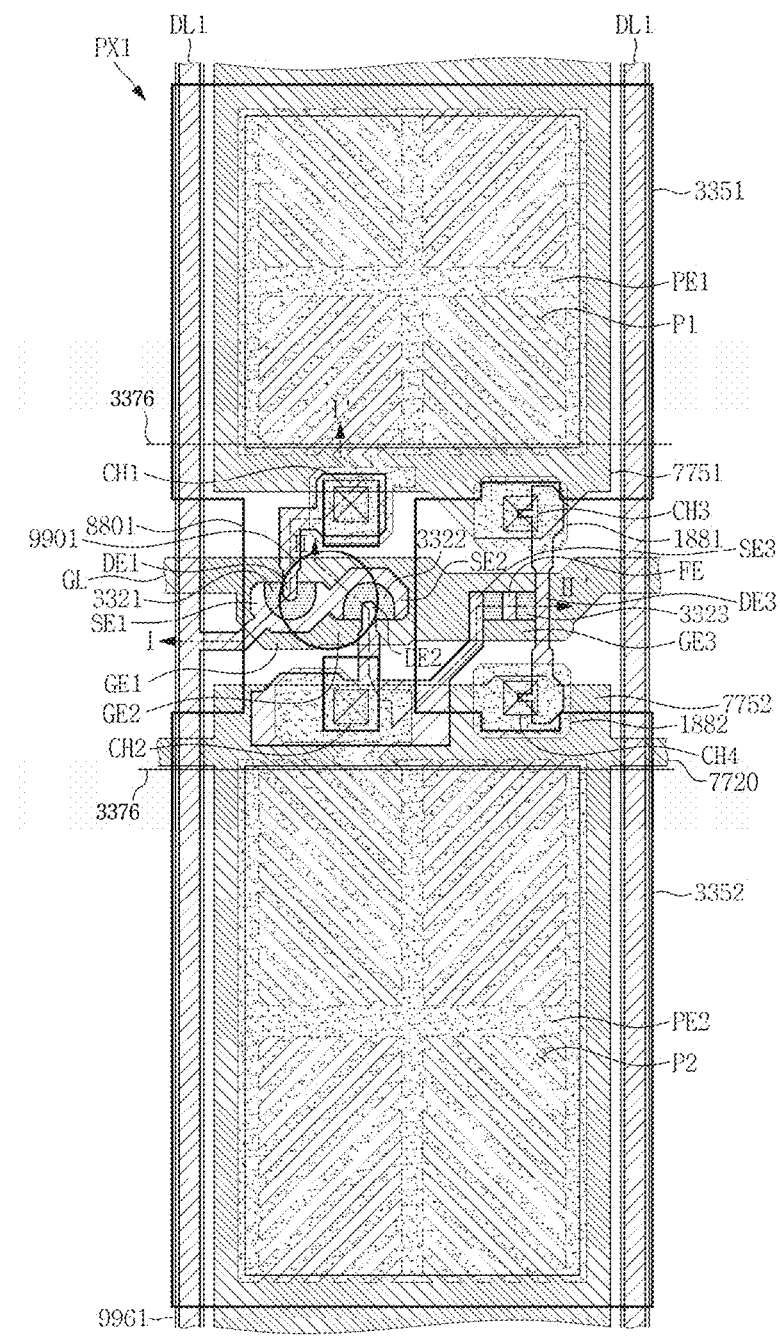
FIG. 27 is a view illustrating a pixel included in a display device according to another alternative exemplary embodiment.
Figure 28:
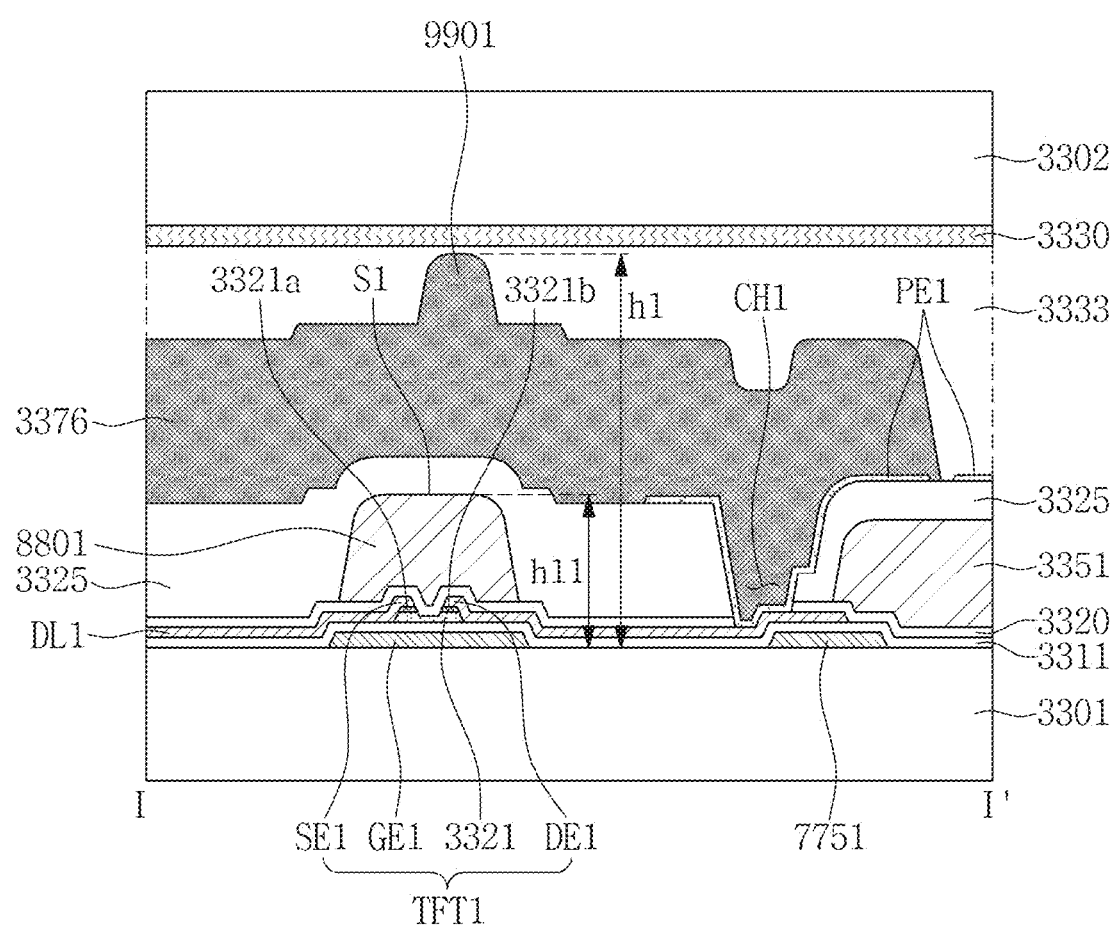
FIG. 28 is a cross-sectional view taken along line I-I' of FIG. 27.
Figure 29:
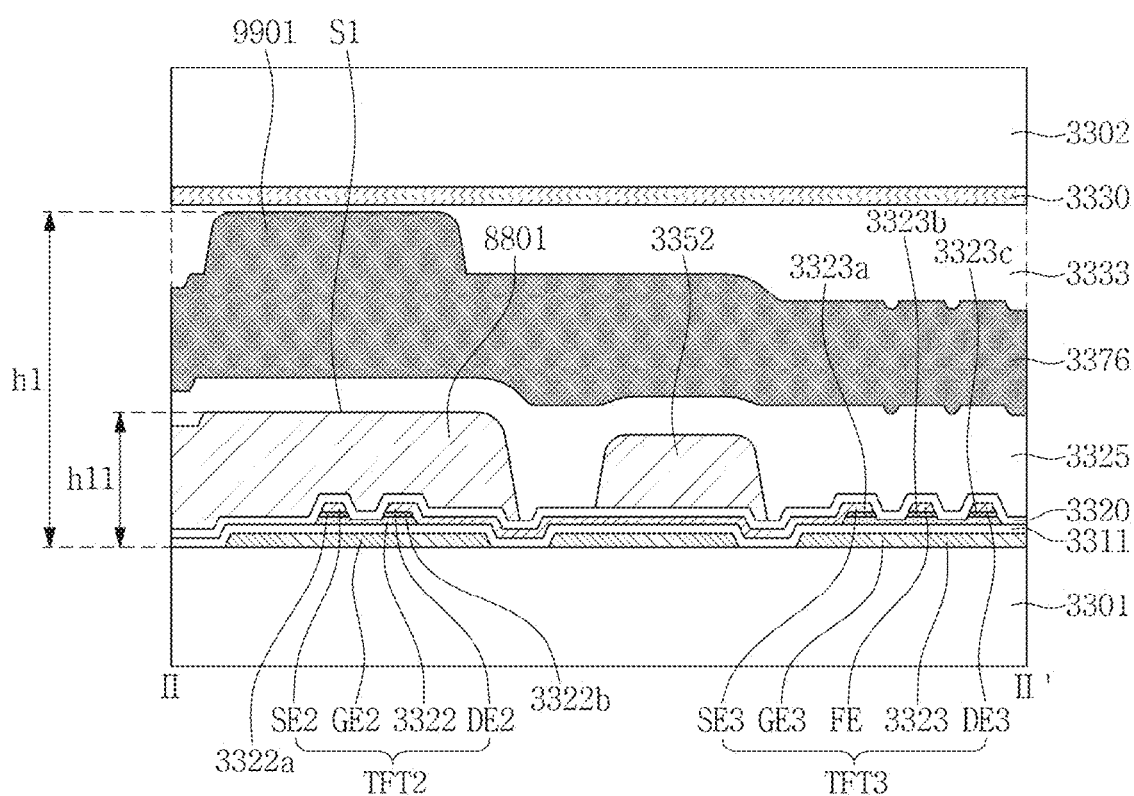
FIG. 29 is a cross-sectional view taken along line II-II' of FIG. 27.

FIG. 27 is a view illustrating a pixel included in a display device according to another alternative exemplary embodiment, FIG. 28 is a cross-sectional view taken along line I-I' of FIG. 27, and FIG. 29 is a cross-sectional view taken along line II-II' of FIG. 27.

In an exemplary embodiment, as illustrated in FIGS. 27, 28 and 29, a pixel PX1 includes a first switching element TFT1, a second switching element TFT2, a third switching element TFT3, a first sub-pixel electrode PE1, a second sub-pixel electrode PE2, a first color filter layer 3351 and a second color filter layer 3352.

The first switching element TFT1 includes a first gate electrode GE1, a first semiconductor layer 3321, a first source electrode SE1 and a first drain electrode DE1. The first gate electrode GE1 is connected to a gate line GL, the first source electrode SE1 is connected to a data line DL1, and the first drain electrode DE1 is connected to the first sub-pixel electrode PE1.

The second switching element TFT2 includes a second gate electrode GE2, a second semiconductor layer 3322, a second source electrode SE2 and a second drain electrode DE2. The second gate electrode GE2 is connected to the gate line GL, the second source electrode SE2 is connected to the first source electrode SE1, and the second drain electrode DE2 is connected to the second sub-pixel electrode PE2.

The third switching element TFT3 includes a third gate electrode GE3, a third semiconductor layer 3323, a third source electrode SE3, a floating electrode FE and a third drain electrode DE3. The third gate electrode GE3 is connected to the gate line GL, the third source electrode SE3 is connected to the second drain electrode DE2, and the third drain electrode DE3 is connected to a first sustain electrode 7751 and a second sustain electrode 7752.

The pixel PX1 is located between a first substrate 3301 and a second substrate 3302. In such an embodiment, as illustrated in FIGS. 28 and 29, the display device includes the first substrate 3301 and the second substrate 3302 spaced apart from each other by a predetermined distance, and the first switching element TFT1, the second switching element TFT2, the third switching element TFT3, the first sub-pixel electrode PE1, the second sub-pixel electrode PE2, the first color filter layer 3351 and the second color filter layer 3352 are located between the first substrate 3301 and the second substrate 3302.

In such an embodiment, the gate line GL, a sustain line 7720, the first sustain electrode 7751, the second sustain electrode 7752, a gate insulating layer 3311, the data line DL1, a protective layer 3320, a dummy color filter layer 8801, an insulating interlayer 3325, a light blocking layer 3376, a column spacer 9901, a liquid crystal layer 3333 and a common electrode 330 are located between the first substrate 3301 and the second substrate 3302.

In an exemplary embodiment, as illustrated in FIGS. 27 and 28, the gate line GL is located on the first substrate 3301. In one exemplary embodiment, for example, the gate line GL is located between a first sub-pixel area P1 and a second sub-pixel area P2 of the first substrate 3301.

In an exemplary embodiment, as illustrated in FIG. 27, the first gate electrode GE1 may have a shape protruding from the gate line GL. The first gate electrode GE1 may be a part of the gate line GL.

The first gate electrode GE1 may include a substantially same material as the gate line GL and may have a substantially same structure (a multilayer structure) as the gate line GL. The first gate electrode GE1 and the gate line GL may be simultaneously formed with each other in a substantially same process.

In an exemplary embodiment, as illustrated in FIG. 27, the second gate electrode GE2 may have a shape protruding from the gate line GL. The second gate electrode GE2 may be a part of the gate line GL.

The second gate electrode GE2 may include a substantially same material as the gate line GL and may have a substantially same structure (a multilayer structure) as the gate line GL. The second gate electrode GE2 and the gate line GL may be simultaneously formed with each other in a substantially same process.

In an exemplary embodiment, as illustrated in FIG. 27, the third gate electrode GE3 may have a shape protruding from the gate line GL. The third gate electrode GE3 may be a part of the gate line GL.

The third gate electrode GE3 may include a substantially same material as the gate line GL and may have a substantially same structure (a multilayer structure) as the gate line GL. The third gate electrode GE3 and the gate line GL may be simultaneously formed with each other in a substantially same process.

In an exemplary embodiment, as illustrated in FIG. 27, the first sustain electrode 7751 surrounds the first sub-pixel electrode PE1. In such an embodiment, the first sustain electrode 7751 overlaps an edge of the first sub-pixel electrode PE1.

The first sustain electrode 7751 may include a substantially same material as the aforementioned gate line GL and may have a substantially same structure (a multilayer structure) as the aforementioned gate line GL. The first sustain electrode 7751 and the gate line GL may be simultaneously formed with each other in a substantially same process.

The first sustain electrode 7751 receives a first sustain voltage from an external driving circuit. The first sustain voltage may be substantially equal to a common voltage.

In an exemplary embodiment, as illustrated in FIG. 27, the second sustain electrode 7752 surrounds the second sub-pixel electrode PE2. In such an embodiment, the second sustain electrode 7752 overlaps an edge of the second sub-pixel electrode PE2.

The second sustain electrode 7752 may include a substantially same material as the aforementioned gate line GL and may have a substantially same structure (a multilayer structure) as the aforementioned gate line GL. The second sustain electrode 7752 and the gate line GL may be simultaneously formed with each other in a substantially same process.

The second sustain electrode 7752 receives a second sustain voltage from an external driving circuit. The second sustain voltage may be substantially equal to the common voltage. In an exemplary embodiment, second sustain electrodes 7752 of pixels adjacent to one another along the gate line GL may be connected to one another. In such an embodiment, second sustain electrodes 7752 and first sustain electrodes 7751 of pixels adjacent to one another along the data line DL1 may be connected to one another.

In an exemplary embodiment, as illustrated in FIGS. 28 and 29, the gate insulating layer 3311 is located on the gate line GL, the first gate electrode GE1, the second gate electrode GE2, the first sustain electrode 7751 and the second sustain electrode 7752. The gate insulating layer 3311 may be located over an entire surface of the first substrate 3301 including the gate line GL, the first gate electrode GE1, the second gate electrode GE2, the first sustain electrode 7751, the second sustain electrode 7752 and the sustain line 7720.

An opening is defined through the gate insulating layer 3311 at locations corresponding to a third contact hole CH3 and a fourth contact hole CH4. A part of the third drain electrode DE3 and the first sustain electrode 7751 are exposed through the third contact hole CH3 and another part of the third drain electrode DE3 and the second sustain electrode 7752 are exposed through the fourth contact hole CH4 during a manufacturing process thereof.

In an exemplary embodiment, as illustrated in FIG. 28, the data line DL1 is located on the gate insulating layer 3311. The data line DL1 intersects the gate line GL. In such an embodiment, although not illustrated, the data line DL1 may have a line width less than a line width of another portion thereof at an intersection of the data line DL1 and the gate line GL. The data line DL1 may include a substantially same material as the aforementioned data line DL1.

In an exemplary embodiment, as illustrated in FIG. 28, the first semiconductor layer 3321 is located on the gate insulating layer 3311. As illustrated in FIGS. 27 and 28, the first semiconductor layer 3321 overlaps at least a part of the first gate electrode GE1. The first semiconductor layer 3321 may include an amorphous silicon, a polycrystalline silicon, or the like.

In an exemplary embodiment, as illustrated in FIG. 28, first and second ohmic contact layers 3321a and 3321b are located on the first semiconductor layer 3321. The first ohmic contact layer 3321a and the second ohmic contact layer 3321b face each other, having a channel area of the first switching element TFT1 therebetween.

In an exemplary embodiment, as illustrated in FIG. 29, the second semiconductor layer 3322 is located on the gate insulating layer 3311. As illustrated in FIGS. 27 and 29, the second semiconductor layer 3322 overlaps at least a part of the second gate electrode GE2. The second semiconductor layer 3322 may include an amorphous silicon, a polycrystalline silicon, or the like.

In an exemplary embodiment, as illustrated in FIG. 29, third and fourth ohmic contact layers 3322a and 3322b are located on the second semiconductor layer 3322. The third ohmic contact layer 3322a and the fourth ohmic contact layer 3322b face each other, having a channel area of the second switching element TFT2 therebetween.

The first ohmic contact layer 3321a and the aforementioned third ohmic contact layer 3322a are connected to each other. In one exemplary embodiment, for example, the first ohmic contact layer 3321a and the aforementioned third ohmic contact layer 3322a may be formed integrally as a single unitary and indivisible unit.

In an exemplary embodiment, as illustrated in FIG. 29, the third semiconductor layer 3323 is located on the gate insulating layer 3311. As illustrated in FIGS. 27 and 29, the third semiconductor layer 3323 overlaps at least a part of the third gate electrode GE3.

In an exemplary embodiment, as illustrated in FIG. 29, fifth, sixth and seventh ohmic contact layers 3323a, 3323b and 3323c are located on the third semiconductor layer 3323. The fifth ohmic contact layer 3323a and the sixth ohmic contact layer 3323b face each other with a first channel area of the third switching element TFT3 therebetween, and the sixth ohmic contact layer 3323b and the seventh ohmic contact layer 3323c face each other with a second channel area of the third switching element TFT3 therebetween.

In an exemplary embodiment, as illustrated in FIG. 28, the first source electrode SE1 is located on the first ohmic contact layer 3321a and the gate insulating layer 3311. In such an embodiment, as illustrated in FIG. 28, the first source electrode SE1 may have a shape protruding from the data line DL1. Although not illustrated, the first source electrode SE1 may be a part of the data line DL1. At least a part of the first source electrode SE1 overlaps the first semiconductor layer 3321 and the first gate electrode GE1.

The first source electrode SE1 may have one of an I-like shape, a C-like shape and a U-like shape. In an exemplary embodiment, where the first source electrode SE1 has a U-like shape as illustrated in FIG. 27, a convex portion of the first source electrode SE1 is directed toward the second sub-pixel electrode PE2.

The first source electrode SE1 may include a substantially same material as the aforementioned data line DL1 and may have a substantially same structure (a multilayer structure) as the aforementioned data line DL1. The first source electrode SE1 and the data line DL1 may be simultaneously formed with each other in a substantially same process.

In an exemplary embodiment, as illustrated in FIG. 28, the first drain electrode DE1 is located on the second ohmic contact layer 3321b and the gate insulating layer 3311. At least a part of the first drain electrode DE1 overlaps the first semiconductor layer 3321 and the first gate electrode GE1. The first drain electrode DE1 is connected to the first sub-pixel electrode PE1.

The first drain electrode DE1 may include a substantially same material as the data line DL1 and may have a substantially same structure (a multilayer structure) as the data line DL1. The first drain electrode DE1 and the data line DL1 may be simultaneously formed with each other in a substantially same process.

The channel area of the first switching element TFT1 is located at a portion of the first semiconductor layer 3321 between the first source electrode SE1 and the first drain electrode DE1. A portion of the first semiconductor layer 3321 corresponding to the channel area has a thickness less than a thickness of another portion of the first semiconductor layer 3321.

In an exemplary embodiment, as illustrated in FIG. 29, the second source electrode SE2 is located on the third ohmic contact layer 3322a. Although not illustrated, the third ohmic contact layer 3322a is also located on the gate insulating layer 3311. The second source electrode SE2 is formed integrally as a single unitary and indivisible unit with the first source electrode SE1. At least a part of the second source electrode SE2 overlaps the second semiconductor layer 3322 and the second gate electrode GE2.

The second source electrode SE2 may have one of an I-like shape, a C-like shape and a U-like shape. In an exemplary embodiment, where the second source electrode SE2 has a U-like shape as illustrated in FIG. 27, a convex portion of the second source electrode SE2 is directed toward the first sub-pixel electrode PE1.

The second source electrode SE2 may include a substantially same material as the aforementioned data line DL1 and may have a substantially same structure (a multilayer structure) as the aforementioned data line DL1. The second source electrode SE2 and the data line DL1 may be simultaneously formed with each other in a substantially same process.

In an exemplary embodiment, as illustrated in FIG. 29, the second drain electrode DE2 is located on the fourth ohmic contact layer 3322b and the gate insulating layer 3311. At least a part of the second drain electrode DE2 overlaps the second semiconductor layer 3322 and the second gate electrode GE2. The second drain electrode DE2 is connected to the second sub-pixel electrode PE2.

The second drain electrode DE2 may include a substantially same material as the data line DL1 and may have a substantially same structure (a multilayer structure) as the data line DL1. The second drain electrode DE2 and the data line DL1 may be simultaneously formed with each other in a substantially same process.

The channel area of the second switching element TFT2 is located at a portion of the second semiconductor layer 3322 between the second source electrode SE2 and the second drain electrode DE2. A portion of the second semiconductor layer 3322 corresponding to the channel area has a thickness less than a thickness of another portion of the second semiconductor layer 3322.

In an exemplary embodiment, as illustrated in FIG. 29, the third source electrode SE3 is located on the fifth ohmic contact layer 3323a and the gate insulating layer 3311. The third source electrode SE3 and the second drain electrode DE2 are formed integrally as a single unitary and indivisible unit. At least a part of the third source electrode SE3 overlaps the third semiconductor layer 3323 and the third gate electrode GE3.

The third source electrode SE3 may have one of an I-like shape, a C-like shape and a U-like shape. The third source electrode SE3 having a U-like shape is illustrated in FIG. 27.

The third source electrode SE3 may include a substantially same material as the data line DL1 and may have a substantially same structure (a multilayer structure) as the data line DL1. The third source electrode SE3 and the data line DL1 may be simultaneously formed with each other in a substantially same process.

In an exemplary embodiment, as illustrated in FIG. 29, the floating electrode FE is located on the sixth ohmic contact layer 3323b. The floating electrode FE does not contact any conductor other than the sixth ohmic contact layer 3323b. At least a part of the floating electrode FE overlaps the third semiconductor layer 3323 and the third gate electrode GE3.

The floating electrode FE may have one of an I-like shape, a C-like shape and a U-like shape. FIG. 27 shows one exemplary embodiment where the source electrode SE has an I-like shape.

The floating electrode FE may include a substantially same material as the aforementioned data line DL1 and may have a substantially same structure (a multilayer structure) as the aforementioned data line DL1. The floating electrode FE and the data line DL1 may be simultaneously formed with each other in a substantially same process.

In an exemplary embodiment, as illustrated in FIG. 29, the third drain electrode DE3 is located on the seventh ohmic contact layer 3323c. In such an embodiment, although not illustrated, the third drain electrode DE3 is also located on the gate insulating layer 3311. At least a part of the third drain electrode DE3 overlaps the second semiconductor layer 3322 and the third gate electrode GE3. The third drain electrode DE3 is connected to the first sustain electrode 7751 and the second sustain electrode 7752.

The third drain electrode DE3 may include a substantially same material as the aforementioned data line DL1 and may have a substantially same structure (a multilayer structure) as the aforementioned data line DL1. The third drain electrode DE3 and the data line DL1 may be simultaneously formed with each other in a substantially same process.

The first channel area of the third switching element TFT3 is located at a portion of the third semiconductor layer 3323 between the third source electrode SE3 and the floating electrode FE and the second channel area of the third switching element TFT3 is located at a portion of the third semiconductor layer 3323 between the floating electrode FE and the third drain electrode DE3. The portion of the third semiconductor layer 3323 corresponding to the first and second channel areas has a thickness less than a thickness of another portion of the third semiconductor layer 3323.

In an exemplary embodiment, although not illustrated, the first semiconductor layer 3321 may be further disposed between the gate insulating layer 3311 and the first source electrode SE1. In such an embodiment, the first semiconductor layer 3321 may be further disposed between the gate insulating layer 3311 and the first drain electrode DE1. Herein, a semiconductor layer located between the gate insulating layer 3311 and the first source electrode SE1 will be referred to as a first additional semiconductor layer, and a semiconductor layer located between the gate insulating layer 3311 and the first drain electrode DE1 will be referred to as a second additional semiconductor layer. In such an embodiment, the aforementioned first ohmic contact layer 3321a may be further disposed between the first additional semiconductor layer and the first source electrode SE1, and the aforementioned second ohmic contact layer 3321b may be further disposed between the second additional semiconductor layer and the first drain electrode DE1.

In such an embodiment, although not illustrated, the second semiconductor layer 3322 may be further disposed between the gate insulating layer 3311 and the second source electrode SE2. In such an embodiment, the second semiconductor layer 3322 may be further disposed between the gate insulating layer 3311 and the second drain electrode DE2. Herein, a semiconductor layer between the gate insulating layer 3311 and the second source electrode SE2 will be referred to as a third additional semiconductor layer, and a semiconductor layer between the gate insulating layer 3311 and the second drain electrode DE2 will be referred to as a fourth additional semiconductor layer. In such an embodiment, the aforementioned third ohmic contact layer 3322a may be further disposed between the third additional semiconductor layer and the second source electrode SE2, and the aforementioned fourth ohmic contact layer 3322b may be further disposed between the fourth additional semiconductor layer and the second drain electrode DE2.

In such an embodiment, although not illustrated, the third semiconductor layer 3323 may be further disposed between the gate insulating layer 3311 and the third source electrode SE3. In such an embodiment, the third semiconductor layer 3323 may be further disposed between the gate insulating layer 3311 and the third drain electrode DE3. Herein, the semiconductor layer between the gate insulating layer 3311 and the third source electrode SE3 may be defined as a fifth additional semiconductor layer, and the semiconductor layer between the gate insulating layer 3311 and the third drain electrode DE3 will be referred to as a sixth additional semiconductor layer. In such an embodiment, the aforementioned fifth ohmic contact layer 3323a may be further disposed between the fifth additional semiconductor layer and the third source electrode SE3, and the aforementioned seventh ohmic contact layer 3323c may be further disposed between the sixth additional semiconductor layer and the third drain electrode DE3.

In such an embodiment, although not illustrated, the first semiconductor layer 3321 may be further disposed between the gate insulating layer 3311 and the data line DL1. In one exemplary embodiment, for example, the first semiconductor layer 3321 may be further disposed between the gate insulating layer 3311 and the data line DL1. Herein, the semiconductor layer between the gate insulating layer 3311 and the data line DL1 will be referred to as a seventh additional semiconductor layer. In such an embodiment, the aforementioned first ohmic contact layer 3321a may be further disposed between the seventh additional semiconductor layer and the data line DL1.

In an exemplary embodiment, as illustrated in FIG. 28, the protective layer 3320 is located on the data line DL1, the first source electrode SE1, the second source electrode SE2, the third source electrode SE3, the floating electrode FE, the first drain electrode DE1, the second drain electrode DE2 and the third drain electrode DE3. The protective layer 3320 may be located over an entire surface of the first substrate 3301 including the data line DL1, the first source electrode SE1, the second source electrode SE2, the third source electrode SE3, the floating electrode FE, the first drain electrode DE1, the second drain electrode DE2 and the third drain electrode DE3.

Openings are defined through the protective layer 3320 at locations corresponding to the first contact hole CH1, the second contact hole CH2, the third contact hole CH3 and the fourth contact hole CH4. The first drain electrode DE1 is exposed through the first contact hole CH1 and the second drain electrode DE2 is exposed through the second contact hole CH2 during a manufacturing process thereof.

In an exemplary embodiment, as illustrated in FIGS. 27 and 28, the first color filter layer 3351 is located on the protective layer 3320 to overlap the first sub-pixel electrode PE1, the first sustain electrode 7751 and the data line DL1. The first color filter layer 3351 may have a predetermined color. In such an embodiment, the first color filter layer 3351 may include a pigment corresponding to the predetermined color.

In an exemplary embodiment, as illustrated in FIGS. 27 and 29, the second color filter layer 3352 is located on the protective layer 3320 to overlap the second sub-pixel electrode PE2, the second sustain electrode 7752 and the data line DL1. The second color filter layer 3352 may have a predetermined color. To this end, the second color filter layer 3352 may include a pigment corresponding to the predetermined color. The second color filter layer 3352 has a substantially same color as the first color filter layer 3351.

In an exemplary embodiment, as illustrated in FIG. 27, the dummy color filter layer 8801 may be located between the first color filter layer 3351 and the second color filter layer 3352. The dummy color filter layer 8801 will be described below in greater detail.

The first color filter layer 3351, the second color filter layer 3352 and the dummy color filter layer 8801 are not located at the first contact hole CH1, the second contact hole CH2, the third contact hole CH3 and the fourth contact hole CH4.

The insulating interlayer 3325 is located on the first color filter layer 3351, the second color filter layer 3352, the dummy color filter layer 8801 and the protective layer 3320. The insulating interlayer 3325 may be located over an entire surface of the first substrate 3301 including the first color filter layer 3351, the second color filter layer 3352, the dummy color filter layer 8801 and the protective layer 3320. Openings are defined through the insulating interlayer 3325 at locations corresponding to the first contact hole CH1, the second contact hole CH2, the third contact hole CH3 and the fourth contact hole CH4.

The first sub-pixel electrode PE1 is located on the insulating interlayer 3325 to overlap the first color filter layer 3351. The first sub-pixel electrode PE1 is connected to the first drain electrode DE1 through the first contact hole CH1.

The first sub-pixel electrode PE1 may include a transparent conductive material such as ITO or IZO. In such an embodiment, ITO may be a polycrystalline or monocrystalline material, and IZO may be a polycrystalline or monocrystalline material as well. Alternatively, IZO may be an amorphous material.

The second sub-pixel electrode PE2 is located on the insulating interlayer 3325 to overlap the second color filter layer 3352. The second sub-pixel electrode PE2 is connected to the second drain electrode DE2 through the second contact hole CH2. The second sub-pixel electrode PE2 may include a substantially same material as the aforementioned first pixel electrode PE1.

A first connection electrode 1881 is located on the insulating interlayer 3325 corresponding to the third contact hole CH3. The first connection electrode 1881 connects a part of the third drain electrode DE3 and the first sustain electrode 7751. The first connection electrode 1881 may include a substantially same material as the aforementioned first sub-pixel electrode PE1.

A second connection electrode 1882 is located on the insulating interlayer 3325 corresponding to the fourth contact hole CH4. The second connection electrode 1882 connects another part of the third drain electrode DE3 and the second sustain electrode 7752. The second connection electrode 1882 may include a substantially same material as the second sub-pixel electrode PE2.

In an exemplary embodiment, as illustrated in FIG. 27, the light blocking layer 3376 intersects the data line DL1. In such an embodiment, as illustrated in FIG. 27, the light blocking layer 3376 includes the first switching element TFT1, the second switching element TFT2, the third switching element TFT3, the gate line GL, the first connection electrode 1881, the second connection electrode 1882, the first contact hole CH1, the second contact hole CH2, the third contact hole CH3 and the fourth contact hole CH4. In such an embodiment, the light blocking layer 3376 may further overlap a part of the first sub-pixel electrode PE1, a part of the second sub-pixel electrode PE2 and a part of a shielding electrode 9961.

The light blocking layer 3376 may include a photosensitive organic material. In such an embodiment, the photosensitive organic material may be a photosensitive organic material of a positive type or a negative type.

In an exemplary embodiment, as illustrated in FIGS. 27 and 28, the column spacer 9901 is located on the light blocking layer 3376 to overlap the dummy color filter layer 8801. In an exemplary embodiment, as illustrated in FIG. 27, the column spacer 9901 and the light blocking layer 3376 may be formed integrally as a single unitary and indivisible unit. In such an embodiment, where the column spacer 9901 and the light blocking layer 3376 are integrally formed as a single unitary and indivisible unit as described above, a portion of the integrated structure overlapping the dummy color filter layer 8801 corresponds to the column spacer 9901 described above.

The column spacer 9901 may include a substantially same material as the light blocking layer 3376 and may have a substantially same structure as the light blocking layer 3376. The column spacer 9901 and the light blocking layer 3376 may be simultaneously formed with each other in a substantially same process.

A height of the column spacer 9901 depends on or is determined based on a height of the dummy color filter layer located below the column spacer 9901, and the height of the dummy color filter layer depends on or is determined based an area of the dummy color filter layer. Accordingly, the height of the column spacer 9901 depends on or is determined based the area of the dummy color filter layer. As the area of the dummy color filter layer 8801 increases, the height of the dummy color filter layer 8801 increases, and accordingly, the height of the column spacer 9901 located on the dummy color filter layer 8801 also increases.

In an exemplary embodiment, as illustrated in FIG. 28, a height h1 of the column spacer 9901 is a distance from a flat reference surface of the first substrate (i.e., an inner surface of the first substrate 3301) to an uppermost layer surface of the column spacer 9901, and means a distance measured in the Z-axis direction. The reference surface of the first substrate 3301 perpendicularly intersects the X-axis direction. The uppermost layer surface of the column spacer 9901 refers to one of surfaces of the column spacer 9901 that is farthest in the Z-axis direction from the aforementioned reference surface. In an exemplary embodiment, the height h1 of the column spacer 9901 may be defined as a distance between a flat reference surface of the second substrate 3302 (i.e., an inner surface of the second substrate 3302) and the column spacer 9901. Herein, the distance between the reference surface of the second substrate 3302 and the column spacer 9901 means a distance in the Z-axis direction.

The height of the dummy color filter layer 8801 may also be defined as a distance from the reference surface of the first substrate 3301 to an uppermost layer surface of the dummy color filter layer 8801, and in such an embodiment, the distance means a distance measured in the Z-axis direction.

The area of the dummy color filter layer 8801 means a size of a surface (hereinafter, "an opposing surface") of surfaces of the dummy color filter layer 8801 most adjacent to the reference surface of the second substrate 3302. In one exemplary embodiment, for example, as illustrated in FIG. 28, the opposing surface faces the reference surface of the second substrate 3302, and is parallel to the reference surface.

Figure 30:
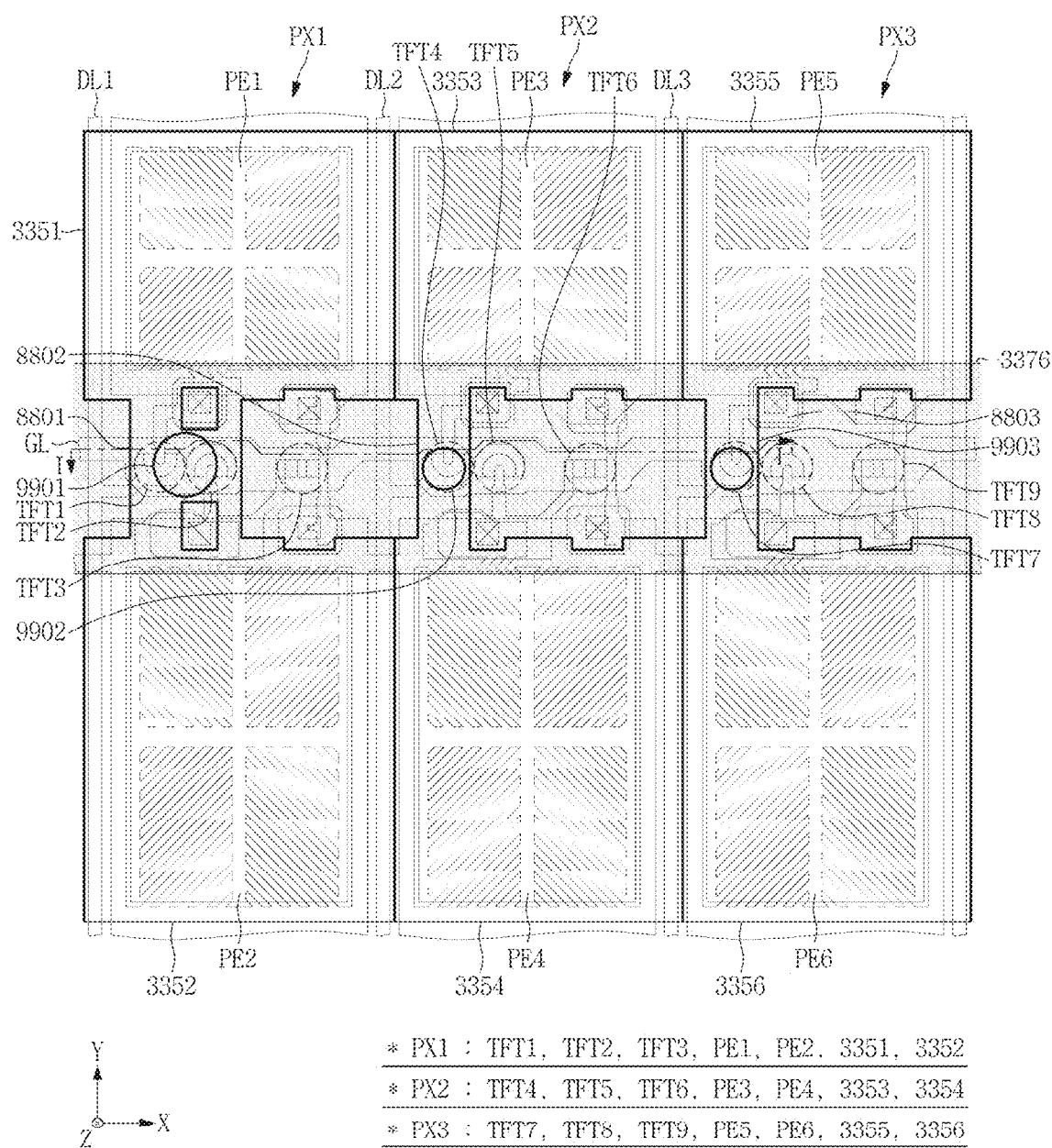
FIG. 30 is a plan view illustrating a display device including a plurality of pixels having a structure illustrated in FIG. 27.
Figure 31:
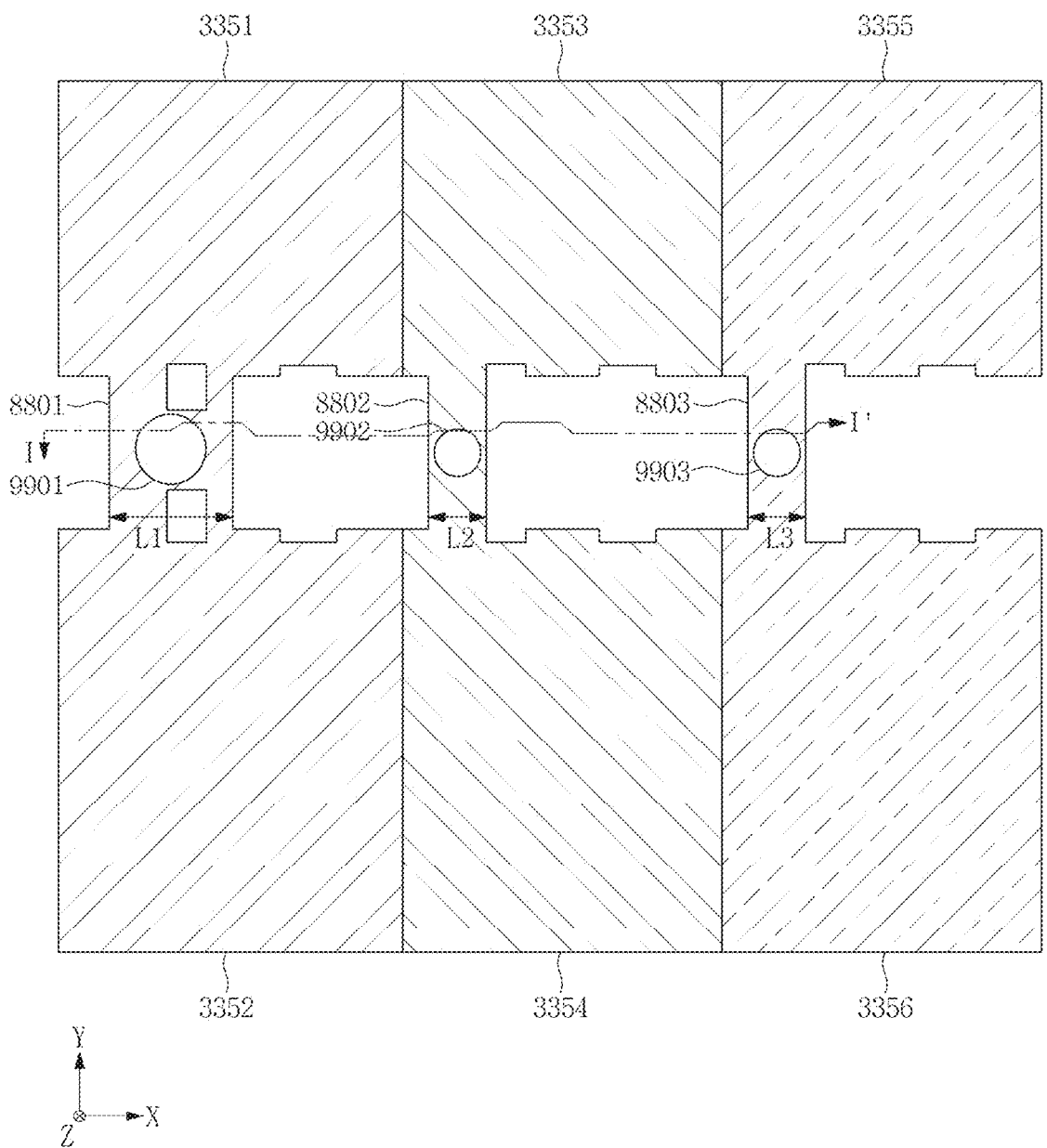
FIG. 31 is a view illustrating first, second, third, fourth, fifth and sixth color filter layers and first, second and third dummy color filter layers of FIG. 30.
Figure 32:
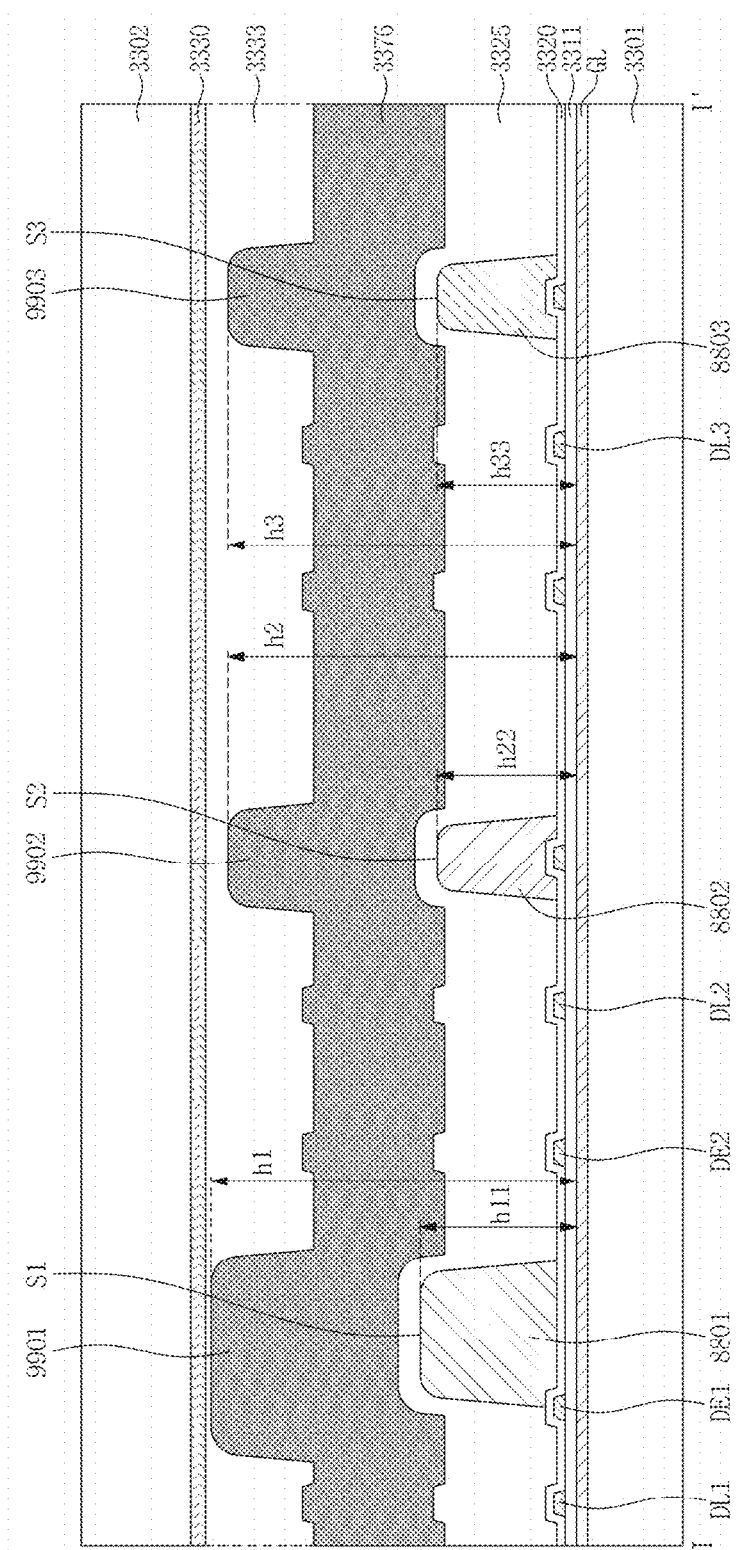
FIG. 32 is a cross-sectional view according to an exemplary embodiment taken along line I-I' of FIG. 30.

FIG. 30 is a plan view illustrating a display device including a plurality of pixels having a structure illustrated in FIG. 27, FIG. 31 is a view illustrating first, second, third, fourth, fifth and sixth color filter layers and first, second and third dummy color filter layers of FIG. 30, and FIG. 32 is a cross-sectional view according to an exemplary embodiment taken along line I-I' of FIG. 30.

In an exemplary embodiment, as illustrated in FIG. 30, the display device includes a plurality of pixels PX1, PX2 and PX3. In one exemplary embodiment, for example, a display device includes three pixels PX1, PX2 and PX3 as shown in FIG. 30. Each of the pixels PX1, PX2 and PX3 in FIG. 30 has a substantially same structure as the pixel PX1 described above with reference to FIG. 27.

The three pixels PX1, PX2 and PX3 are connected to one gate line GL and three data lines DL1, DL2 and DL3. In one exemplary embodiment, for example, the first pixel PX1, the second pixel PX2 and the third pixel PX3 adjacent to each other in the X-axis direction are commonly connected to the gate line GL. In such an embodiment, the first pixel PX1 is connected to a first data line DL1, the second pixel PX2 is connected to a second data line DL2, and the third pixel PX3 is connected to a third data line DL3.

In such an embodiment, the first pixel PX1 is connected to the gate line GL and the first data line DL1, the second pixel PX2 is connected to the gate line GL and the second data line DL2, and the third pixel PX3 is connected to the gate line GL and the third data line DL3.

The first pixel PX1 includes a first switching element TFT1, a second switching element TFT2, a third switching element TFT3, a first sub-pixel electrode PE1, a second sub-pixel electrode PE2, a first color filter layer 3351 and a second color filter layer 3352. The second pixel PX2 includes a fourth switching element TFT4, a fifth switching element TFT5, a sixth switching element TFT6, a third sub-pixel electrode PE3, a fourth sub-pixel electrode PE4, a third color filter layer 3353 and a fourth color filter layer 3354. The third pixel PX3 includes a seventh switching element TFT7, an eighth switching element TFT8, a ninth switching element TFT9, a fifth sub-pixel electrode PE5, a sixth sub-pixel electrode PE6, a fifth color filter layer 3355 and a sixth color filter layer 3356.

Color filter layers adjacent to one another in the Y-axis direction have a substantially same color. In one exemplary embodiment, for example, as illustrated in FIG. 31, the first color filter layer 3351 may have a substantially same color as the second color filter layer 3352, the third color filter layer 3353 may have a substantially same color as the fourth color filter layer 3354, and the fifth color filter layer 3355 may have a substantially same color as the sixth color filter layer 3356.

Color filter layers adjacent to one another in the X-axis direction have different colors from one another. In one exemplary embodiment, for example, as illustrated in FIG. 31, the first color filter layer 3351, the third color filter layer 3353 and the fifth color filter layer 3355 have different colors from one another, and the second color filter layer 3352, the fourth color filter layer 3354 and the sixth color filter layer 3356 have different colors from one another.

In one exemplary embodiment, for example, each of the first color filter layer 3351 and the second color filter layer 3352 may have a red color, each of the third color filter layer 3353 and the fourth color filter layer 3354 may have a green color, each of the fifth color filter layer 3355 and the sixth color filter layer 3356 may have a blue color.

In an exemplary embodiment, as illustrated in FIG. 30, the first dummy color filter layer 8801 overlaps the first switching element TFT1 and the second switching element TFT2, the second dummy color filter layer 8802 overlaps the fourth switching element TFT4, and the third dummy color filter layer 8803 overlaps the seventh switching element TFT7.

In an exemplary embodiment, as illustrated in FIG. 31, the first dummy color filter layer 8801 is located between the first color filter layer 3351 and the second color filter layer 3352 which are adjacent to each other in the Y-axis direction and have a substantially same color, the second dummy color filter layer 8802 is located between the third color filter layer 3353 and the fourth color filter layer 3354 which are adjacent to each other in the Y-axis direction and have a substantially same color, and the third dummy color filter layer 8803 is located between the fifth color filter layer 3355 and the sixth color filter layer 3356 which are adjacent to each other in the Y-axis direction and have a substantially same color.

In an exemplary embodiment, as described above, the first dummy color filter layer 8801 has a larger area than an area of the second dummy color filter layer 8802. In such an embodiment, as shown in FIG. 31, a length L1 of one side of the first dummy color filter layer 8801 may be greater than a length L2 of one side of the second dummy color filter layer 8802 corresponding thereto. In an exemplary embodiment, the length L2 of one side of the second dummy color filter layer 8802 may be substantially equal to a length L3 of one side of the third dummy color filter layer 8803.

As the first dummy color filter layer 8801 has a larger area than the area of the second dummy color filter layer 8802, the first dummy color filter layer 8801 has a greater height than a height of the second dummy color filter layer 8802. In such an embodiment, a height h11 of the first dummy color filter layer 8801 is greater than a height h22 of the second dummy color filter layer 8802.

As the first dummy color filter layer 8801 has a greater height than the height of the second dummy color filter layer 8802, the first column spacer 9901 on the first dummy color filter layer 8801 has a greater height than the height of the second column spacer 9902 on the second dummy color filter layer 8802. In such an embodiment, a height h1 of the first column spacer 9901 is greater than a height h2 of the second column spacer 9902. Accordingly, a distance between the reference surface of the second substrate 3302 (i.e., the inner surface of the second substrate 3302) and the first column spacer 9901 is less than a distance between the reference surface of the second substrate 3302 and the second column spacer 9902.

In an exemplary embodiment, the third dummy color filter layer 8803 has an area substantially equal to the area of the second dummy color filter layer 8802, and thus the third column spacer 9903 on the third dummy color filter layer 8803 has a substantially same height as the height of the second column spacer 9902 on the second dummy color filter layer 8802 (i.e., h3=h2). Accordingly, a distance between the reference surface of the second substrate 3302 and the third column spacer 9903 is substantially equal to the distance between the reference surface of the second substrate 3302 and the second column spacer 9902.

In such an embodiment, the first column spacer 9901 has a greater height than the height of the second column spacer 9902, and the third column spacer 9903 has a substantially same height as the height of the second column spacer 9902 because the area of the first dummy color filter layer 8801 below the first column spacer 9901 is larger than the area of the second dummy color filter layer 8802 located below the second column spacer 9902, and an area of the third dummy color filter layer 8803 below the third column spacer 9903 is substantially equal to the area of the second dummy color filter layer 8802 described above.

The first column spacer 9901 having a relatively great height h1 is defined as a main column spacer and each of the second column spacer 9902 and the third column spacer 9903 having relatively smaller heights h2 and h3 is defined as a sub-column spacer.

In an exemplary embodiment, as illustrated in FIG. 32, as the first dummy color filter layer 8801 has a larger area than the area of the second dummy color filter layer 8802, a thickness d1 of the first column spacer 9901 on the first dummy color filter layer 8801 is less than a thickness d2 of the second column spacer 9902 on the second dummy color filter layer 8802. This is because a column spacer on a dummy color filter layer having a relatively large area has a relatively high flatness. In such an embodiment, the first column spacer 9901 and the second column spacer 9902 may be exposed by a substantially same amount of light during a manufacturing process thereof, and in such an embodiment, the first column spacer 9901 on the first dummy color filter layer 8801 having a larger area may have a relatively smaller thickness. In an exemplary embodiment, the thickness d1 of the first column spacer 9901 may be substantially the same as the thickness d2 of the second column spacer 9902 on the second dummy color filter layer 8802.

A thickness d3 of the third column spacer 9903 is substantially the same as the thickness d2 of the second column spacer 9902. The first, second and third column spacers 9901, 9902 and 9903 may all be exposed by a substantially same amount of light during a manufacturing process thereof.

Figure 33:
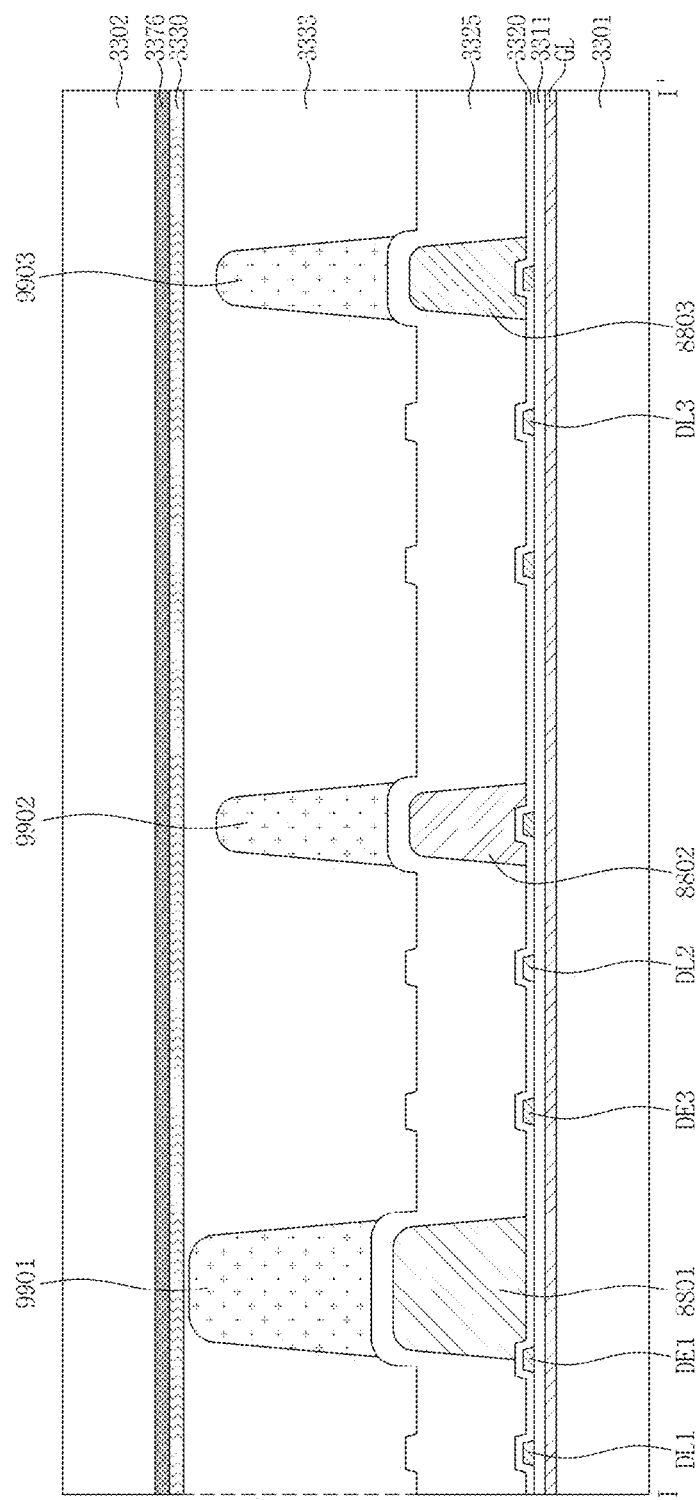
FIG. 33 is a cross-sectional view according to an alternative exemplary embodiment taken along line I-I' of FIG. 30.

FIG. 33 is a cross-sectional view according to an alternative exemplary embodiment taken along line I-I' of FIG. 30.

In an exemplary embodiment, as illustrated in FIG. 33, a first column spacer 9901, a second column spacer 9902 and a third column spacer 9903 may be located on an insulating interlayer 3325. In one exemplary embodiment, for example, the first column spacer 9901 may be located on the insulating interlayer 3325 to overlap a first dummy color filter layer 8801, the second column spacer 9902 may be located on the insulating interlayer 3325 to overlap a second dummy color filter layer 8802, and the third column spacer 9903 may be located on the insulating interlayer 3325 to overlap a third dummy color filter layer 8803.

In such an embodiment, the first dummy color filter layer 8801, the second dummy color filter layer 8802 and the third dummy color filter layer 8803 of FIG. 33 are substantially the same as those described above with reference to FIGS. 1, 2, 3, 4, 5 and 6, and any repetitive detailed description thereof will be omitted.

At least one of the first column spacer 9901, the second column spacer 9902 and the third column spacer 9903 in FIG. 33 may include a transparent material. In one exemplary embodiment, for example, each of the first column spacer 9901, the second column spacer 9902 and the third column spacer 9903 may be a column spacer including a transparent material.

In an exemplary embodiment, as illustrated in FIG. 33, a light blocking layer 3376 may be located on a second substrate 3302. In one exemplary embodiment, for example, the light blocking layer 3376 may be located between the second substrate 3302 and a common electrode 3330. In such an embodiment, the light blocking layer 3376 of FIG. 33 may have a substantially same shape as the light blocking layer 3376 of FIG. 27 when viewed from a plan view.

The light blocking layer 3376 of FIG. 33 may include a different material from a material included in each of the column spacer 9901. In one exemplary embodiment, for example, the light blocking layer 3376 may include an opaque photosensitive organic material, and each of the column spacer 9901 may include a transparent photosensitive organic material.

Figure 34:
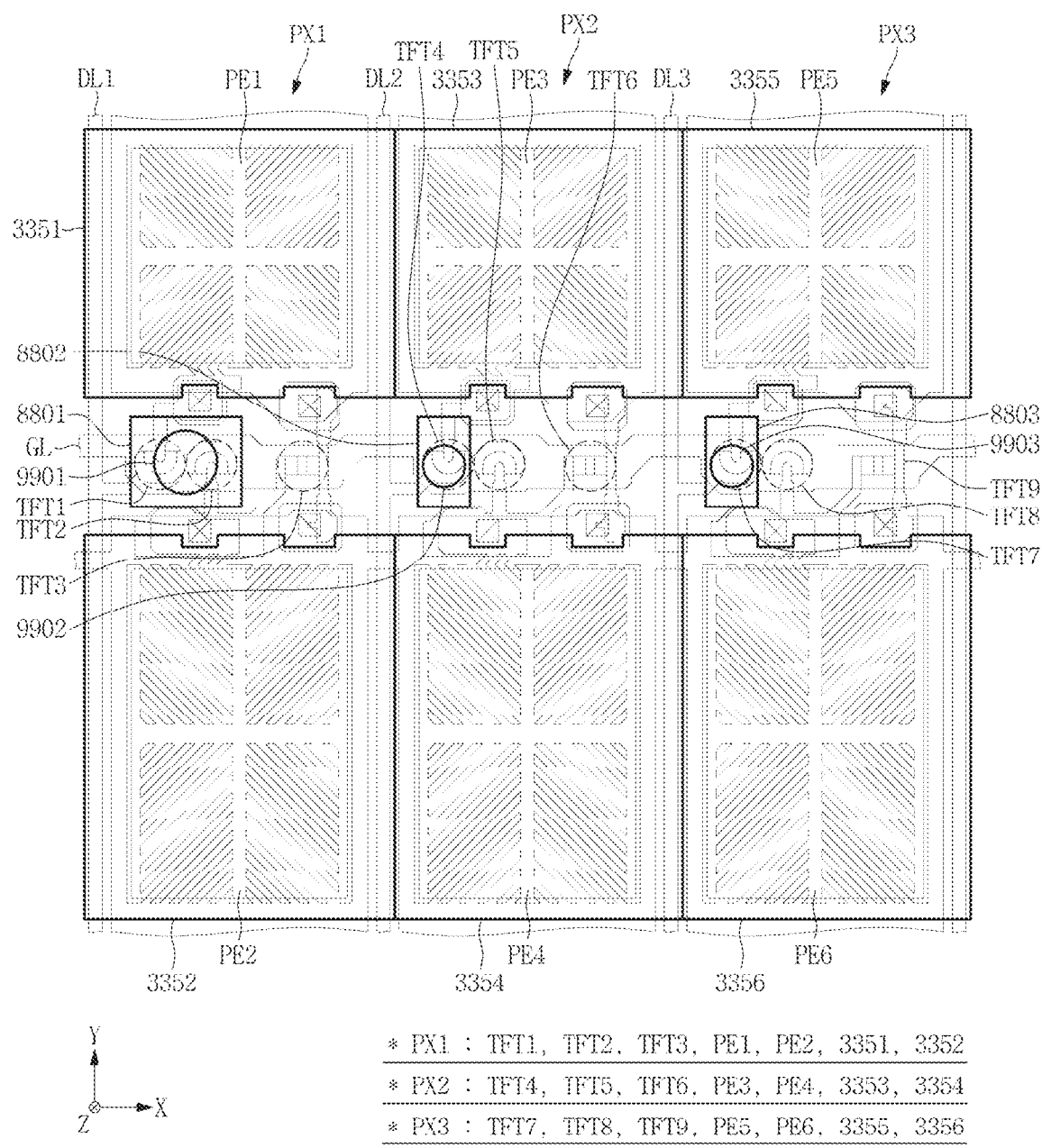
FIG. 34 is a plan view illustrating a display device including a plurality of pixels having the structure illustrated in FIG. 27 according to an alternative exemplary embodiment.
Figure 35:
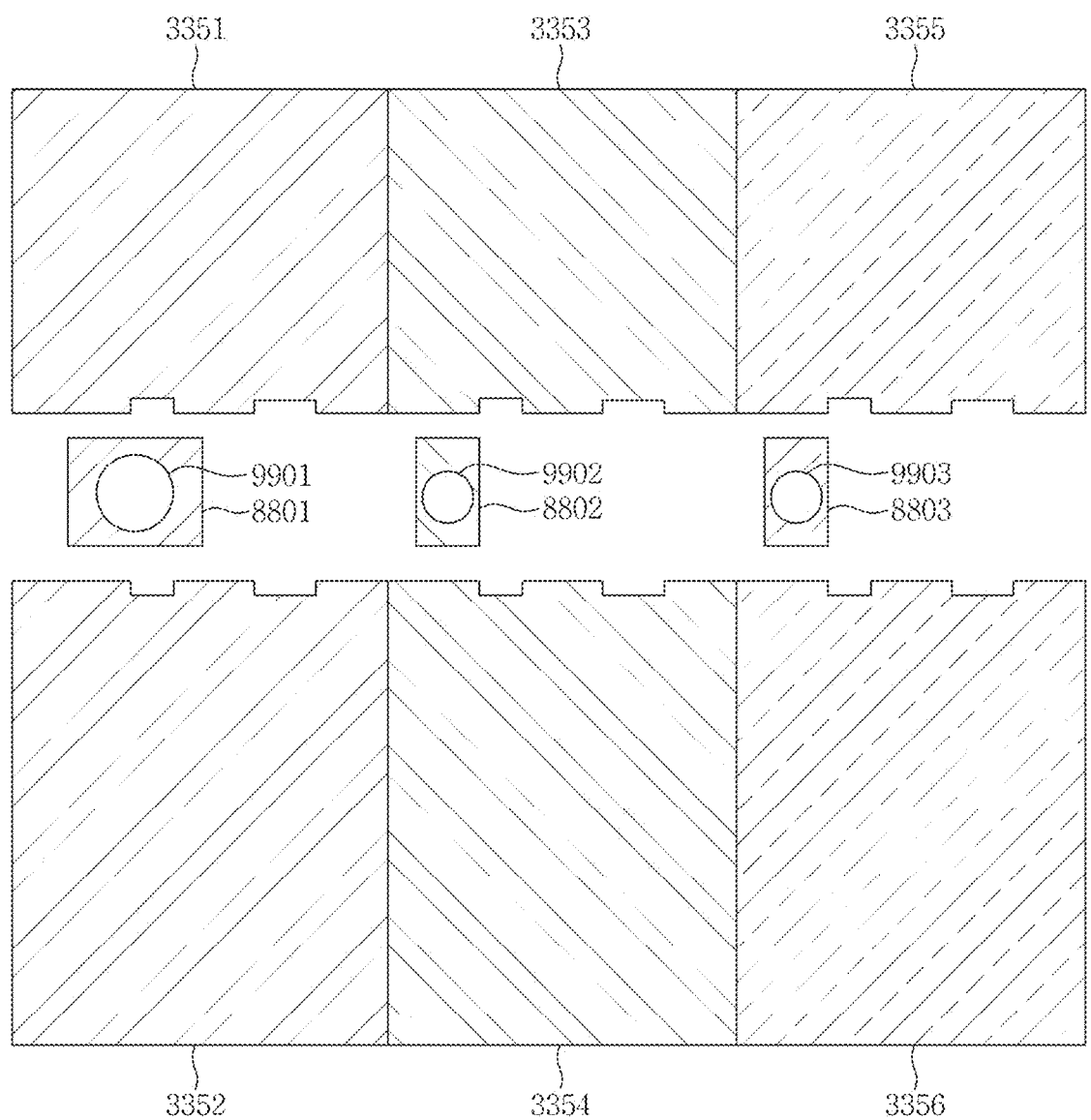
FIG. 35 is a view illustrating first, second, third, fourth, fifth and sixth color filter layers and first, second and third dummy color filter layers of FIG. 34.

FIG. 34 is a plan view illustrating a display device including a plurality of pixels having the structure illustrated in FIG. 27 according to an alternative exemplary embodiment, and FIG. 35 is a view illustrating first, second, third, fourth, fifth and sixth color filter layers and first, second and third dummy color filter layers of FIG. 34.

In an exemplary embodiment, as illustrated in FIGS. 34 and 35, a first dummy color filter layer 8801 is located between a first color filter layer 3351 and a second color filter layer 3352 which are adjacent to each other in the Y-axis direction and have a substantially same color, a second dummy color filter layer 8802 is located between a third color filter layer 3353 and a fourth color filter layer 3354 which are adjacent to each other in the Y-axis direction and have a substantially same color, the third dummy color filter layer 8803 is located between a fifth color filter layer 3355 and a sixth color filter layer 3356 which are adjacent to each other in the Y-axis direction and have a substantially same color.

In such an embodiment, the first, second and third dummy color filter layers 8801, 8802 and 8803 are not connected to the color filter layer. In such an embodiment, the first, second and third dummy color filter layers 8801, 8802 and 8803 have a shape separated from the color filter layer.

In an alternative exemplary embodiment, at least one of the first, second and third dummy color filter layers 8801, 8802 and 8803 may be connected to one of color filter layers that is disposed adjacent thereto and has a substantially same color as the one of color filter layers. In such an embodiment, at least one of the first, second and third dummy color filter layers 8801, 8802 and 8803 may be formed integrally as a single unitary and indivisible unit with a color filter layer that is adjacent thereto and has a substantially same color as the color filter. In one exemplary embodiment, for example, the first dummy color filter layer 8801 located between the first color filter layer 3351 and the second color filter layer 3352 may be connected to either the first color filter layer 3351 or the second color filter layer 3352.

In an exemplary embodiment, as shown in FIGS. 34 and 35, an area of the first dummy color filter layer 8801 is larger than an area of the second dummy color filter layer 8802, and an area of the third dummy color filter layer 8803 is substantially equal to the area of the second dummy color filter layer 8802.

According to one or more exemplary embodiments, the height of the column spacer is controlled based on the size of the dummy color filter layer. In such an embodiment, the height of the dummy color filter layer is controlled in accordance with a change of the area of the dummy color filter layer, and thus the height of the column spacer located above the dummy color filter layer also changes according to the size of the dummy color filter layer. Accordingly, column spacers having different heights may be effectively manufactured without applying conventional half tone exposure. In such an embodiment, the main column spacer and the sub-column spacer may be manufactured by controlling the area of the dummy color filter layer.

Accordingly, in an exemplary embodiment of the invention, problems that may occur in a conventional half tone exposure may be solved or effectively prevented. In the conventional half tone exposure, for example, when the column spacer and the light blocking layer are formed together in a substantially same process as each other, a problem that the thickness of the light blocking layer increases in the overlapping exposure area may occur. In the conventional half tone exposure, only materials having characteristics suitable for such an exposure method may be selectively or limitedly used as the material for the column spacer and the light blocking layer.

However, according to one or more exemplary embodiments of the invention, a light blocking layer having a substantially uniform thickness may be manufactured, and the range of material choice for the column spacer and the light blocking layer may be broadened.

In exemplary embodiments of the invention, as the height difference of the column spacers is caused by the height difference of the dummy color filter layers, a relatively smaller amount of materials may be used for manufacturing the column spacer. Accordingly, in such an embodiment, the manufacturing costs may be reduced.

From the foregoing, it will be appreciated that various embodiments in accordance with the present disclosure have been described herein for purposes of illustration, and that various modifications may be made without departing from the scope and spirit of the present teachings. Accordingly, the various embodiments disclosed herein are not intended to be limiting of the true scope and spirit of the present teachings. Various features of the above described and other embodiments may be mixed and matched in any manner, to produce further embodiments consistent with the invention.

What is claimed is:

1. A display device comprising:
   a first substrate and a second substrate spaced apart from each other;
   a first color filter layer and a second color filter layer, which are located adjacent to each other between the first substrate and the second substrate and have a substantially same color as each other;
   a third color filter layer and a fourth color filter layer, which are located adjacent to each other between the first substrate and the second substrate and have a substantially same color as each other;
   a first dummy color filter layer located between an edge of the first substrate and the first color filter layer or between the first color filter layer and the second color filter layer, wherein the first dummy color filter layer has a substantially same color as the first color filter layer;
   a second dummy color filter layer located between an edge of the first substrate and the third color filter layer or between the third color filter layer and the fourth color filter layer, wherein the second dummy color filter layer has a substantially same color as the third color filter layer;
   a first column spacer between the first dummy color filter layer and the second substrate; and
   a second column spacer between the second dummy color filter layer and the second substrate,
   wherein a height of the first dummy color filter from a reference surface of the first substrate is greater than a height of the second dummy color filter layer from the reference surface, and
   a surface of the first dummy color filter layer facing the second substrate is larger than a surface of the second dummy color filter layer facing the second substrate.

2. The display device as claimed in claim 1, wherein a thickness of the first column spacer is less than or substantially equal to a thickness of the second column spacer.

3. The display device as claimed in claim 1, wherein a height of the first column spacer from the reference surface is greater than a height of the second column spacer from the reference surface.

4. The display device as claimed in claim 1, wherein the first dummy color filter layer is connected to at least one of the first color filter layer and the second color filter layer.

5. The display device as claimed in claim 4, wherein the first color filter layer, the second color filter layer and the first dummy color filter layer are integrally formed as a single unitary and indivisible unit.

6. The display device as claimed in claim 1, wherein the second dummy color filter layer is connected to at least one of the third color filter layer and the fourth color filter layer.

7. The display device as claimed in claim 6, wherein the third color filter layer, the fourth color filter layer and the second dummy color filter layer are unitary.

8. The display device as claimed in claim 1, wherein at least one of the first column spacer and the second column spacer comprises a transparent material or an opaque material.

9. The display device as claimed in claim 1, further comprising:
   a light blocking layer on the first substrate or the second substrate.

10. The display device as claimed in claim 9, wherein
    the light blocking layer, the first column spacer and the second column spacer are located on a substantially same layer on the first substrate; and
    the light blocking layer, the first column spacer and the second column spacer are unitary.

11. The display device as claimed in claim 9, wherein
    the first column spacer and the second column spacer are located on the first substrate, and
    the light blocking layer is on the second substrate to overlap the first column spacer and the second column spacer.

12. The display device as claimed in claim 1, further comprising:
    a first pixel electrode disposed to overlap the first color filter layer;
    a second pixel electrode disposed to overlap the second color filter layer;
    a third pixel electrode disposed to overlap the third color filter layer;
    a fourth pixel electrode disposed to overlap the fourth color filter layer;
    a first switching element connected to the first pixel electrode;

a second switching element connected to the second pixel electrode;

a third switching element connected to the third pixel electrode; and a fourth switching element connected to the fourth pixel electrode.

13. The display device as claimed in claim 12, wherein the first column spacer overlaps one of the first switching element and the second switching element.

14. The display device as claimed in claim 12, wherein the second column spacer overlaps one of the third switching element and the fourth switching element.

15. The display device as claimed in claim 12, further comprising:

a first gate line connected to the first and second switching elements;

a second gate line connected to the third and fourth switching elements;

a first data line connected to the first and third switching elements; and a second data line connected to the second and fourth switching elements.

16. The display device as claimed in claim 12, further comprising:

a first gate line connected to the first and third switching elements;

a second gate line connected to the second and fourth switching elements;

a first data line connected to the first and second switching elements; and a second data line connected to the third and fourth switching elements.

17. The display device as claimed in claim 1, further comprising:

a first sub-pixel electrode disposed to overlap the first color filter layer;

a second sub-pixel electrode disposed to overlap the second color filter layer;

a third sub-pixel electrode disposed to overlap the third color filter layer;

a fourth sub-pixel electrode disposed to overlap the fourth color filter layer;

a first switching element connected to the first sub-pixel electrode;

a second switching element connected to the first switching element and the second sub-pixel electrode;

a third switching element connected to the third sub-pixel electrode;

a fourth switching element connected to the third switching element and the fourth sub-pixel electrode;

a gate line connected to the first, second, third and fourth switching elements;

a first data line connected to the first switching element; and a second data line connected to the third switching element.

* * * * *